United States Patent [19]
Satoh et al.

[11] Patent Number: 5,546,319
[45] Date of Patent: Aug. 13, 1996

[54] METHOD OF AND SYSTEM FOR CHARGED PARTICLE BEAM EXPOSURE

[75] Inventors: Takamasa Satoh; Hiroshi Yasuda; Junichi Kai; Yoshihisa Oae; Hisayasu Nishino; Kiichi Sakamoto; Hidefumi Yabara; Isamu Seto; Masami Takigawa; Akio Yamada; Soichiro Arai; Tomohiko Abe; Takashi Kiuchi; Kenichi Miyazawa, all of Kawasaki, Japan

[73] Assignee: Fujitsu Limited, Kawasaki, Japan

[21] Appl. No.: 379,712

[22] Filed: Jan. 27, 1995

[30] Foreign Application Priority Data

| | | | |
|---|---|---|---|
| Jan. 28, 1994 | [JP] | Japan | 6-008849 |
| Mar. 15, 1994 | [JP] | Japan | 6-044473 |
| Mar. 18, 1994 | [JP] | Japan | 6-048301 |
| Apr. 11, 1994 | [JP] | Japan | 6-072286 |
| Apr. 28, 1994 | [JP] | Japan | 6-092065 |
| May 18, 1994 | [JP] | Japan | 6-103998 |
| Jul. 26, 1994 | [JP] | Japan | 6-174642 |
| Oct. 19, 1994 | [JP] | Japan | 6-253952 |
| Nov. 14, 1994 | [JP] | Japan | 6-279474 |

[51] Int. Cl.⁶ ...................................... H01J 37/00
[52] U.S. Cl. ........................ 364/488; 250/396 R
[58] Field of Search ............................ 364/488, 489, 364/490, 491, 578; 250/492.2, 492.22, 396 R, 398, 396 ML; 219/121 EB, 121 EU; 315/384, 370

[56] References Cited

U.S. PATENT DOCUMENTS

| | | | |
|---|---|---|---|
| 3,644,700 | 2/1972 | Kruppa et al. | 219/121 EB |
| 3,894,271 | 7/1975 | Pfeiffer et al. | 315/384 |
| 4,423,305 | 12/1983 | Pfeiffer | 219/121 EU |
| 4,647,782 | 3/1987 | Wada et al. | 250/492.2 |
| 4,698,509 | 10/1987 | Wells et al. | 250/492.2 |
| 5,136,167 | 8/1992 | Langner et al. | 250/396 R |
| 5,304,811 | 4/1994 | Yamada et al. | 250/492.22 |
| 5,382,800 | 1/1995 | Nishino et al. | 250/396 ML |
| 5,389,858 | 2/1995 | Langner et al. | 315/370 |
| 5,391,886 | 2/1995 | Yamada et al. | 250/492.22 |
| 5,430,304 | 7/1995 | Yasuda et al. | 250/492.22 |
| 5,444,257 | 8/1995 | Satoh et al. | 250/398 |

Primary Examiner—Kevin J. Teska
Assistant Examiner—Russell W. Frejd
Attorney, Agent, or Firm—Armstrong, Westerman, Hattori, McLeland & Naughton

[57] ABSTRACT

To improve in the throughput of an exposure system, the setting time during a step change in the output of an amplifier is reduced by switching resistance between the amplifier and a deflector, a glitch waveform generated during a step change in the output or a D/A converter at the preceding stage of the amplifier, is anticipated and is canceled out with a correction waveform, after the output of the D/A converter has settled, this output is sample held and the step change is interpolated at a smoothing circuit, the deflection area is increased by positioning a electrostatic deflector offset around the optical axis relative to another electrostatic deflector, the response speed of the main deflection is improved by adding auxiliary deflection coils of one or two turn, and the alignment time is reduced by combining the coordinate conversion in the wafer area and in the chip area. In order to correct the astigmatism of the electromagnetic lens, two stages or coils are provided and an electric current corresponding to the quantity of deflection is supplied to the coils.

34 Claims, 71 Drawing Sheets

SETTING TIME

SMALL STEP RESPONSE

LARGE STEP RESPONSE (PRESENT
INVENTION)

MAIN-SCAN DIRECTION B

BND

DIRECTION OF STAGE MOVEMENT C

F  B MAIN-SCAN DIRECTION (A)

(B)

(C) CONVERSION START CLOCK φ1

(D) CLOCK φ3

(A)

(D)

(B)

(E)

(C)

of exposed on
METHOD OF AND SYSTEM FOR CHARGED PARTICLE BEAM EXPOSURE

BACKGROUND OF THE INVENTION

The present invention relates to a method of and a system for charged particle beam exposure on semiconductor wafers, masks and so on having a coating of resist.

As the elements in semiconductor integrated circuits become ever finer, the use of charged particle beam exposure systems will become common, and in such systems, electrons may be used as charged particles. With these systems, it is possible to produce very fine elements, down to 0.05 μm or smaller with alignment accuracy of 0.02 μm or better.

FIG. 1 shows the structure of parts of a charged particle beam exposure system in the prior art.

The object to be exposed here is a semiconductor wafer 10 that is mounted on a mobile stage 11. The wafer 10 is coated with a film or resist and a charged particle beam, in this instance, an electron beam EB, is radiated onto the film to perform exposure.

Above the wafer 10, a blanking aperture array 13 is provided over an aperture 12. As shown in FIG. 2, the blanking aperture array 13 is provided with a plurality of openings 15A to 15C formed in grid pattern in a thin substrate and is also provided with common electrodes 16A to 16C and blanking electrodes 17A to 17C which project downward and which are formed at the edges of the openings 15A to 15C respectively. The openings 15A to 15C may be, for example, squares whose sides are 25 μm, and the number these openings may be 16×64. An electron beam EB, which is made to run approximately parallel by an electromagnetic lens 19 and which has a nearly consistent current density, is radiated on to the blanking aperture array 13. The point of irradiation on the wafer 10 of a portion of the electron beam that has passed through one opening 15 may be, for example, an approximate square with sides of 0.08 μm.

By setting the voltage between the common electrodes 16A to 16C and the blanking electrodes 17A to 17C to 0 or Vs, the electron beam that passes through the openings 15A to 15C is either radiated onto the wafer 10 after passing through the aperture 12, shown in FIG. 1, or it is blocked by the aperture 12. As a result, by setting the common electrodes 16A to 16C at 0 V and also by supplying a voltage pattern that corresponds to the pattern to be exposed to all the blanking electrodes 17A to 17C from a blanking control circuit 14, a very fine pattern can be exposed onto the semiconductor wafer 10.

However, since exposure is performed by the charged particle beam scanning over the semiconductor wafer or a mask, the exposure takes longer than in photo exposure. Because of this, it is necessary to improve the throughput of the charged particle beam exposure system. Generally speaking, improving the throughput also entails a loss of exposure positional accuracy, which results in a reduction in processing accuracy. Thus, an improvement in exposure positional accuracy is required together with an improvement in throughput.

Scanning the electron beam EB on the wafer 10 is performed by the mobile stage 11, and a main deflector 20 and a sub deflector 30 that are positioned over the mobile stage 11. Normally, the main deflector 20 is an electromagnetic type and the sub deflector 30 is an electrostatic type.

The ranges of movement from the greatest to the least whereby scanning can be performed are provided by: the mobile stage 11, the main deflector 20 and the sub deflector 30, in that order. However, the order of scanning speed is the reverse, with the sub deflector 30 first, the main deflector 20 next, and the mobile stage 11 last. By taking advantage of these scanning characteristics, scanning with the electron beam EB on the wafer 10 is performed, for example, as shown in FIG. 3.

That is, the electron beam EB is scanned by the sub deflector 30 within a subfield F in direction A. Every time the scanning within one subfield F is completed, step scanning is performed by the main deflector 20 by the width of the subfield F in the direction B of the stripe ST (in the direction which runs at a right angle to the direction A). Also, with the mobile stage 11, scanning in direction C which is perpendicular to direction B is continuously performed. The length of the stripe ST may be 2 mm, with one side of the subfield F being 100 μm, for instance.

(1) Reduction of throughput in an exposure system imposed by the setting time.

In FIG. 1, the main deflection data DM are converted to analog by a D/A converter 21 and then this data DM is amplified at an amplifying circuit 22 to be supplied to the main deflector 20 as a drive current I. Likewise, the sub deflection data DS is converted to analog by a D/A converter 31 and then this data DS is amplified at an amplifying circuit 32 to be supplied to the sub deflector 30 as a drive voltage V.

When scanning with the electron beam EB in direction A in FIG. 3 with the sub deflector 30, the drive voltage V changes in a small step for every pulse of the electron beam EB and when swinging back from the trailing end to the leading end of a scan in direction A, the drive voltage V changes in a large step, in correspondence with the dotted lines. FIG. 4A shows the waveform of the drive voltage V when it changes in a small step and FIG. 4B shows the waveform of the drive voltage V when it changes in a large step.

Due to the frequency characteristics of the amplifying circuit 32 and the capacity of the sub deflector 30, the setting time of the drive voltage V cannot be set to 0 when the input of the amplifying circuit 32 changes in steps. During this setting time, exposure cannot be performed because the deflecting error is significant. Therefore, it is wait time and it is a cause of reduced throughput of the charged particle beam exposure system.

Since the number of changes is larger when the changes are in small steps than when they are in in large steps, in the prior art, the characteristics of the amplifying circuit 32 are adjusted in such a manner that the setting time Δt1 for the small step change is at a minimum. Because of this, if the setting time Δt1 is set at 100 ns, for example, the setting time Δt2 for the large step change is a relatively large value, i.e., 500 ns. This prevents any improvement in throughput in the charged particle beam exposure system. The aforementioned adjustment is performed by changing the electrostatic capacity of the capacitor that is included in the amplifying circuit 32, through which high frequency components pass.

On the other hand, there is a significant transient waveform included in the outputs of both of the D/A converters 21 and 31 in FIG. 1, and the their setting time also presents a cause for reduction in throughput of the exposure system.

In the D/A converters, as shown in FIG. 5A, for instance, the output ends of constant current sources 210 to 213, the input ends of which are commonly connected to a source wire VCC, are connected to the input end of a operational amplifier 218 via analog switches 214 to 217 respectively, and the resistor 219 is connected between the input end and the output end of the operational amplifier 218. The constant currents I, 2I, 4I and 8I are output from the constant current sources 210 to 213 respectively.

When simultaneously turning ON the analog switches 214 to 217, from the state in which the analog switches 214 to 217 are all OFF, because of differences in operating speed among the analog switches 214 to 217 and the like, the analog switches 214 to 217 are not turned ON perfectly simultaneously. As a result, a transient waveform (glitch waveform) as shown in FIG. 5B is included in the output of the operational amplifier 218. Because of its origin, the magnitude of this glitch waveform depends upon the values at the input of the D/A converters before and after the change.

(2) Reduction in throughput of an exposure system due to a reduction in the deflection area of an electrostatic deflector FIG. 6A is a perspective view of an electrostatic deflector in the prior art and FIG. 6B is a cross section through the line A__A in FIG. 6A.

Four pairs of electrostatic deflecting electrodes a1 to a4 and b1 to b4 that face opposite each other are formed by plating a conductive material onto the inner surface of a cylindrical member 301 which is formed in one piece by injection. A wire 302 for applying a voltage from the outside is connected to the end of each electrode. Reference number 303 indicates a portion where the plating is cut and the other corresponding portions are identical.

With the four pairs of electrodes, a consistent electrical field is formed over a wider region compared with an arrangement with only two pairs of electrodes that are positioned at a right angle to each other to cause deflection in direction X and in direction Y. In each pair of electrodes, one is set at 0 V, or, potentials whose absolute values are equal to each other but whose signs are opposite are applied from a complementary output type amplifier.

FIG. 7 shows the path that is obtained when an electron beam EB is deflected in the direction indicated with the arrow A1 with a one-stage electrostatic deflector 30A within an electromagnetic lens (not shown). Since the magnetic field of the electromagnetic tens causes the electron beam EB to converge, the electron beam EB running along the z-axis is deflected as indicated with the arrow. This path turns spirally as indicated with the dotted line when viewed in the x-y plane which contains the x-axis and the y-axis, and which lies at a right angle to the z-axis, restricting the deflection area.

With a reduced sub deflection area, the number of times the main deflector is operated increases and, on the other hand, since the setting time for a deflection imparted by the main deflector is longer than for one imparted by the sub deflector, the throughput of the electron beam exposure system is reduced.

This problem becomes more pronounced when an electrostatic deflector 30 is positioned within an immersion lens 40, which is constituted with the lens portions 40A and 40B provided above and below the wafer 10. The immersion lens 40 achieves low aberration and high resolution by forming a strong magnetic field on the wafer 10 to converge the electron beam EB, making more fine processing possible.

The following methods may be employed in order to increase the sub deflection area:

(a) Increase the deflection voltage.

(b) Reduce the distance between electrostatic deflecting electrodes that face opposite each other.

(c) Lengthen electrostatic deflecting electrodes.

However, since an amplifier capable of high voltage output has inferior response characteristics, with method (a), the throughput of an electron beam exposure system is reduced. With method (b) or (c), the processing accuracy on the inner surface of the cylindrical member 301 is reduced and, consequently, the deflection accuracy is also reduced. As the path of the electron beam EB within the immersion lens 40 rotates spirally, only a very small increase in deflection area Is achieved with method (c).

(3) Reduction in throughput of an exposure system caused by a long shift time between subfields required by an electromagnetic deflector In order to utilize an electron beam exposure system for LSI mass production, the total of exposure time per wafer must be equal to or less than 3 minutes.

As shown in FIG. 11, for instance, electromagnetic deflectors 20A to 20D are positioned in four stages in the direction of the optical axis and their coils are connected in series with the number of turns at, for example, 80 and the inductance at approximately 50 µH. Because of this, the response speed is low and the shift time between the subfields F in FIG. 3 is, for example, 50 µsec. The number of subfields in a wafer 8" in diameter is typically $2.4 \times 10^6$, making the total length of shift time 120 sec. This would make it impossible to utilize an electron beam exposure system for LSI mass production.

In order to solve this problem, a method has been disclosed (First Publication No. 62-277724 of Japanese Patent Application, U.S. Pat. No. 4,853,870) in which the difference V1X–V2X between the output V1X of the D/A converter 21 and the monitor output V2X of the amplifying circuit 22 in FIGS. 1 and 9 is detected, to be added to the input of the differential amplifying circuit 32.

However, while the deflection area within subfields is −50 to 50 µm, a voltage capable of deflecting by approximately 100 µm must be applied to the sub deflector 30 at the rise of the output V1X of the D/A converter 21 during a shift between subfields and it is necessary, therefore, to approximately double the amplification factor of the amplifying circuit 30. This reduces the SN ratio, which in turn causes a problem that the exposure positional accuracy when scanning within subfields with the sub deflector 30 is reduced.

(4) Reduction in throughput of an exposure system due to long alignment time of patterns between layers.

During the manufacturing process of a semiconductor integrated circuit, it is necessary to mode a circuit pattern with aligning several tens of layers on a semiconductor wafer. The minimum pattern size of a 256 Mbit DRAM is 0.25 µm, for example, and the tolerance for layer alignment is equal to or less than ⅛ of that, i.e., 0.031 µm, which means that a very high degree of alignment accuracy is required.

As shown in FIG. 10, in an electron beam exposure process, chip areas $10i$, $1=1$ to n are formed on the semiconductor wafer 10 and around each chip area $10i$, aligning marks Ai, Bi, Ci and Di for layer alignment are formed. When exposure is performed with a stepping projection aligner, the global alignment method, in which, in n number of chip areas $10i$, the positions of the aligning marks Ai for 3 chip areas $10i$ are detected, for instance, and based upon the relationships with the corresponding positions in design, a relational expression that expresses the relationship between the design position of a given aligning mark Ai and its actual position on the semiconductor wafer 10 is determined to be used for alignment.

However, since a high degree of alignment accuracy is required in electron beam exposure, as mentioned earlier, the, di-by-di alignment method is employed, wherein the aligning marks Ai, Bi Ci and Di for each chip area 10i are detected for alignment. For example, when 50 chip areas are formed on a semiconductor wafer 10 with a 6-inch diameter, while electron beam exposure for one layer takes 2 minutes, it takes 7 minutes to detect all the aligning marks, resulting in low throughput of electron beam exposure.

(5) Reduction in the exposure pattern accuracy due to astigmatism of an electromagnetic lens As shown in FIG. 11, electromagnetic main deflectors 20A1 to 20A4 and an astigmatism correction coil 41, for deflecting an electron beam EB, are provided on the inside of an electromagnetic lens 40A. An electron beam EB0 diverges from the point of intersection of the optical axis 42 and the lateral cross sectional plane 43 of the electron beam EB when the deflection quantity is 0, and is converged onto the wafer 10 by the electromagnetic lens 40A as indicated with the solid line.

FIG. 12A shows a situation in which the astigmatism correction coil 41 is not operated. Because of the astigmatism of the electromagnetic lens 40A, the cross-over point CX of the X-Z cross section plane 44X and the cross-over point CY of the Y-Z cross section plane 44Y of the electron beam are offset, and the electron beam spot on the wafer becomes rectangular as indicated by the shaded area. If there is no astigmatism present, the electron beam spot 46 is square. The astigmatism correction coil 41 generates a magnetic field which expands or contracts the shape of the lateral cross sectional plane of an electron beam to correct the astigmatism.

The X-Z cross section plane 44X, the Y-Z cross section plane 44Y of the electron beam and its spot 45 on the wafer when the position PZ of the astigmatism correction coil 41 on the optical axis is set at PZ>CX, PZ=CX, CY<PZ<CX, PZ=CY and PZ<CY for the astigmatism at the Y-Z cross section 44Y in FIG. 12A are shown in FIGS. 12B to 12F respectively. Reference numbers 471 to 474 indicate the directions, i.e., direction X and direction Y of the electromagnetic force applied to the electron beam EB by the magnetic field generated by the astigmatism correction coil 41. For the sake of simplification, it is assumed that the cross section of the electron beam instantaneously changes when it is at a position in direction Z of the astigmatism correction coil 41.

Since, on the optical axis 42, the electromagnetic force generated by the astigmatism correction coil 41 cancels itself to 0, in FIG. 12C there is no change in the X-Z cross section 44X or the electron beam and only the Y-Z cross section 44Y is enlarged at a position in direction Z of the astigmatism correction coil 41. Consequently, by adjusting the electric current supplied to the astigmatism correction coil 41, the electron beam spot 45 can be aligned with the electron beam spot 46 obtained when there is no astigmatism.

However, cross-over points vary depending upon the position within the electromagnetic lens 40A, i.e., depending upon the deflection position of the electron beam EB and, therefore, the astigmatism correction coil 41 cannot be position aligned with the cross-over point CX. It is the same when there is an astigmatism generated at the X-Z cross section 44X.

Actually, it is verified that the shape of the cross section of the electron beam EB distorts at the corners of the deflection area. For example, compared to the regular shape, the shape of the cross section of the electron beam becomes flattened at the upper right corner, and it becomes oblong at the lower left corner. When the cross section of the electron beam EB is a 3 $\mu m \times 3$ $\mu m$ square, for instance, the quantity of change in the shape of the cross section is equal to or less than 0.1 $\mu m$ for each side. In order to meet with the requirement of more fine patterns, it is necessary to raise the accuracy of astigmatism correction to a level higher than that achieved currently.

SUMMARY OF THE INVENTION

Accordingly, an object of the present invention is to provide a method of and a system for charged particle beam exposure which can achieve an improvement in throughput.

Another object of the present invention is to provide a method of and a system for charged particle beam exposure which can perform more fine exposure patterns by improving the accuracy of astigmatism correction.

First Aspect of the Invention

According to the 1st aspect or the present system invention, there is provided a method of charged particle beam exposure by deflecting a charged particle beam onto an object with a deflector to which an output end or an amplifying circuit connected, wherein an input of the amplifying circuit is changed in steps by, at least, a first value and a second value which is larger or smaller than the first value, the method comprising the steps of: using the amplifying circuit which has response characteristics such that there is a damped oscillatory response in its output when the input step-changes by the first value; connecting a variable impedance means capable of constituting a low-pass filter in a coupling circuit with the deflector between an output end of the amplifying circuit and the deflector; and switching an impedance value of the variable impedance means in such a manner that the coupling circuit constitutes the low-pass filter when the quantity or the step change is the first value and a high-frequency component is reduced more when the quantity of the step change is the first value than when the quantity of the step change is the second value.

According to the 1st aspect of the present method invention, there is provided a system for charged particle beam exposure, comprising a deflector for deflecting a charged particle beam onto an object; and an amplifying circuit, an input of which changes in steps, by quantities consisting of, at least, a first value and a second value larger or smaller than the first value, an output end of which is coupled with the deflector: wherein the amplifying circuit has response characteristics such that there is a damped oscillatory response in the output when the input step-changes by the first value; the system further comprising a variable impedance means, connected between an output end of the amplifying circuit and the deflector, capable of constituting a low-pass filter in a coupling circuit with the deflector; and a control circuit for controlling an impedance value of the variable impedance means in such a manner that the coupling circuit constitutes a low-pass filter when a quantity of the step change is the first value and that a high-frequency component is reduced more when the quantity of the step change is the first value than when the quantity of the step change is the second value.

In the 1st aspect, the object may be a wafer or a mask. The deflectors may be either electromagnetic deflectors or an electrostatic deflectors. The amplifying circuit may be a single stage circuit or a circuit with a plurality of stages, or it may be a buffer circuit with the amplification factor at 1 such as a voltage follower. The variable impedance means comprises impedance elements such as a resistor, a capacitor or a coil and a switching means which switches the connection of the impedance elements. The expression "capable of constituting a low pass filter" means that, depending upon the impedance value of the variable impedance means, a low pass filter is constituted.

With the 1st aspect, since an amplifying circuit capable of quick response is used, when the input of the amplifying circuit changes in steps by a second value that is larger than a first value, the setting time can be reduced, as shown in FIG. 15B, for example, compared with the prior art (FIG. 4B). Also, as the amplifying circuit has quick response characteristics, when the input of the amplifying circuit changes in steps by the first value, oscillation damping will be generated in the output as shown with the dotted line in FIG. 15A, for example, unless a variable impedance means is used. However, since the low pass filter is constituted of a coupling circuit comprising the variable impedance means and the deflectors, the setting time can be reduced, as shown by the solid line in FIG. 15A, compared with a case in which a variable impedance means is not used. Furthermore, as the impedance value of the variable impedance means is switched in correspondence changes in the input of the amplifying circuit rather than the output, the effect of switching the impedance value is enhanced.

Consequently, according to the 1st aspect, it is possible to reduce the exposure processing time compared with the prior art, thereby making it possible to improve the throughput of the charged particle beam exposure system.

In the 1st mode of the 1st aspect of the present invention, the switching is determined by a signal value which has an information of the quantity of the step change before the step change.

In the 1st mode, the impedance value at the variable impedance means must be just switched in correspondence with the signal value preceding the input to the amplifying circuit, thereby achieving simplification of the structure. Also, since the impedance value is switched in correspondence with the signal value preceding the input to the amplifying circuit, even when a transient waveform which corresponds to the change in the input, such as a glitch waveform, is included in the input of the amplifying circuit, this transient waveform can be either removed or reduced from the output of the amplifying circuit by setting the impedance value at the variable impedance means at an appropriate value.

In the 2nd mode of the 1st aspect of the present invention, the signal value is a count value of a counter, and the method further comprises the step of: changing the input to the amplifying circuit in steps by the first value every time the count value changes by one in a direction and by the second value when the count value returns from the maximum absolute value to its initial value.

In the 2nd mode, the structure is simplified since switching of the impedance value at the variable impedance means can be controlled with the step change in the input of the amplifying circuit when the count value of the counter returns from the maximum value to the initial value and with the following step change.

In the 3rd mode of the 1st aspect, of the present invention, the method further comprises the step of: storing a signal value preceding an input to the amplifying circuit temporarily in storage means; wherein the switching is performed based upon a present value of the signal value and a preceding value stored in the storage means.

In the 3rd mode, the throughput of the charged particle beam exposure system can be improved by reducing the setting time of the output of the amplifying circuit for any step change such as in vector scanning.

In the 4th mode of the 1st aspect of the present invention, the variable impedance means is a variable resistor.

In the 4th mode, since the only variable parameter of the variable impedance means is the resistance value, it is easy to find the optimal resistance value.

Second Aspect of the Invention

According to the 2nd aspect of the present method invention, there is provided a method of charged particle exposure for exposing an object with a charged particle beam by deflecting the charged particle beam with a main deflector and a sub deflector whose scanning area is narrower than that of the main deflector, in order to scan the charged particle beam onto the object, the method comprising the steps of: supplying a drive signal to the main deflector or the sub deflector based upon an output of a D/A converter, and including a correction signal in the drive signal in order to cancel out an effect on the charged particle beam of a transient waveform included in the drive signal when the outputs of the D/A converters change.

According to the 2nd aspect of the present system invention, there is provided an system for charged particle exposure for exposing an object with a charged particle beam by deflecting the charged particle beam with a main deflector and with a sub deflector whose scanning area is narrower than that of the main deflector, in order to scan the charged particle beam onto the object, the system comprising: a first D/A converter; a first amplifying circuit connected between an output end of the first D/A converter and an input end of the main deflector; a second amplifying circuit connected to an input end of the sub deflector and a waveform correction circuit for including a correction signal in an output signal of the first amplifier or the second amplifier in order to cancel out an effect of a transient waveform included in the output of the first amplifying circuit on the charged particle beam when the input of the first D/A converter changes.

With the 2nd aspect, the effect of the transient waveform included in the drive signal for the charged particle beam is canceled out with a correction signal when the output of the D/A converter step-changes. As a result, the setting time for the transient waveform is either eliminated or reduced, and an improvement in the throughput of the charged particle beam exposure is achieved. This canceling out is executed effectively since the correction signal is predetermined.

As transient waveforms are determined in correspondence with changes in the input at the D/A converter, the canceling out mentioned above is executed more effectively in the 1st mode of the 2nd aspect.

In the 1st mode of the 2nd aspect of the present invention, the correction signal is determined based upon a change in an input to the D/A converter.

In the 2nd mode of the 2nd aspect of the present invention, the correction signal is generated by sequentially reading out correction data stored in storage means.

In the 2nd aspect, it is possible to achieve the aforementioned canceling out in an more complete manner by simply rewriting the correction data stored in storage means. Moreover, the correction waveform is not affected by changes in the ambient temperature or changes occurring over time. It can be ensured that the canceling out described above is executed more completely by, for instance, sampling the drive signal as the input at the D/A converter changes, storing the data multiplied by a constant in the storage means, adjusting the gain of the amplifying circuit and shifting the time axis of the data stored in the storage means.

In the 3rd mode of the 2nd aspect of the present invention, the storage means is addressed with a count value of a counter into which an initial value corresponding to an input value of the D/A converter is loaded every time the input value changes and to which a clock is supplied to change the count value.

In the 3rd mode, it is possible to execute the canceling out described above for transient waveforms which vary depending upon changes in the input value at the D/A converter.

In the 4th mode of the 2nd aspect of the present invention, the charged particle beam is continuously deflected by the main deflector in one direction and when the charged particle beam is swung back in the opposite direction from the one direction, the correction signal is included in a drive signal supplied to either the main deflector or the sub deflector.

In the 4th mode, as the charged particle beam is continuously deflected in a direction by the main deflector, a correction signal must be included the drive signal only when the charged particle beam is to be swung back in the opposite direction.

In the 5th mode of the 2nd aspect of the present invention, the method further comprises the steps of: mounting the object on a mobile stage; moving the mobile stage continuously in a direction perpendicular to the direction of deflection imparted by the main deflector; and deflecting the charged particle beam by the sub deflector in conformance with the movement of the mobile stage for each scan performed by the main deflector.

In the 5th mode, problems such as misconnection errors between subfields, as shown in FIG. 26, do not occur. Consequently, it is possible to accurately expose more fine patterns.

In addition, since the width of scanning of the charged particle beam performed by the sub deflector is relatively small, for instance, 10 μm, the positional accuracy in the irradiation of the object by the charged particle beam EB improves in the direction of the sub deflection. Also, the D/A converter, which is both fast and highly accurate with a small number of bits, can be used. As a result, it becomes possible to perform high-speed, high-accuracy scanning of the charged particle beam EB with the sub deflector.

In the 6th mode of the 2nd aspect of the present invention, the method further comprises the steps of: reading out a data in second storage means with supplying a count value of a second counter and supplying a clock to an clock input end of the second counter; supplying the data to the D/A converter in order to convert to analog signal; and supplying the analog signal to the main deflector via a smoothing circuit and an amplifying circuit to make the drive signal; whereby the drive signal is a sawtooth waveform a cycle of which being equal to a cycle of the count value and whereby a scanning speed of the main deflector is made variable by changing the frequency of the clock.

In the 6th mode, the scanning speed can be adjusted more accurately and easily with the frequency of a clock in comparison with that in an analog sawtooth wave generating circuit which employs a time constant circuit. Also, it is possible to prevent changes in the scanning speed caused by changes in the ambient temperature and changes occurring over time as in an analog sawtooth waveform circuit. As a result, even when the canning speed is changed according to the sensitivity of the resist, and so on, it is possible to expose more fine patterns which require a high degree of accuracy.

In the 7th mode of the 2nd aspect of the present invention, the method comprises: arranging a blanking aperture array at a position reached by the charged particle beam before it passes through the main deflector and the sub deflector, the blanking aperture array having a plurality of openings on a substrate in a lattice pattern and a pair of electrodes formed on the edge of each the opening on the substrate; and having the charged particle beam pass through the blanking aperture array to split into a multiple beam; and controlling a voltage between the pair of electrodes in order to perform exposure of a pattern on the object.

In the 7th mode, it is possible to perform exposure of more fine patterns of any form.

Third Aspect of the Invention

According to the 3rd aspect of the present invention, there is provided a system for charged particle exposure, comprising: an analog waveform generating circuit, the waveform having step changes; a smoothing circuit for interpolating approximately linearly between step-change points adjacent to each other against a time; and a deflector for deflecting a charged particle beam continuously based upon an output of the smoothing circuit.

In the 3rd aspect, since the distance between step-change points adjacent to each other is relatively short, the interpolation accuracy can be maintained at a high level even when their inclination is adjusted. As a result, an improvement in the exposure positional accuracy can be achieved compared to a structure in which an analog sweep circuit, such as used in an oscilloscope, is employed.

In the 1st mode of the 3rd aspect of the present invention, the smoothing circuit is a low-pass filter.

In the 1st mode, the structure can be simplified.

In the 2nd mode of the 3rd aspect of the present invention, the smoothing circuit includes: a constant current source, whose current value varies according to a control signal, having a control input end supplied with the control signal corresponding to the inclination of line connecting between about the step change points; a capacitor with one end connected to the constant current source, another end of the capacitor being made to have constant potential; and an output buffer circuit with an input end connected to the one end of the capacitor.

In the 2nd mode of the 3rd aspect of the present invention, the method comprises the steps of: determining a inclination between step-change points adjacent to each other against a time; and determining a value of the control signal to be supplied to the control input end of the constant current source in order to perform linear interpolation between the two points with a line of the inclination.

In the 2nd mode, since the capacitor is charged or discharged by a constant current source, as if to linearly connect the step-change points mentioned above, the interpolation between those step-change points adjacent to each other can be performed more accurately than in a case in which smoothing is performed with a low pass filter. Consequently, the exposure positional accuracy improves and it becomes possible to perform exposure of more fine patterns.

In the 3rd mode of the 3rd aspect of the present invention, the system further comprises: a D/A converter for converting the digital value to an analog value is connected to a stage preceding the smoothing circuit; wherein the smoothing circuit includes a diode bridge circuit, in which anodes of a first diode and a second diode are connected to each other, cathodes of a third diode and a fourth diode are connected to each other, a cathode of the first diode is connected to an anode of the third diode and a cathode of the second diode is connected to an anode of the fourth diode, the cathode of the first diode is connected to an output end of the D/A converter; and wherein the constant current source includes a first constant current source with a current output end connected to the anode of the first diode, and a second constant current source with a current input end connected to the cathode of the third diode.

In the 3rd mode, charging to or discharging from the capacitor stops when the cathode potential of a third diode becomes equal to the cathode potential of a first diode. This prevents excessive charging or discharging of the capacitor.

In the 4th mode of the 3rd aspect of the present invention, the smoothing circuit further includes: a first switching means connected between the current output end of the first constant current source and the anode of the first diode; and a second switching means connected between the cathode of the third diode and the current input end of the second constant current source.

In the 4th mode, the glitch waveform that is contained in the output of a D/A converter can be eliminated by turning OFF first and second switching means.

In the 5th mode of the 3rd aspect of the present invention, the smoothing circuit further includes: a third switching means, connected to the current output end of the first constant current source, for turning ON/OFF the electric current output from the first constant current source, and a fourth switching means, connected to the current input end of the second constant current source, for turning ON/OFF the electric current input to the first constant current source.

In the 5th mode, since the constant current source can be used in the operating state at all times by turning either the first or the third switching means OFF when turning ON the other, and turning either the second or the fourth switching means OFF while turning ON the other, the ON/OFF response of the switching means is speeded up.

In the 6th mode of the 3rd aspect of the present invention, the third switching means and the fourth switching means are connected in series.

In the 6th mode, an electric current flows from the first constant current source to the second constant current source via the third and fourth switching means when the first and second switching means are turned OFF and the third and fourth switching means are turned ON. In this structure, a current bypass for the diode bridge can be constituted easily.

In the 7th mode of the 3rd aspect of the present invention, the first switching means and the fourth switching means are connected in series, and the second switching means and the third switching means are connected in series in the smoothing circuit; a cathode of a fifth diode is connected to the anode of the first diode and anode and cathode of a sixth diode are connected to the cathode of the third diode and the anode of the fifth diode respectively in the diode bridge circuit; and the output buffer circuit is a operational amplifying circuit in which one of a pair of inputs is connected to the one end of the capacitor and the cathode of the second diode and the other of the pair of inputs is connected to the cathode of the sixth diode and an output end of the operational amplifying circuit.

In the 7th mode, the offset in the output of the output buffer circuit can be automatically eliminated by the operation of the diode bridge circuit.

In the 8th mode of the 3rd aspect of the present invention, the system comprises a D/A converter output waveform changing in steps is supplied through a smoothing circuit to a deflector for deflecting a charged particle beam, wherein the smoothing circuit includes: an output buffer circuit an input end of which is an input end of the smoothing circuit; a resistor with one end connected to the input end of the output buffer circuit; a capacitor with one end connected to another end of the resistor and with the potential at the other end being maintained constant; and a low-pass filter connected to an output end of the output buffer circuit.

In the 8th mode, the interpolation between the corresponding step-change points adjacent to each other in the output waveform of the D/A converter can be performed more accurately compared to a structure in which smoothing is performed by a low-pass filter alone.

In the 9th mode of the 3rd aspect of the present invention, a value of the resistor or a capacitance of the capacitor can be switched with a control signal.

In the 9th mode, the interpolation between the corresponding step-change points adjacent to each other in the output waveform of the D/A converter can be performed more accurately by switching the capacitance or the resistance to an appropriate value.

In the 10th mode of the 3rd aspect of the present invention, a sample hold circuit for sampling the analog values is connected between the D/A converter and the smoothing circuit.

In the 10th mode of the 3rd aspect of the present invention, the method comprises the steps of: setting the sample hold circuit in a hold state at least while a time elapses after an output of the D/A converter starts to change in steps; determining an inclination between corresponding step-change points that are adjacent to each other in an output waveform of the sample hold circuit; and determining a value of the control signal to be supplied to the control input end of the constant current source based on the inclination in order to perform linear interpolation between the two step-change points adjacent to each other with a line or the inclination.

In the 10th mode, it is possible to ensure that the glitch waveform which is included in the output or the D/A converter will not be included in the output of the sample hold circuit.

In the 11th mode of the 3rd aspect of the present invention, a second smoothing circuit which is the same as that of claims 20 with a signal supplied to the control input ends or the first constant current source and the second constant current source being maintained constant, is connected between the D/A converter and a first smoothing circuit which is the smoothing circuit in claim 19.

In the 1st form of the 11th mode of the 3rd aspect of the present invention, the method comprises the steps of: setting in an OFF state between input and output of the first smoothing circuit by controlling the switching means of the first smoothing circuit at least while a time elapses after an output of the D/A converter starts to change in steps; and determining an inclination between corresponding step-change points that are adjacent to each other in an output waveform of the first smoothing circuit; and determining a value of the control signal to be supplied to the control input end of the second smoothing circuit based on the inclination in order to perform linear interpolation between corresponding step-change points that are adjacent to each other in an output waveform of the second smoothing circuit.

In the 2nd form of the 11th mode of the 3rd aspect of the present invention, the method comprises the steps of: setting in an OFF state between input and output of the first smoothing circuit by controlling the switching means of the first smoothing circuit at least while a time elapses after an output of the D/A converter starts to change in steps; setting in an OFF state between input and output of the second smoothing circuit by controlling the switching means of the second smoothing circuit only while a time elapses after an output of the D/A converter starts to change in steps; determining an inclination between corresponding step-change points that are adjacent to each other in an output waveform of the first smoothing circuit; and determining a value of the control signal to be supplied to the control input end of the second smoothing circuit based on the inclination in order to perform linear interpolation between corresponding step-change points that are adjacent to each other in an output waveform of the second smoothing circuit.

In the 12th mode of the 3rd aspect of the present invention, the system further comprises: a mobile stage for mounting an object to be exposed; and a position detector for detecting a position of the mobile stage; wherein a quantity of change in the digital value is equal to a quantity of change in a detected position of the mobile stage.

In the 11th and 12th modes, as shown in FIG. 39, for instance, the area of the inclination 0 that is included in the output of the second smoothing circuit is reduced compared to a structure in which a sample hold circuit is used as shown in FIG. 36.

In the 12th mode, even when there is noise imposed on the output of the first smoothing circuit by switching control on the first smoothing circuit, the noise can be prevented from passing through the second smoothing circuit.

In the 13th mode of the 3rd aspect of the present invention, the system further comprises: a main deflector for deflecting the charged particle beam; a sub deflector for deflecting the charged particle beam; and control means for causing the main deflector to scan the charged particle beam in a first direction, which is one or/and reverse direction, cyclically, for moving the mobile stage continuously in a second direction perpendicular to the first direction and for causing the charged particle beam to be deflected in the first direction following the movement or the mobile stage with the sub deflector in order to perform exposure on the object along the first direction.

In the 13th mode, feedback correction for the deflector in relation to the movement of the stage can be performed with more accuracy.

In the 14th mode or the 3rd aspect of the present invention, the method comprises the steps of: mounting an object to be exposed on a mobile stage; detecting a position of the mobile stage by a position detector; deflecting a charged particle beam in a first direction by a main deflector to scan the charged particle beam in a first direction cyclically; moving the mobile stage continuously in a second direction perpendicular to the first direction; and deflecting the charged particle beam in the first direction by the sub deflector in order to follow the movement of the mobile stage and to perform exposure on the object along the first direction: wherein the inclination between the two points is approximately equal to a rate at which the detected position of the mobile stage changes.

In the 14th mode, feedback correction for the sub deflector in relation to the movement of the stage can be performed with more accuracy. Also, as the inclination between the step-change points mentioned earlier is approximately equal to the rate at which the detected position of the mobile stage changes, the inclination between the step-change points adjacent to each other can be easily determined.

Fourth Aspect of the Invention

According to the 4th aspect of the present method invention, there is provided a method of charged particle beam exposure, comprises the steps of: deflecting a charged particle beam entering a first electrostatic deflector approximately along an optical axis in a first direction running approximately at a right angle to the optical axis, the first electrostatic deflector having a plurality of electrostatic deflecting electrodes positioned around the optical axis and inside an electromagnetic lens positioned around an optical axis for causing the charged particle beam to converge onto an object to be exposed; and deflecting the charged particle beam entering a second electrostatic deflector in a second direction in a plain approximately perpendicular to the optical axis, the second electrostatic deflector having a plurality of electrostatic deflecting electrodes positioned inside the electromagnetic lens and around the optical axis at positions apart from the first electrostatic deflector in a direction of incidence of the charged particle beam, the second direction being aligned approximately in a direction running from the optical axis toward the charged particle beam at a position of the second electrostatic deflector.

According to the 4th aspect of the present system invention, there is provided a system for charged particle beam exposure comprises: an electromagnetic lens positioned around an optical axis for causing a charged particle beam to converge onto an object to be exposed; a first electrostatic deflector, having a plurality of electrostatic deflecting electrodes positioned inside the electromagnetic lens and around the optical axis, for deflecting the charged particle beam entering the first electrostatic deflector approximately along the optical axis in a first direction which is approximately perpendicular to the optical axis; and a second electrostatic deflector, having a plurality of electrostatic deflecting electrodes positioned around the optical axis and inside the electromagnetic lens at positions apart from the first electrostatic deflector in a direction of incidence of the charged particle beam, for deflecting the charged particle beam entering the second electrostatic deflector in a second direction in a plain approximately perpendicular to the optical axis, the second direction being aligned approximately in a direction running from the optical axis toward the charged particle beam at a position of the second electrostatic deflector.

When a charged particle beam is deflected by a first electrostatic deflector, it rotates spirally, since it is subject to a converging force due to the magnetic field of the electromagnetic lens. With the angle of this rotation assigned θ at the position of a second electrostatic deflector, since the second electrostatic deflector is positioned by turning it by approximately the angle θ from the first electrostatic deflector, the force component applied by the second electrostatic deflector in the direction away from the optical axis becomes approximately the maximum. Consequently, the quantity of deflection of the charged particle beam on the object to be exposed also becomes approximately the maximum.

As a result, in the 4th aspect of the invention, the deflection area covered by the electrostatic deflectors is increased. This, in turn, makes it possible to reduce the number of times scanning is performed by the electromagnetic main deflector, in which setting time is relatively long, thereby achieving an improvement in throughput of the charged particle beam exposure system.

In the 1st mode of the 4th aspect of the present invention: the first electrostatic deflector has a first cylindrical member and the plurality of electrostatic deflecting electrodes formed on inner surface of the first cylindrical member; and the second electrostatic deflector has a second cylindrical member and the plurality of electrostatic deflecting electrodes formed on the inner surface of the second cylindrical member.

In the 2nd mode of the 4th aspect of the present invention, the system further comprises a cylindrical connecting member for connecting an end portion of each of the first and second cylindrical members to link the first and second cylindrical members.

In the 2nd mode, connection between the first and second electrostatic deflectors is facilitated.

In the 3rd mode of the 4th aspect of the present invention, the inner surface of the cylindrical connecting member is coated with an electrically conductive film to be connected with a ground line being electrically insulated from the electrostatic deflecting electrodes of the first and second electrostatic deflectors.

In the 3rd mode, deflection of a charged particle beam by an electrical field generated by the charging up onto a connecting member can be prevented.

In the 4th mode of the 4th aspect of the present invention: one end of each of the first and second cylindrical members has a first connecting portion and a second connecting portion, respectively; and the cylindrical connecting member has such a third connecting portion and a fourth connecting portion on one end and another end to be connected with the first and second connecting portions respectively that the second direction relative to the first direction is determined by the connection between the first connecting portion and the third connecting portion and the connection between the second connecting portion and the fourth connecting portion.

The 4th mode facilitates setting the above-mentioned angle θ between the first and second electrostatic deflectors.

In the 5th mode of the 4th aspect of the present invention: the first and second cylindrical members are composed of ceramic; and the electrostatic deflecting electrodes are each having a NiP film at a thickness of approximately 1 μm or less, applied to the inner surface of the cylindrical members, and a gold plate film at a thickness of approximately 2 μm or less, applied on the NiP film.

In the 6th mode of the 4th aspect of the present invention: cross sectional shapes at the centers in the direction of the optical axis of the first and second electrostatic deflectors are identical to each other and the electrostatic deflecting electrodes corresponding to each other in the first and second electrostatic deflectors are electrically connected through wiring.

In the 7th mode of the 4th aspect of the present invention, the electrostatic deflecting electrodes of the first and second electrostatic deflectors are linear electrodes parallel to the central axis of the cylindrical members.

Fifth Aspect of the Invention

According to the 5th aspect of the present method invention, there is provided a method of charged particle beam exposure by radiating a charged particle beam onto an object, the method performing main scanning of a charged particle beam with an electromagnetic main deflector which deflects the charged particle in a direction in a plain approximately perpendicular to a optical axis, and performing sub scanning of the charged particle beam with an electrostatic sub deflector, comprising: using a electromagnetic auxiliary deflector, an inductance of which being smaller than that of the main deflector, for deflecting the charged particle beam in a direction in a plain approximately perpendicular to the optical axis; and controlling an electric current supplied to the main deflector and the auxiliary deflector so that the sum of a vector of main deflection imparted by the main deflector and a vector of auxiliary deflection imparted by the auxiliary deflector will be a target deflection vector, making the main deflection vector step-change along a direction of the main scanning, and making a component of the vector of the auxiliary deflection in a direction of the main scanning be negative at immediately preceding the step change.

According to the 5th aspect of the present system invention, there is provided a system for charged particle beam exposure by radiating a charged particle beam onto an object, the system including an electromagnetic main deflector for main scanning of the charged particle beam with deflecting the charged particle in a direction in a plain approximately perpendicular to optical axis and an electrostatic sub deflector for sub scanning of the charged particle beam, the system further comprising: a electromagnetic auxiliary deflector, whose inductance is smaller than that of the main deflector, for deflecting the charged particle beam in a direction in a plain approximately perpendicular to the optical axis; and control means for controlling an electric current supplied to the main deflector and the auxiliary deflector so that the sum of a vector of main deflection imparted by the main deflector and a vector of auxiliary deflection imparted by the auxiliary deflector will be a target deflection vector, making the main deflection vector step-change along a direction of the main scanning, and making a component of the vector of the auxiliary deflection in a direction of the main scanning be negative at immediately preceding the step change.

With the 5th aspect, since the component of the auxiliary deflection vector in the direction of main scanning is negative at immediately preceding a step change of the deflection vector, a small deflection quantity is required to be achieved by the main deflector until the deflection vector settles after the step change starts, and the length of the auxiliary deflection vector is less than that when the component in the direction of main scanning is positive or 0. In addition, the inductance of the auxiliary deflector is smaller than that of the main deflector. These contribute to a reduction in the time elapsing from the start of step change to the settling of the deflection vector, compared to what was possible in the prior art, improving the throughput of the charged particle exposure system.

In the 1st mode of the 5th aspect of the present invention: the main scanning is executed by scanning alternately in direction X and direction −X while shifting in direction Y after each the scanning in the direction X or direction −X, the Y direction being perpendicular to the direction X and a component of the vector of the auxiliary deflection in direction Y being negative at immediately preceding the step change.

In the 1st mode, since the Y component of the auxiliary deflection vector is negative at immediately preceding a step change of the deflection vector, the time elapsing from the start to the settling of a step change of the deflection vector can be further reduced when shifting in direction Y.

In the 2nd mode of the 5th aspect of the present invention, the control means comprises: a D/A converter; an amplifying circuit for amplifying an output of the D/A converter to supply the main deflector an electric current; means for detecting a difference in response of the electric current supplied to the main deflector relative to an output of the D/A converter; and means for changing the vector of the auxiliary deflection based upon the difference.

In the 2nd mode, since the change in the auxiliary vector is based upon the difference between the output of the D/A converter and the quantity proportional to the electric current flowing to the main deflector, control ran be performed easily.

Sixth Aspect of the Invention

According to the 6th aspect of the present invention, there is provided a method of charged particle beam exposure onto an object having a plurality of chip areas, same each other, with a plurality of aligning marks formed in correspondence to each of the chip areas, the method comprising mounting the object on a mobile stage, and irradiating a charged particle beam on the object based upon positions of the aligning marks, comprising the steps of; detecting first positions each of which is a position of a corresponding the aligning mark among different the chip areas and second positions which are positions of the plurality of aligning marks for each of a plurality of the chip areas; determining a first approximate relationship between any actual position of all the aligning marks corresponding to the first positions and a corresponding position in design based upon relationship between the first positions detected and corresponding positions in design; determining, for each of the chip areas related to the second positions, a second approximate relationship between any actual position within the chip area and a corresponding position in design based upon relationship between the second positions detected and corresponding positions in design; determining a generalized second approximate relationship between any actual position within any one of the chip areas and a corresponding position in design based upon the second approximate relationship for each of the chip areas related to the second positions; calculating an approximate actual position within one of the chip areas in correspondence to a position in design, based upon the first approximate relationship and the generalized second approximate relationship; and performing exposure based upon the calculated actual position.

The 6th aspect requires only representative aligning marks on an object to be detected, achieving a reduction in the time required for alignment processing between the layers, compared to the prior art, and achieving an improvement in throughput of charged particle beam exposure. Moreover, since the actual positions within any chip area $10i$ relative to the design position is calculated based upon the first approximate relationship and generalized second approximate relationship, alignment between layers can be performed with a enough accuracy.

In the 1st mode of the 6th aspect of the present invention, in the step of detecting, all of the first positions are included in the second positions.

In the 1st mode, as the first detected position is contained in the second detected position, the aligning mark detection time can be further reduced.

In the 2nd mode of the 6th aspect of the present invention, in the step of determining the first approximate relationship, the first approximate relationship is determined by approximating X with x and y polynomials and Y with x and y polynomials, where (X, Y) is a coordinates (X, Y) of the any actual position of all the aligning marks corresponding to the first positions and (x, y) is a coordinates of the corresponding position in design.

In the 2nd mode, since first approximate relationship is obtained with a polynomial, its expression can be simplified.

In the 3rd mode of the 6th aspect of the present invention, the polynomials of of the first approximate relationship are:

$$X=g11x+r11y+h11xy+o1$$

$$Y=g12x+r12y+h12xy+o2$$

where g11, r11, h11, o1, g12, r12, h12 and o2 are constants.

In the 3rd mode, since a non linear term is included in the first approximate relationship and since there is only one non linear term, it is possible to take into consideration the distortion that occurs during the processing of the object to be exposed, as well as to simplify the first approximate relationship.

In the 4th mode of the 6th aspect of the present invention, in the step of determining the second approximate relationship, the first approximate relationship is determined by approximating U with u and v polynomials and V with u and v polynomials, where (U, V) is a coordinates of the any actual position within the chip area and (u, v) is a coordinates of the corresponding position in design.

In the 4th mode, since second approximate relationship is obtained with a polynomial, its expression can be simplified.

In the 5th mode of the 6th aspect of the present invention, the polynomials of the second approximate relationship are:

$$U=g21u+r21v+h21uv$$

$$V=g22u+r22v+h22uv$$

where g21, r21, h21, g22, r22, and h22 are constants.

In the 5th mode, since a non linear term is included in the second approximate relationship and since there is only one non linear term, it is possible to take into consideration local distortion occurring during the processing of the object to be exposed as well as to simplify the second approximate relationship.

In the 6th mode of the 6th aspect of the present invention, in the step of determining the generalized second approximate relationship, the generalized second approximate relationship is determined by approximating the U with polynomials of the u and v and the V with polynomials of the u and v, coefficients of the polynomials being polynomials of the x and the y.

In the 6th mode, since the coefficient of the polynomial of the second approximate relationship is expressed with a polynomial, the expression of the generalized second approximate relationship can be simplified.

In the 7th mode of the 6th aspect of the present invention, in the step of determining the generalized second approximate relationship, the generalized second approximate relationship is determined by expressing the g21, r21, h21, g22, r22 and h22 as:

$$g21=g210+g211x+g212y+g213xy$$

$$r21=r210+r211x+r212y+r213xy$$

$$h21=h210+h211x+h212y+h213xy$$

$$g22=g220+g221x+g222y+g223xy$$

$$r22=r220+r221x+r222y+r223xy$$

$$h22=h220+h221x+h222y+h223xy$$

where g210, g211, g212, g213, r210, r211, r212, r213, h210, h211, h212, h213, g220, g221, g222, g223, r220, r221, r222, r223, h220, h221, h222 and h223 are constants.

In the 7th mode, since a non linear term is included in each coefficient in generalized approximate relationship and since the number of such non linear terms is only one, it is possible to take into consideration local distortion occurring during the processing of the object as well as to simplify the generalized second approximate relationship.

In the 8th mode of the 6th aspect of the present invention, the step of calculating an approximate actual position (X, Y) within one of the chip areas in correspondence to a position (x, y) in design includes the steps of: determining position (x0, y0) in design of the aligning mark corresponding to the first position related to the chip area which involve the position (x, y); determining relative position (x–x0, y–y0) in design; calculating X=X0 and Y=Y0 by substituting x and y in the first approximate relationship according to claim 51 with x0 and y0 respectively; calculating the coefficients in the generalized second approximate relationship according to claim 55 based upon the x and y; calculating U=U0 and V=V0 by substituting the u and v in the generalized second approximate relationship with x–x0 and y–y0; and calculating X=X0+U0 and Y=Y0+V0.

In the 8th mode, the actual position relative to the design position within any chip area on the object to be exposed can be approximately calculated easily, based upon the first approximate relationship and the generalized second approximate relationship.

Seventh Aspect of the Invention

According to the 7th aspect of the present method invention, there is provided a method of charged particle beam exposure by radiating a charged particle beam onto an object, the method performing main scanning with a main deflector positioned around an optical axis, performing sub scanning with a sub deflector positioned around the optical axis, and causing the charged particle beam to converge onto the object with an electromagnetic lens positioned around the optical axis, the method comprising: locating a first astigmatism correction coil, around the optical axis, for deforming a shape of a cross section of the charged particle beam; locating a second astigmatism correction coil, around the optical axis and at a position away from the first astigmatism correction coil in a direction of the optical axis, for deforming a shape of a cross section of the charged particle beam; and supplying an electric current to the first and second astigmatism correction coils according to quantity of deflection imparted by the main deflector in order to correct astigmatism of the electromagnetic lens.

According to the 7th aspect of the present system invention, there is provided a system for charged particle beam exposure by radiating a charged particle beam onto an object, the system performing main scanning with a main deflector positioned around an optical axis, performing sub scanning with a sub deflector positioned around the optical axis, and causing the charged particle beam to converge onto the object with an electromagnetic lens positioned around the optical axis, the system comprising: a first astigmatism correction coil, located around the optical axis, for deforming a shape of a cross section of the charged particle beam; a second astigmatism correction coil, located around the optical axis and at a position away from the first astigmatism correction coil in a direction of the optical axis, for deforming a shape of a cross section of the charged particle beam; and control means for supplying an electric current to the first and second astigmatism correction coils according to quantity of deflection imparted by the main deflector in order to correct astigmatism of the electromagnetic lens.

In the 7th aspect, since astigmatism that corresponds with the quantity of deflection imparted by the main deflector can be corrected, more fine exposure patterns can be performed.

In the 1st mode of the 7th aspect of the present invention: the method comprises: detecting back-scattered electrons from a charged particle beam spot on the object with scanning a charged particle beam in such a manner that the charged particle beam crosses individual straight lines of a plurality of cross-shaped marks formed on the object approximately at a right angle; measuring a width of the charged particle beam spot in a direction of the scanning based upon change in detected quantities of the back-scattered electrons; determining such relationship between quantity of deflection imparted by the main deflector and the electric currents supplied to the first and second astigmatism correction coils that all the widths are approximately the same each other; determining interpolation formula expressing relationship between the quantity of deflection and the electric current based upon the relationship; and determining the electric current corresponding to the quantity of deflection imparted by the main deflector based upon the interpolation formula.

In the 1st mode, astigmatism correction quantity for any quantity of deflection imparted by the main deflector can be easily determined.

In the 2nd mode of the 7th aspect of the present invention, each of the first and second astigmatism correction coils includes: a first set of coils having two pairs of coils facing opposite each other across the optical axis, the two pairs of coils connected in series, and a second set of coils equivalent to the first set of coils but rotated around the optical axis by 45°.

In the 2nd mode, the astigmatism can be more accurately corrected.

DESCRIPTION OF THE PREFERRED EMBODIMENTS

Figure 13:
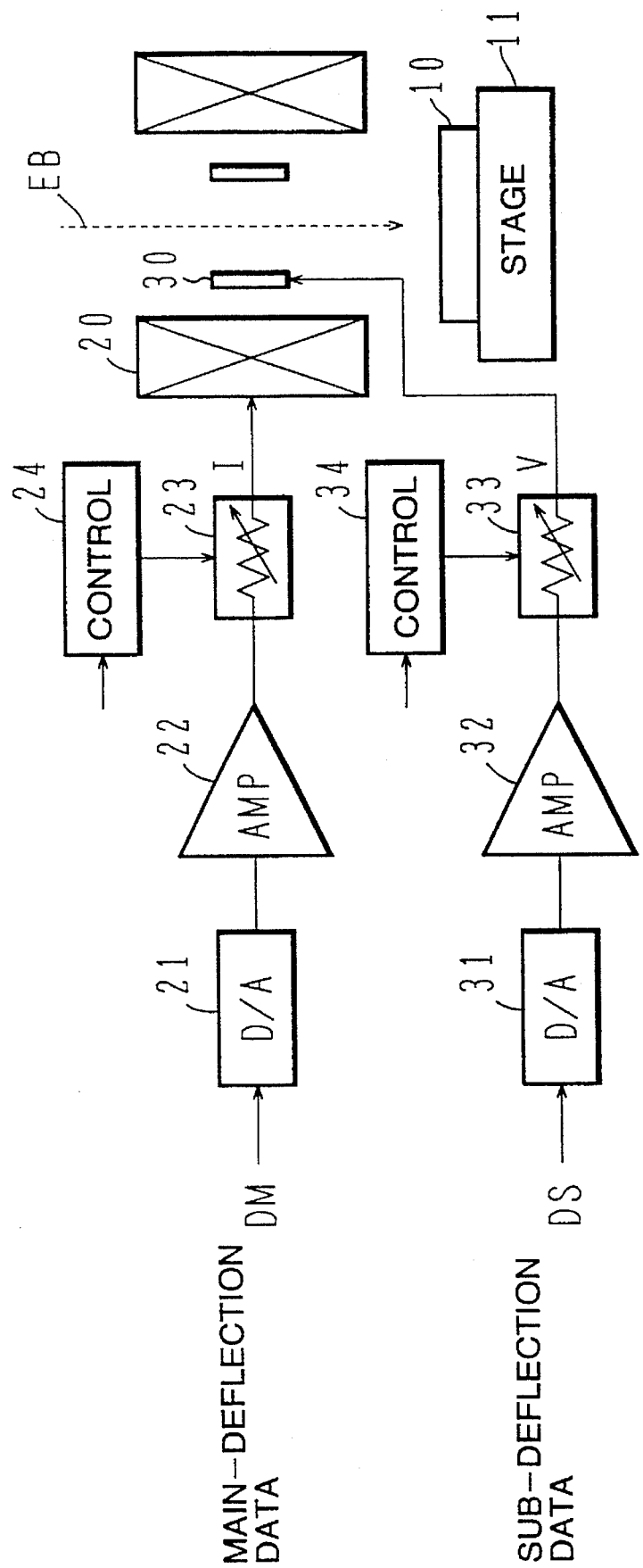
FIG. 13 is a block diagram of the parts of a charged particle beam exposure system that are common to the first to third embodiments according to the present invention.

FIG. 13 shows the structure of the parts of a charged particle beam exposure system which are common to the first to third embodiments to be described below.

In this system, a variable resistor 23 is connected between an output end of an amplifying circuit 22 and a drive signal input end of a main deflector 20. The resistance value of the variable resistor 23 is controlled by the control circuit 24. Likewise, a variable resistor 33 is connected between an output end of an amplifying circuit 32 and a drive signal input end of a sub deflector 30. The resistance value of the variable resistor 33 is controlled by the control circuit 34. Since the structures of the variable resistor 23 and the control circuit 24 can be identical to those of the variable resistor 33 and the control circuit 34 respectively, aside from the characteristics values of the elements, only examples of the variable resistor 33 and the control circuit 34 are presented below.

FIRST EMBODIMENT

Figure 14:
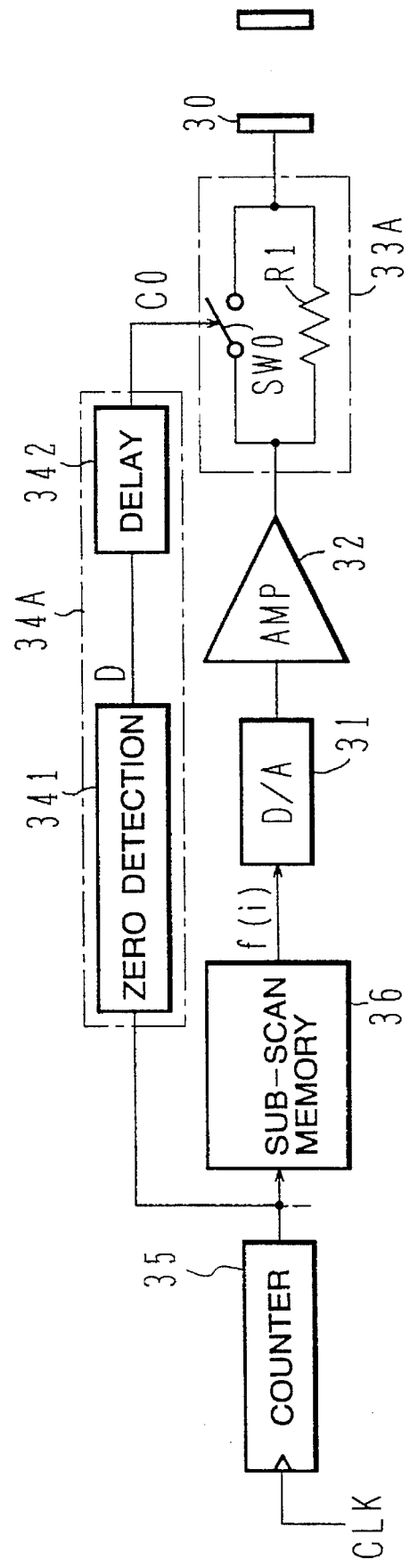
FIG. 14 shows the sub deflector drive circuit in the first embodiment according to the present invention.

FIG. 14 shows the sub deflector drive circuit in the first embodiment. For the sake of simplification, FIG. 14 shows only the structure related to reduction of the setting time of the output from the amplifying circuit 32.

In the variable resistor 33A, a resistor R1 and a switching element SW0 are connected in parallel and the resistance value of the variable resistor 33A is switched between 0 and R1 by turning ON and OFF the switching element SW0 with a control signal C0, which is supplied to the control input end of the switching element SW0.

Address specification is made for the sub deflector scanning memory 36 with the count value i on the counter 35 and then the sub deflection data DS=r(i), which is read out from the sub deflector scanning memory 36, is supplied to the D/A converter 31 to be digitized.

The control circuit 34A comprises a 0-detection circuit 341 which sets the 0-detection signal D to the logical value "1" only while the count value i on the counter 35 is 0, and a delay circuit 342 that supplies the control signal C0, which delays the 0 detection signal D, to the control input end of the switching element SW0. The switching element SW0 is turned ON only when the control signal C0 is set to "1".

The setting time of the delay circuit 342 is set at a value smaller than the setting time $\Delta t4$ (FIG. 15B) of the output of the amplifying circuit 32 while the difference between the time point at which the switching element SW0 shifts to the ON state and the time point at which the change in output of the amplifying circuit 32 starts, is equal to or greater than 0 when the count value i shifts from n to 0. Preferably, the setting time of the delay circuit 342 should be equal to or less than 50% of the setting time $\Delta t4$, for example, it may be 10 ns when $\Delta t4=200$ ns. This point applies to the other embodiments as well, which are to be explained later.

Figure 15A:
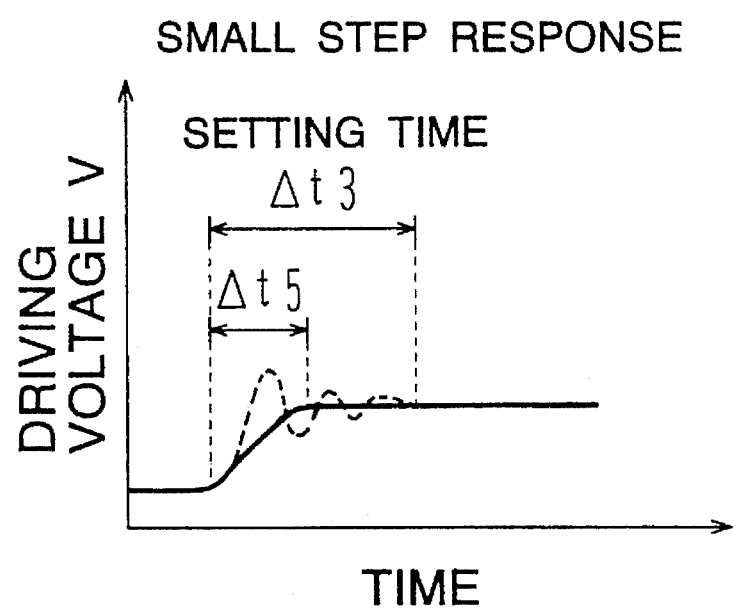
FIG. 15A is a waveform diagram showing a small step response of the sub deflector drive voltage.
Figure 15B:
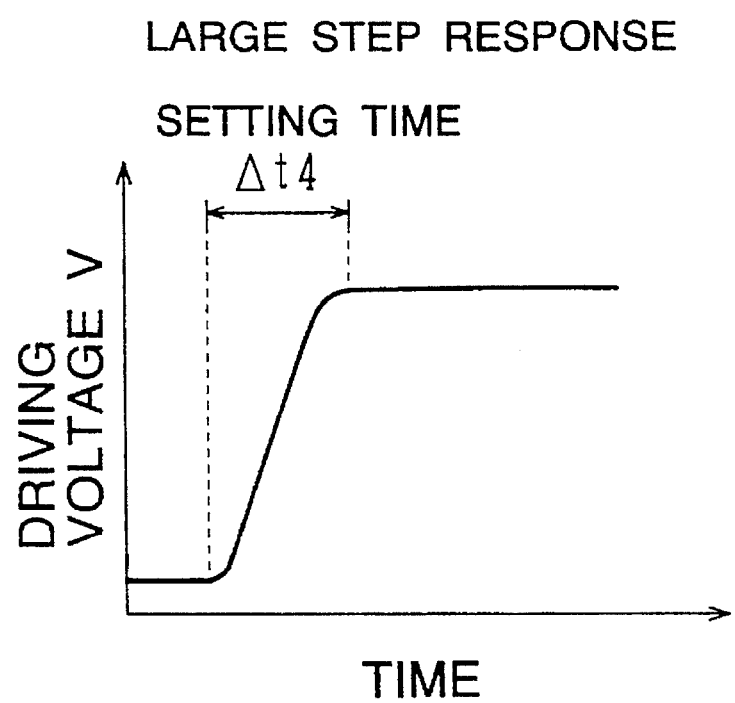
FIG. 15B is a waveform diagram showing a large step response of the sub deflector drive voltage.

When the input of the amplifying circuit 32 changes in small steps to a change in the input value of the D/A converter 31 by just one with the switching element SW0 set to ON, the electrostatic capacity of the capacitor through which the high frequency components pass, and which is included in the amplifying circuit 32, is adjusted so that an attenuated waveform is generated in the output of the amplifying circuit 32 as shown with the dotted line in FIG. 15A, to improve the quick response characteristics of the amplifying circuit 32. Preferably, when the input of the amplifying circuit 32 changes in large steps with the count value i changing from n to 0 while the switching element SW0 is set to ON, the characteristics of the amplifying circuit 32 should be adjusted in such a manner that the setting time $\Delta t4$ is set at the minimum, as shown in FIG. 15B.

Next, the operation of the first embodiment, which is structured as described above, is explained.

Figure 3:
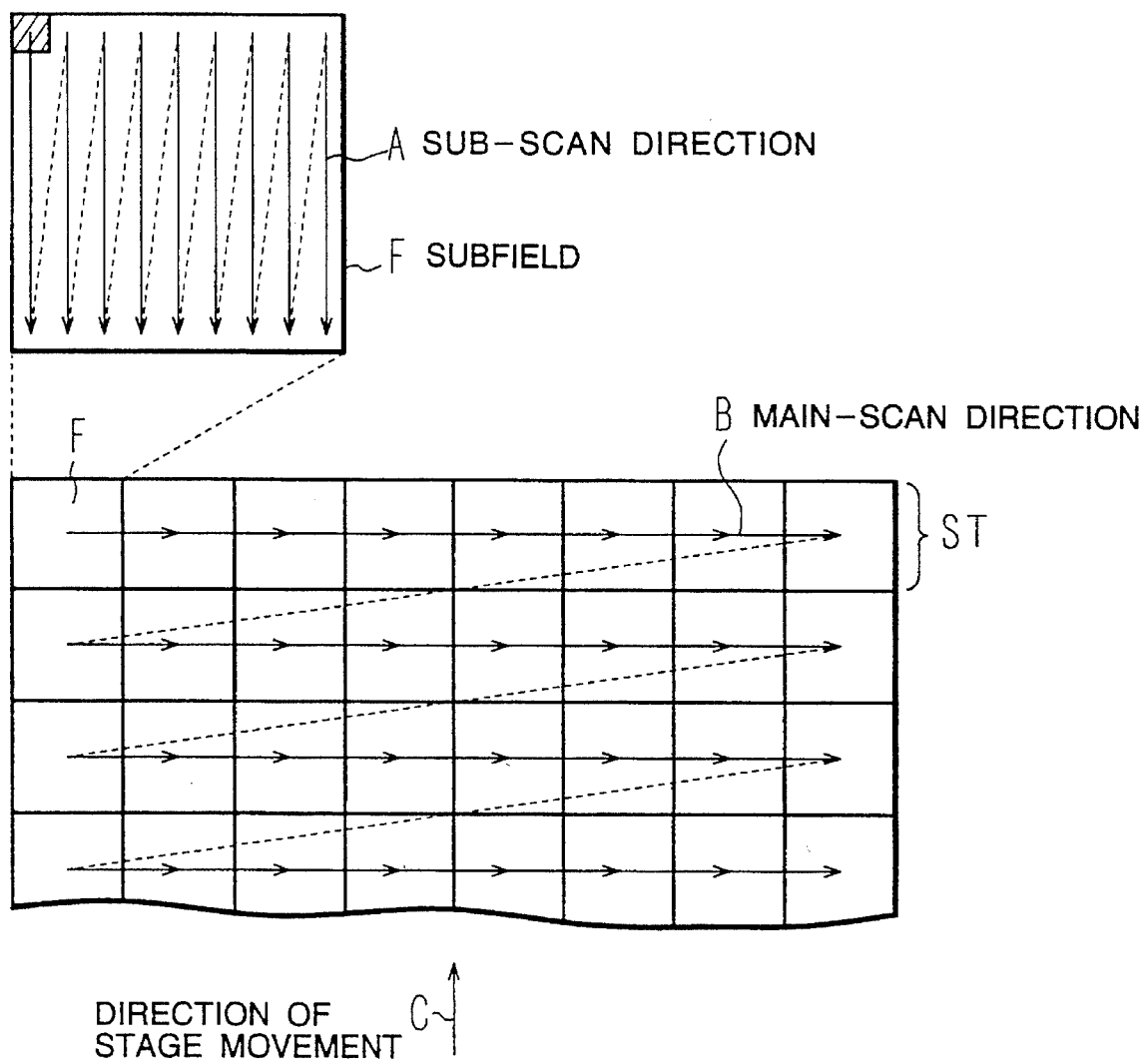
FIG. 3 illustrates the directions of electron beam scanning.
Figure 4A:
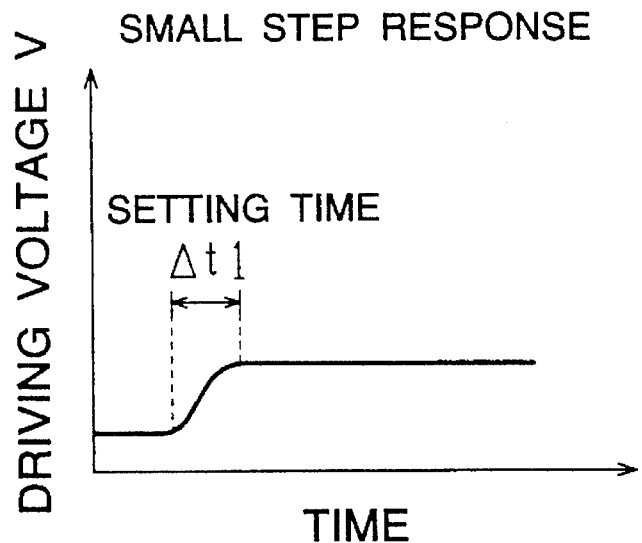
FIG. 4A is a waveform diagram showing a small step response of the sub deflector drive voltage in the prior art.
Figure 4B:
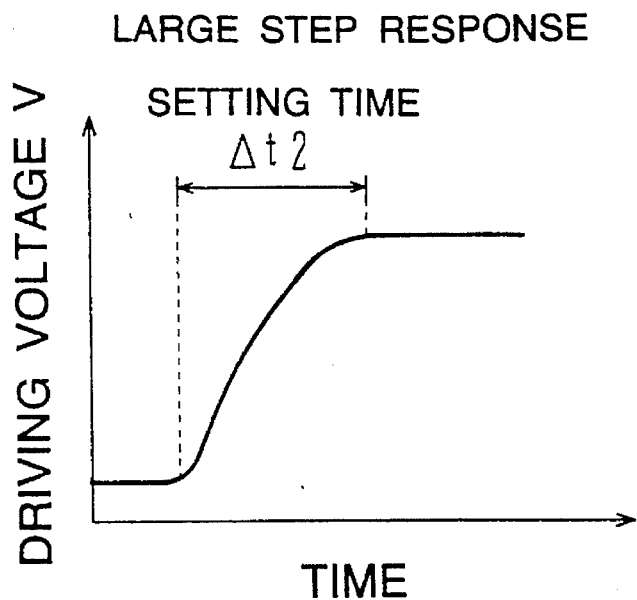
FIG. 4B is a waveform diagram showing a large step response of the sub deflector drive voltage in the prior art.
Figure 5A:
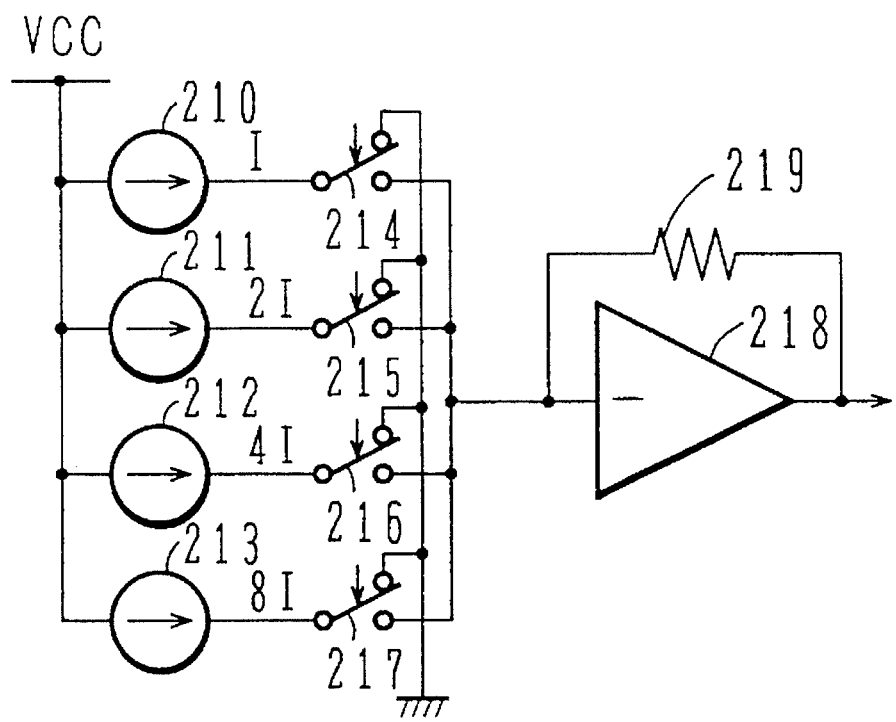
FIG. 5A is a circuit diagram of a D/A converter.
Figure 5B:
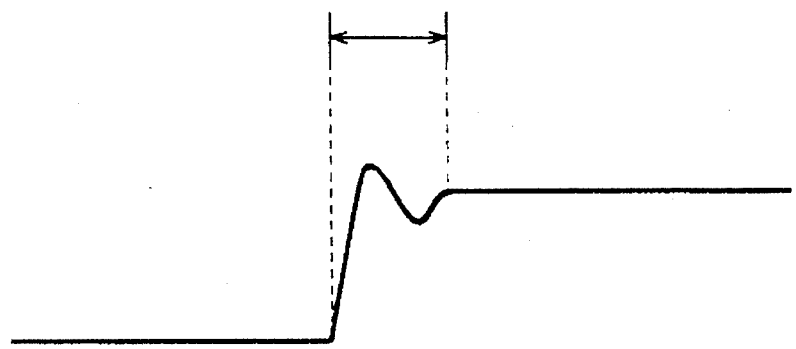
FIG. 5B is a diagram of the waveform that is output when the input value is changed in the circuit shown in FIG. 5A.

The initial value of the count value i on the counter 35 is 1. The count value i changes from 1 through n with the clock CLK. The output of the amplifying circuit 32, for example, increases in small steps and the electron beam EB is scanned in direction A, for example, as shown in FIG. 3. While the count value i is within the range of 1 to n, the control signal C0 is at the logical value "0" and the switching element SW0 is OFF, setting the resistance value of the variable resistor 33A at R1.

A CR integrating circuit i.e., a low pass filter, is constituted with the electrostatic capacity of the resistor RY and the sub deflector 30 and the high frequency oscillating component that is included in the drive voltage V is removed. As a result, the drive voltage V changes as indicated by the solid line in FIG. 15A, and the setting time $\Delta t5$ becomes shorter than the setting time $\Delta t3$, which is the setting time when the switching element SW0 is turned ON. A similar result is achieved even when a variable resistor 23 is connected to the main deflector 20 as in FIG. 13, since a low pass filter is constituted with a resistor connected to an electromagnetic deflector in series.

When the count value i changes from n to 0, the output of the amplifying circuit 32 decreases in a large step and the scanning in direction A shown in FIG. 3 is swung back from the trailing end to the leading end. During this large step change, the switching element SW0 is turned ON and the output of the amplifying circuit 32 is supplied directly to the sub deflector 30. This achieves a shorter setting time $\Delta t4$ during the large step change than that in the prior art.

Figure 1:
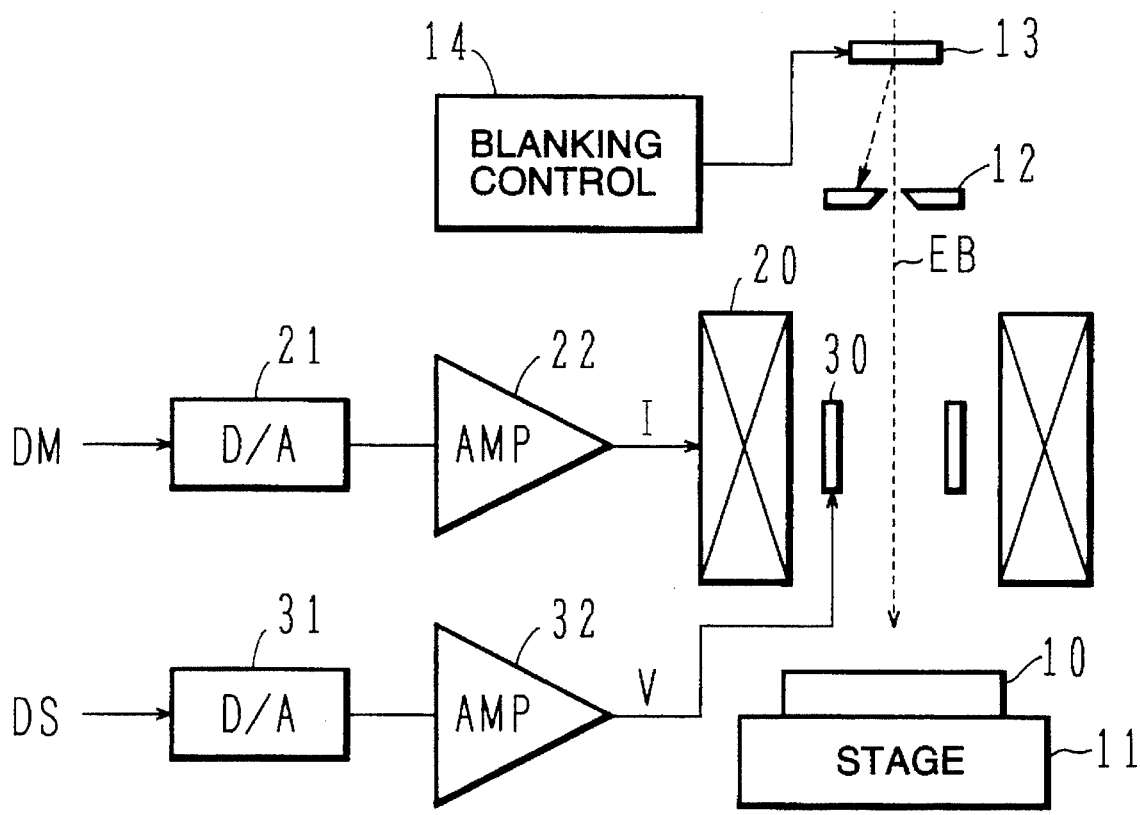
FIG. 1 is a block diagram of the parts of a charged particle beam exposure system in the prior art.
Figure 16A:
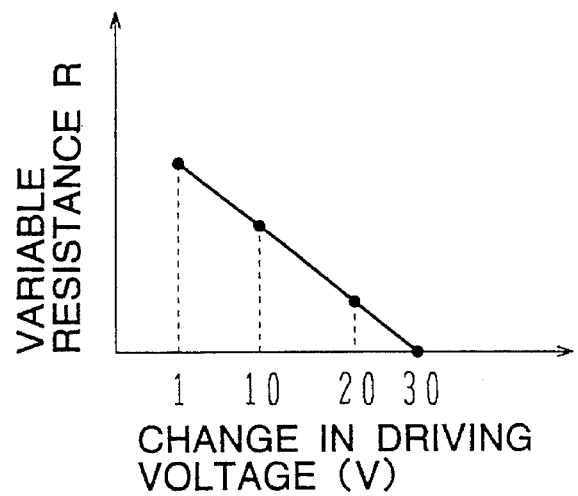
FIG. 16A is a chart that shows the relationship between the quantity of change in the sub deflector drive voltage and the variable resistance value.
Figure 16B:
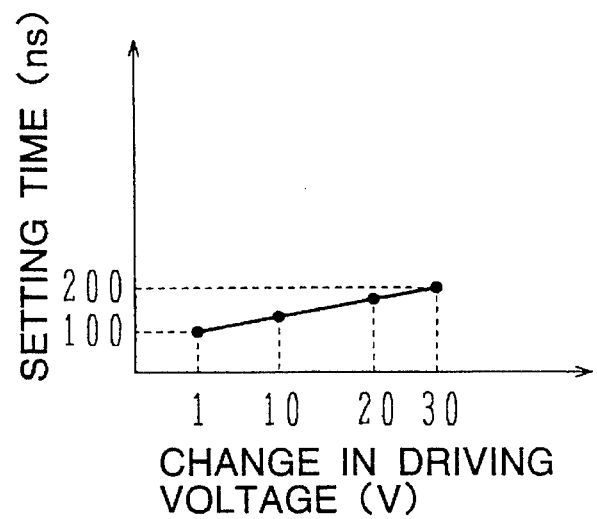
FIG. 16B is a chart that shows the relationship between the quantity or change in the sub deflector drive voltage and the setting time in the present invention.
Figure 16C:
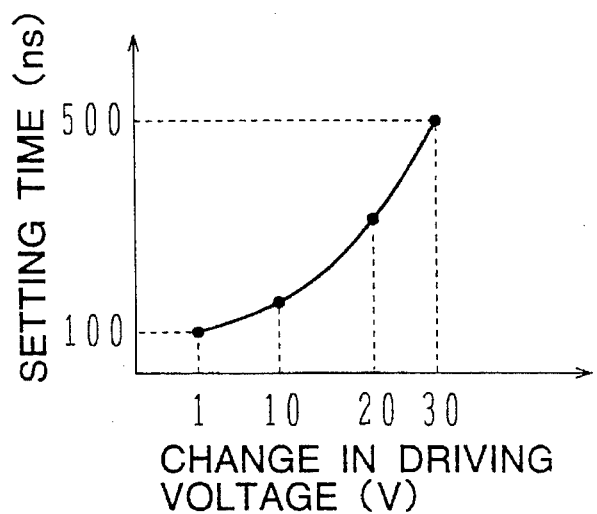
FIG. 16C is a chart that shows the relationship between the quantity of change in the sub deflector drive voltage and the setting time in the prior art.

The characteristics of the amplifying circuit 32 are adjusted so that the setting time $\Delta t4$ is at a minimum value of 200 ns, the resistor R1 is constituted of a continuously variable resistor and the resistance value of the resistor R1 is adjusted so that the setting time $\Delta t5$ during the small step change is at the minimum. As a result, it is possible to set the setting time $\Delta t5$ at 100 ns. FIG. 16A shows the relationship between the quantity of the step change in the deflector drive voltage V in FIG. 13 and the resistance value R of the variable resistor 33. FIG. 16B shows the setting time which corresponds to the quantity of the step change at that time. FIG. 16C shows the setting time of the drive voltage V in correspondence with the quantity of step change in the drive voltage V in the structure in the prior art that is shown in FIG. 1.

As is clear by comparing FIG. 16B with FIG. 16C, in the first embodiment according to the present invention, the setting time when the drive voltage V changes in steps is reduced, achieving an improvement in throughput of the charged particle beam exposure system.

SECOND EMBODIMENT

Figure 17:
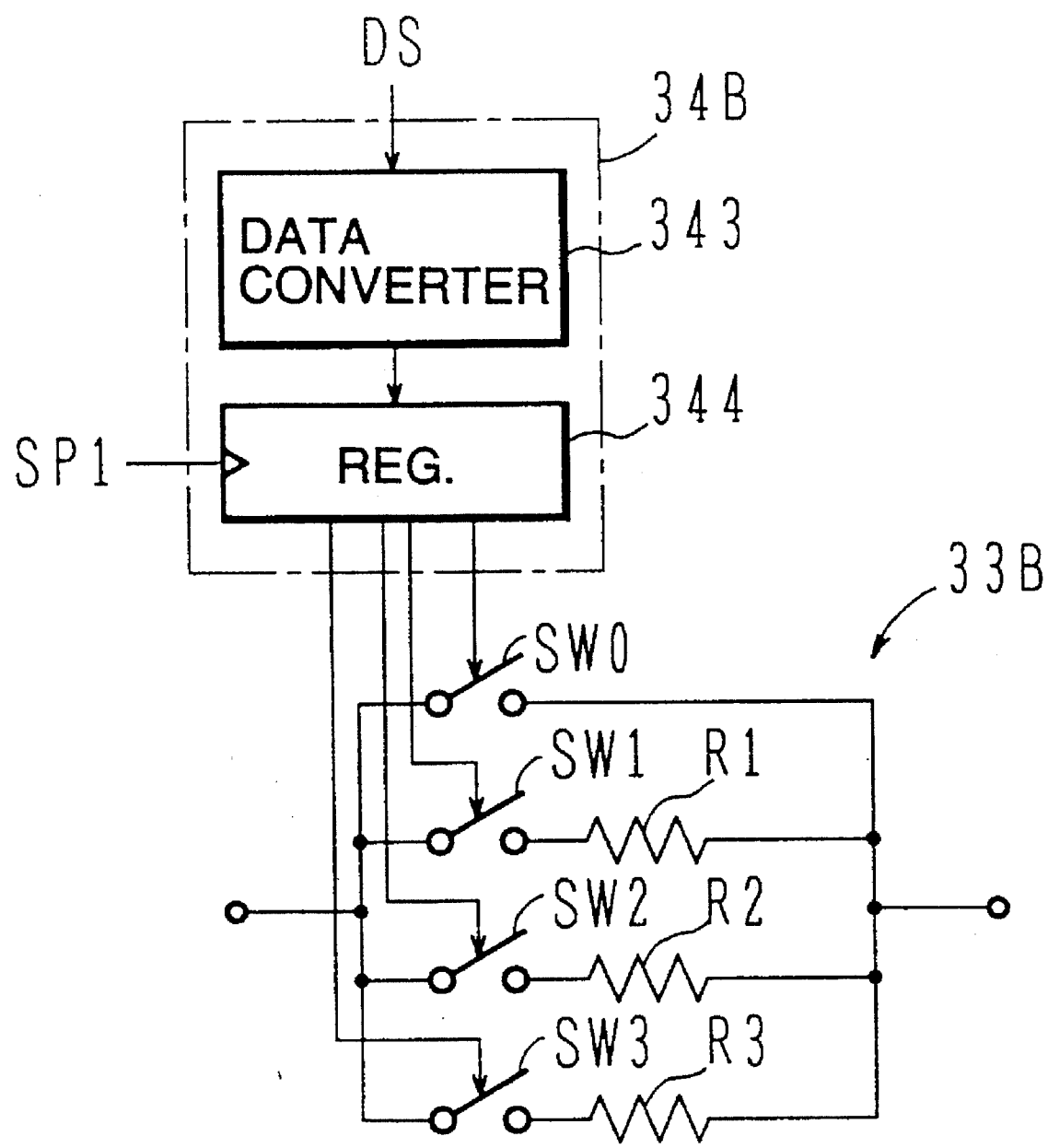
FIG. 17 shows a setting time adjusting circuit in the second embodiment according to the present invention.

FIG. 17 shows a setting time adjusting circuit in the second embodiment.

One end of each of the resistors R1 to R3 is commonly connected to the variable resistor 33B and the other ends are commonly connected via the switching elements SW0 to SW3 respectively. The resistance value of the variable resistor 33B is switched through a maximum of 14 levels by a control signal that is supplied to the control input ends of the switching elements SW0 to SW3.

In the control circuit 34B, a data input end of a resistor 344 is connected to the data output end of a data conversion circuit 343 that is constituted of, for example, ROM, and the control input ends of the switching elements SW0 to SW3 are connected to the data output end of the register 344. The sub deflection data DS are supplied to the input end of the data conversion circuit 343. These sub deflection data DS also serve as input data for the D/A converter 31, shown in FIG. 13.

When raster scanning as shown in FIG. 3 is performed, for example, the value of the next sub deflection data DS is determined uniquely based upon the current value of the sub deflection data DS. In other words, the quantity of step change is determined by the relevant sub deflection data DS.

In order to achieve a result in which the quantity of step change corresponds to the appropriate resistance value of the variable resistor 33B, the sub deflection data DS are data converted at the data conversion circuit 343 and is supplied to the register 344 where a strobe signal SP1, which is supplied to the clock input end of the register 344, rises with the timing with which the drive voltage V changes in steps so that the data are held in the register 344. The resistance value of the variable resistor 33B is switched by ON/OFF controlling the switching elements SW0 to SW3 in such a manner that the setting time will be at the minimum for that particular quantity of step change.

The second embodiment according to the present invention is particularly effective when there are three or more quantities of step change. Also, this embodiment is effective even when there are only two different quantities for step change, i.e., large and small, since it is possible to remove or reduce the glitch waveform which is included in the output of the amplifying circuit 32. In other words, in correspondence with the value of the sub deflection data DS before the change, (it also depends upon the value after the change, but this value is determined by the value before the change) a transient glitch waveform is included in the output of the D/A converter 21 during this change and it becomes possible to eliminate or reduce this glitch waveform or the remainder of the glitch waveform that cannot be eliminated by the structure (not shown), from the output of the amplifying circuit 32, by setting the resistance value of the variable resistor 33B at an appropriate value.

THIRD EMBODIMENT

Figure 18:
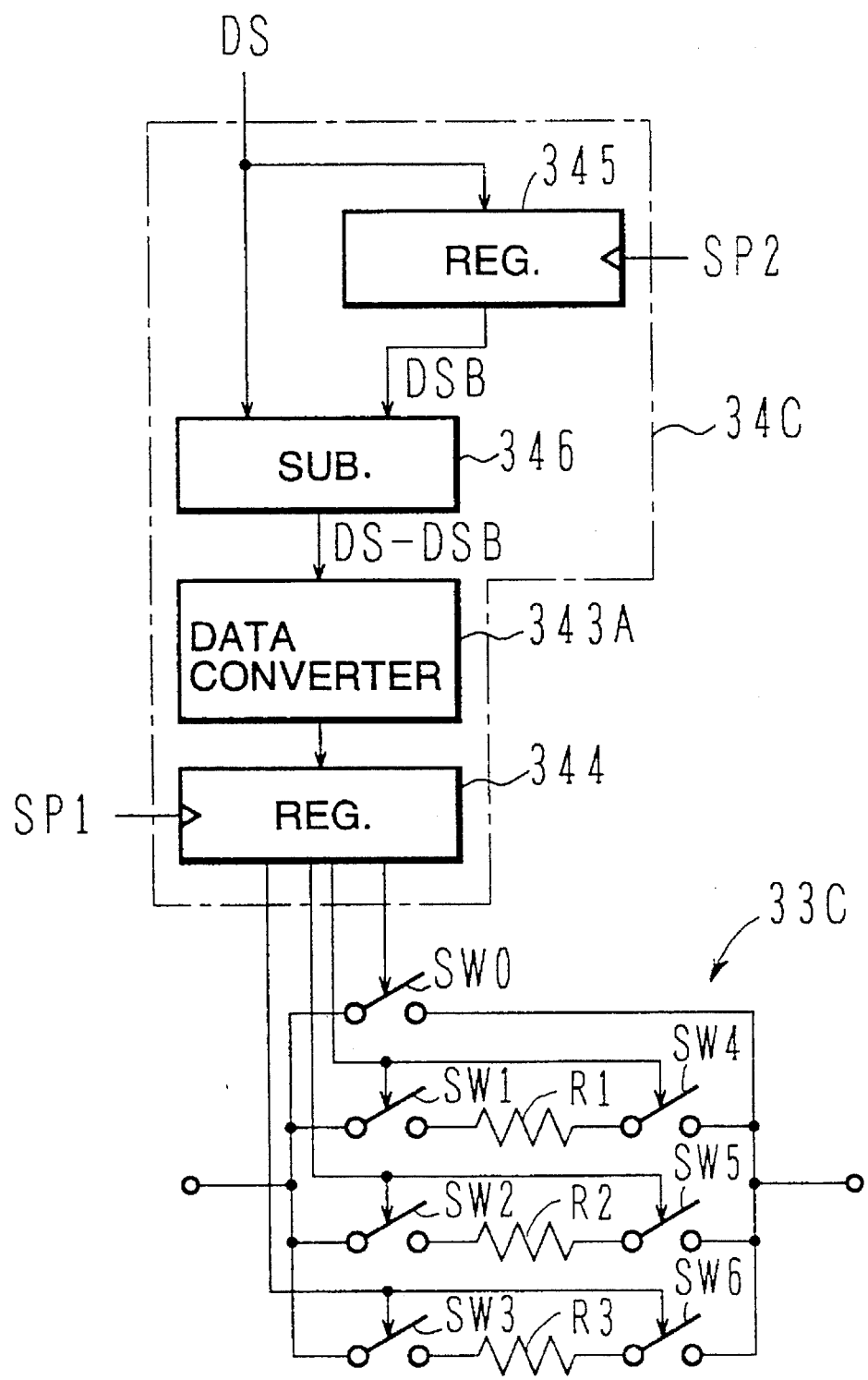
FIG. 18 shows a setting time adjusting circuit in the third embodiment according to the present invention.

FIG. 18 shows the setting time adjusting circuit in the third embodiment.

The variable resistor 33C further includes switching elements SW4 to SW6 connected to one end of each of the resistors R1 to R3 respectively in the variable resistor 33B shown in FIG. 17. The switching elements SW4 to SW6 are turned ON/OFF by interlocking with the switching elements SW1 to SW3 respectively.

In a control circuit 34C, sub deflection data DS are supplied to one of the input ends of the subtracting circuit 346 via the register 345 and the sub deflection data DS are supplied directly to another input end of the subtracting circuit 346. The output from the subtracting circuit 346 is supplied to the input circuit of a data conversion circuit 343A.

After the sub deflection data DS are held in the register 345 with the timing of a strobe signal SP2 and after the sub deflection data DS changes, a value that represents the difference between the current position of the sub deflection data DS and its previous value DSB, i.e., the value that corresponds to the quantity of step change in the drive voltage V, is supplied to the data conversion circuit 343A. When the drive voltage V changes in steps, the output from the data conversion circuit 343A is held in the register 344 with the timing of a strobe signal SP1 to switch the resistance value of the variable resistor 33B to an appropriate value.

If the delay time starting from the input end and ending at the output end of the control circuit 34C is too long, the switching timing for the variable resistor 33B can be set at the correct point in time by, for example, connecting a buffer register at the stage immediately preceding the D/A converter 31 in FIG. 13.

With the third embodiment according to the present invention, the throughput of the charged particle beam exposure system can be improved by reducing the setting time of the drive voltage V at the time of an arbitrary step change, such as in vector scanning.

In all the embodiments 1 to 3 described above, since the advantage of the present invention can be achieved when a variable resistor is coupled with a deflector to constitute a low pass filter, a variable resistor may be coupled with the inductance of an electromagnetic deflector. In general, however, a low pass filter may be constituted without variable resistors, and the advantage is obtained with any impedance means which can constitute a low pass filter when coupled with either an electrostatic type or an electromagnetic type deflector.

FOURTH EMBODIMENT

Figure 19:
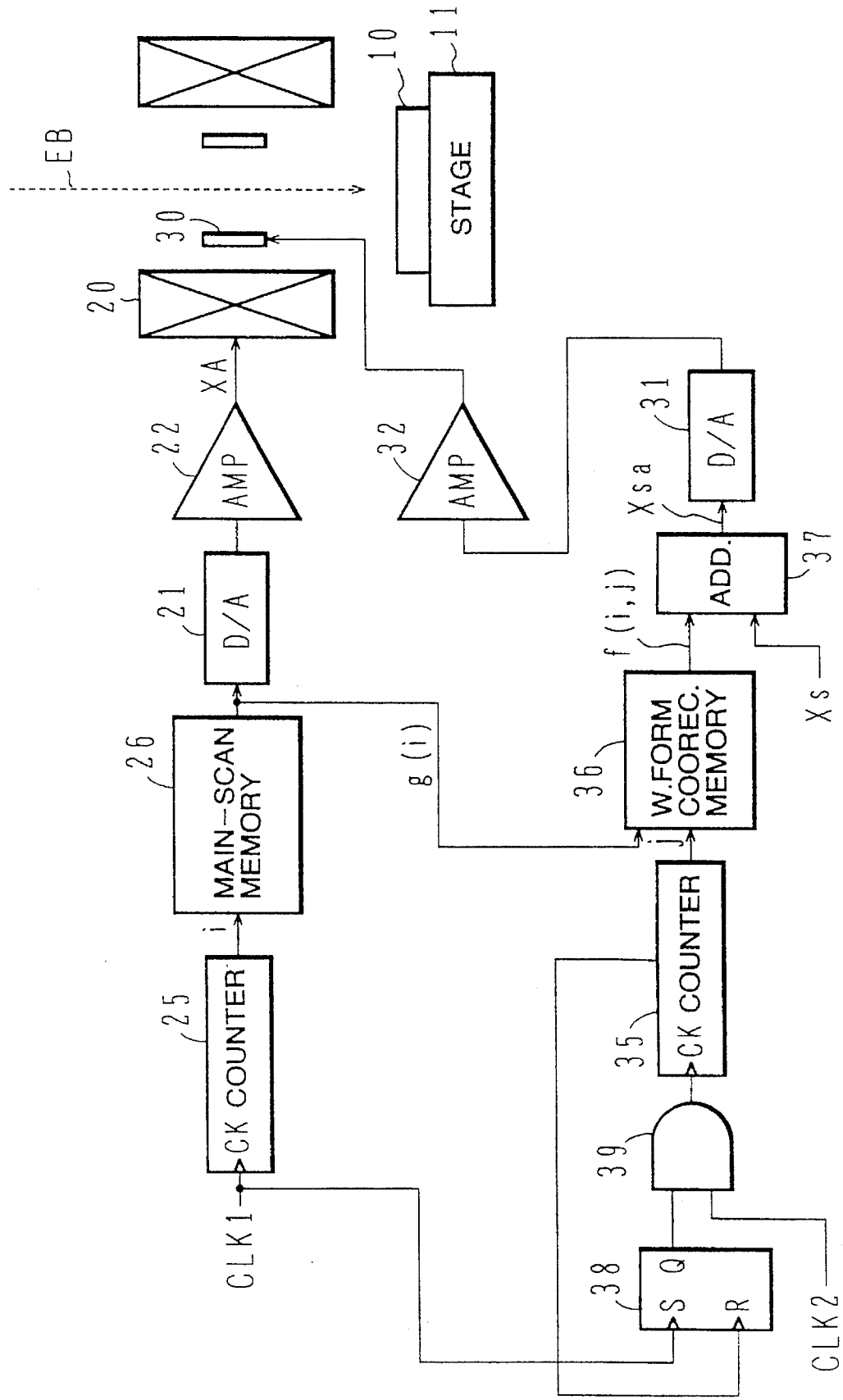
FIG. 19 is a block diagram of the parts of the charged particle beam exposure system in the fourth embodiment according to the present invention.

FIG. 19 shows the structure of the parts of the charged particle beam exposure system in the fourth embodiment. For the sake of simplification, FIG. 19 shows only the structures that are related to the removal of the transient waveform included in the output of the D/A converter 21. This also applies to FIGS. 21, 22 and 27.

Figure 20:
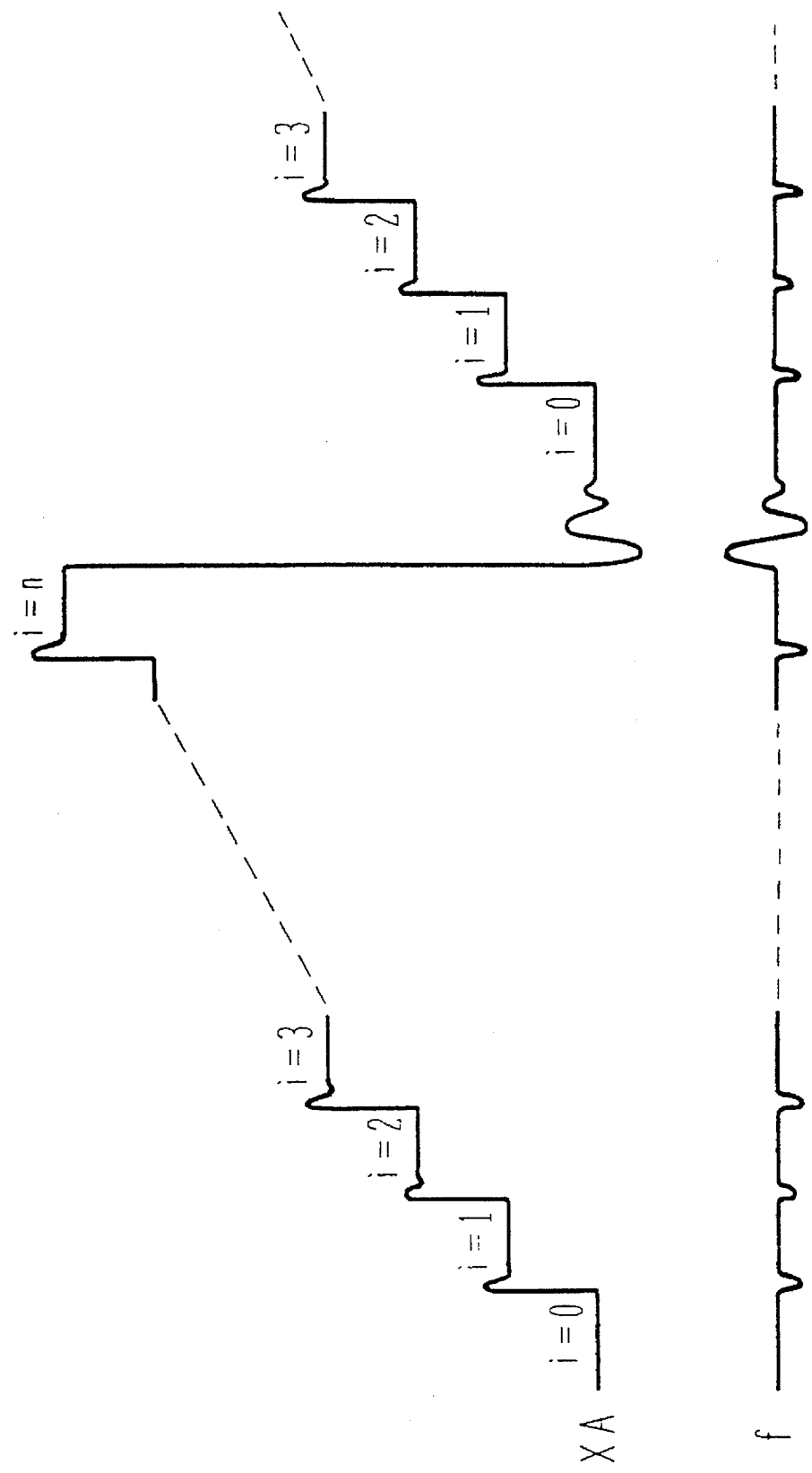
FIG. 20 shows the waveform output from the D/A converter and its correction waveform.

The clock CLK 1 is supplied to the clock input end CK of an n-ary counter 25 and is counted. Addressing is then made for the main deflector scanning memory 26 with the count value i, and the data g(i) of the deflection quantity for the main deflector which are read out from the main deflector scanning memory 26 is converted to analog by the D/A converter 21. Then it is amplified at the amplifying circuit 22 so that a drive current XA as shown in FIG. 20 is supplied to the main deflector 20.

A transient waveform that corresponds with the values before and after the change in the input of the D/A converter 21 is included in the drive current XA. The values before and after the change in the input of the D/A converter 21 are determined by the count value i on the n-ary counter 25. Hereafter, the transient waveform, which is present when the count value of the n-ary counter 25 changes from i−1 to the count value i (from n to 0 when i=n) is referred to as an i-th transient waveform. This change in the count value corresponds to the shift between the subfields F, shown in FIG. 3 and when the count value i changes from n to 0, the scanning operation returns from the end point of the scan in direction B to the starting point.

The correction waveform data f(i,j) are read out from the waveform correction memory 36 upon addressing in which the data g(i) are assigned a high order and the count value j on the m-ary counter 35 is assigned a low order. An adder 37 adds this correction waveform data 2 to a deflection signal Xs, which corresponds to the quantity of the original deflection achieved by the sub deflector 30, and then supplies the results to the D/A converter 31 as the deflection signal Xsa.

The deflection signal Xs is the signal obtained after the coordinate conversion is performed, which is to be explained later in reference to the sixth embodiment, and includes the quantity required for deflection within the subfield and the stage feedback quantity required for slaving it to the continuous movement of the mobile stage 11.

An RS flip-flop 38 is set at the rise of the clock CLK 1 which is supplied to the set input end S of the RS flip-flop 38, and its output end Q is set to high, opening an AND gate 39. With this, the clock CLK 2, passing through the AND gate 39, is supplied to the clock input end CK of the m-ary counter 35 and the data f (i,j), j=0 to m of the i-th correction waveform, which corresponds to the i-th transient waveform, are output from the waveform correction memory 36. The frequency of the clock CLK 2 is equal to or greater than m times that of the clock CLK 1.

When the count value j on the m-ary counter 35 changes from m to 0 and the carry shifts from 0 to 1, the RS flip-flop 38 is reset, and its output end Q is set to low, closing the AND gate 39. With this, the supply of the i-th correction waveform f to the adder 37 is stopped.

In this manner, in correspondence with the i-th transient waveform which is included in the drive current XA, the i-th correction waveform data f(i,j), j=0 to m are included in the deflection signal Xsa and the drive current XA and the correction waveform f are as shown in FIG. 20. Consequently, the deflection of the electron beam EB achieved by the main deflector 20 based upon the transient waveform is canceled out by the deflection achieved by the sub deflector 30 based upon the correction waveform f. As a result, the setting time due to the transient waveform is eliminated and the throughput of the electron beam EB exposure is improved.

FIFTH EMBODIMENT

Figure 21:
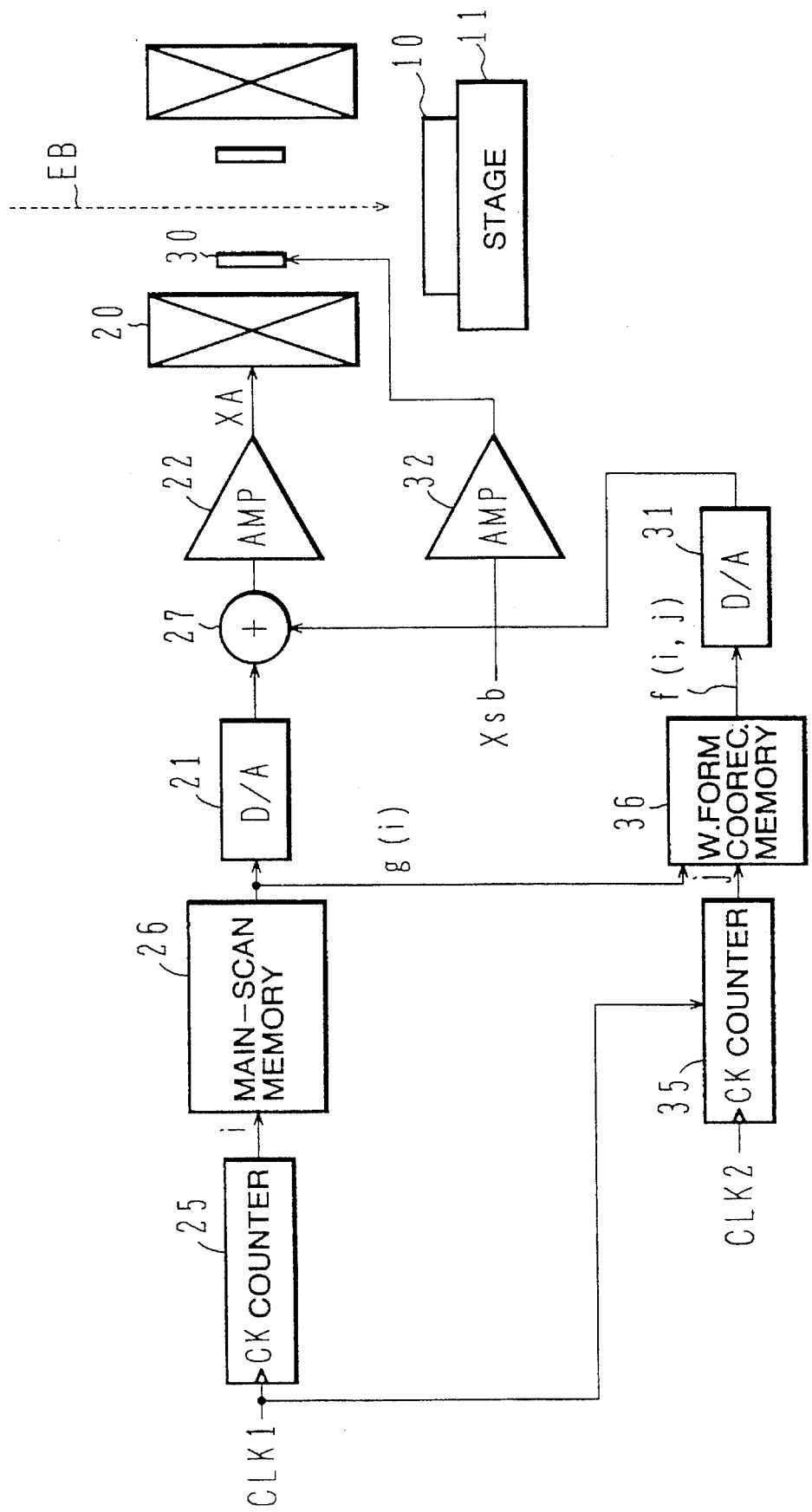
FIG. 21 is a block diagram of the parts of the charged particle beam exposure system in the fifth embodiment according to the present invention.

FIG. 21 shows the structure of the parts of the charged particle beam exposure system in the fifth embodiment. While the system shown in FIG. 19 executes correction for the transient waveform that is included in the output of the D/A converter 21 with the sub deflector 30, the system shown in FIG. 21 executes this correction with the main deflector 20.

That is, after the output of the waveform correction memory 36 is converted to analog with the D/A converter 31, this converted analog signal is added to the output of the D/A converter 21 by the adder 27 and then the resulting signal is supplied to the amplifying circuit 22. An analog signal Xsb, which is equivalent to the signal Xs in FIG. 19, is supplied to the amplifying circuit 32.

The structure in this embodiment is simplified without employing the RS flip-flop 38 and the AND gate 39 shown in FIG. 19 by setting the frequency of the clock CLK 2 at a value equal to or less than m times the frequency of the clock CLK 1 and by clearing the count value i on the counter 35 to 0 with the timing of the rise of the clock CLK 1.

In the fifth embodiment according to the present invention, even when there is a positional deviation of the coordinate systems between the main deflector 20 and the sub deflector 30, there is no need to perform correction for the correction waveform to correct the positional deviation.

SIXTH EMBODIMENT

Figure 22:
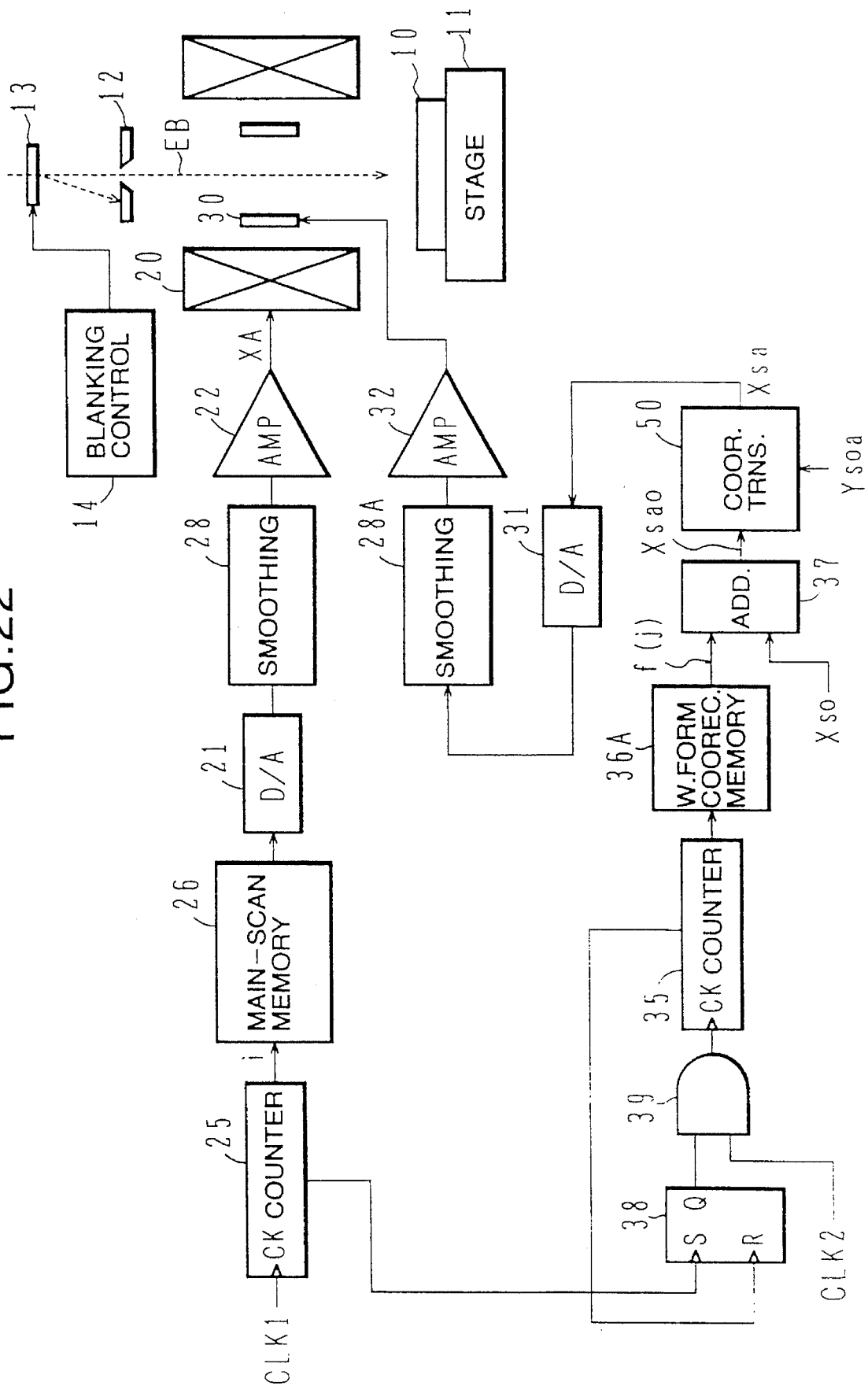
FIG. 22 is a block diagram of the parts of the charged particle beam exposure system in the sixth embodiment according to the present invention.
Figure 23:
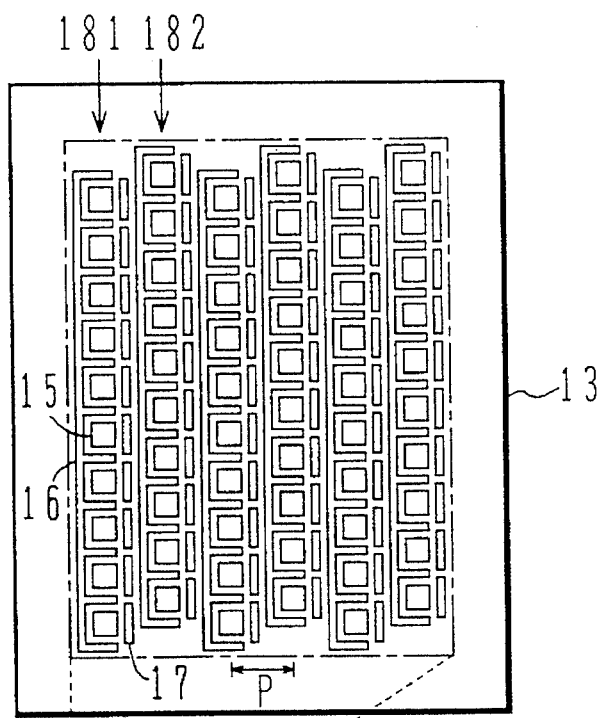
FIG. 23 is another illustration of electron beam scanning directions.
Figure 23:
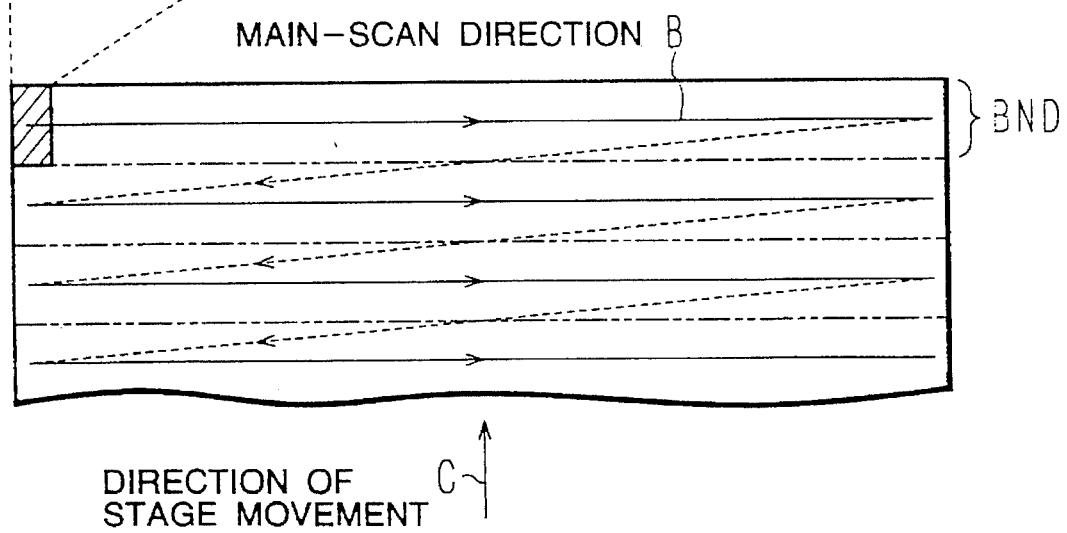

FIG. 22 shows the structure of the parts of the charged particle beam exposure system in the sixth embodiment and FIG. 23 shows another new method of EB scanning.

Figure 2:
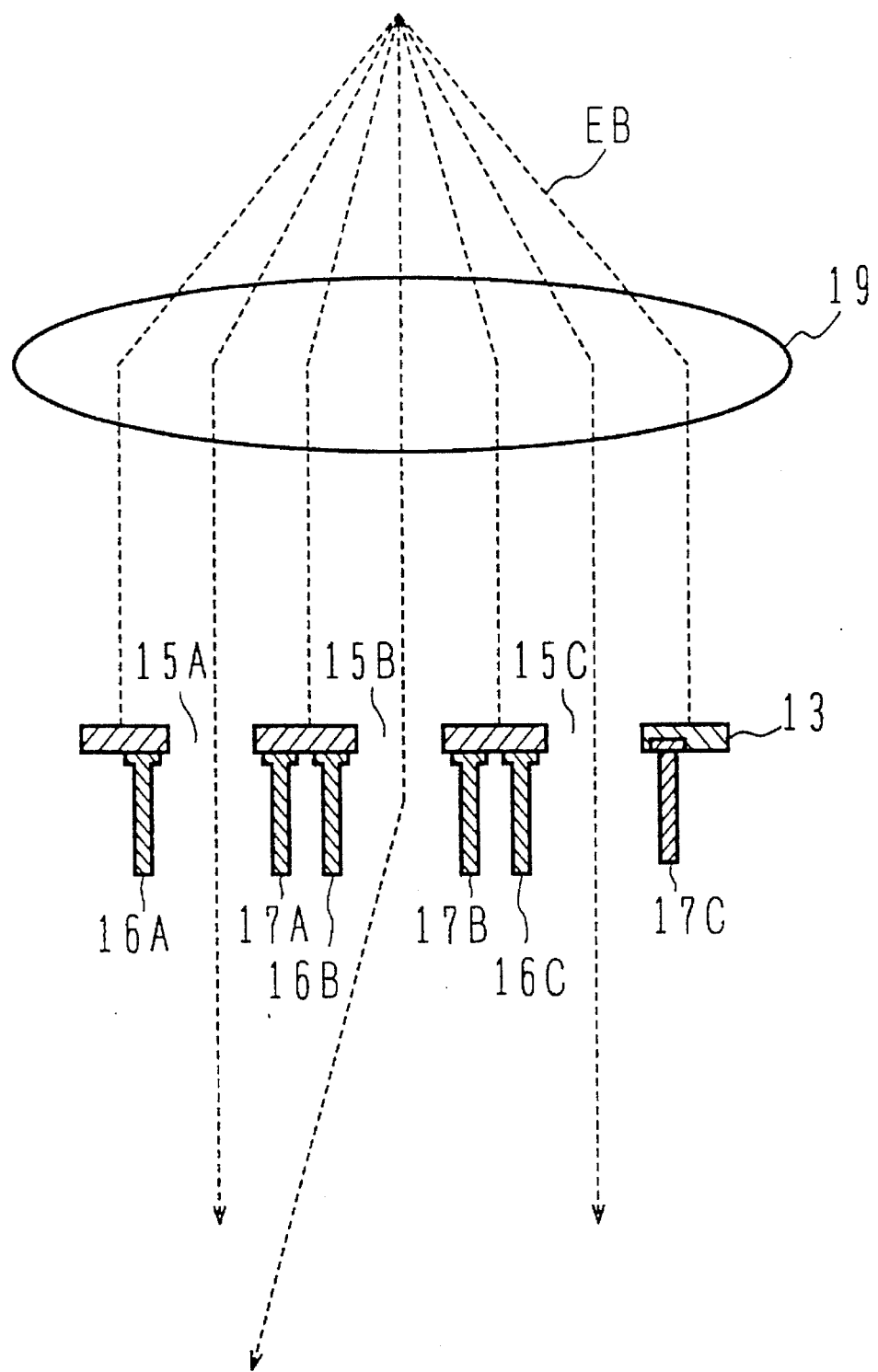
FIG. 2 illustrates the function of a blanking aperture array.

A blanking aperture array 13 has a structure which is known in the prior art and on its upper surface side, openings 15 are surrounded by common electrodes 16 and blanking electrodes 17, which are formed on the substrate as shown in FIG. 23. The lower surface side of the blanking aperture array 13 is as shown in FIG. 2. In FIG. 2, the front surface side is omitted. An electron beam EB with approximately consistent current density is projected within the area indicated with the 1-point chain line in FIG. 23 onto the blanking aperture array 13.

The openings 15 are arranged in a lattice-like manner in order to fill the gaps created in the direction of the rows of the exposure pattern (direction C) made by the EB which has passed through the openings at the fifth row 182 of the blanking aperture array 13, for instance, with the exposure pattern made by the EB which has passed through the opening at the sixth row 181 after scanning the electron beam EB in direction B by one pitch with the main deflector 20. This applies to other rows as well.

Scanning of the electron beam EB on the semiconductor wafer 10 is performed as shown in FIG. 23. That is, the electron beam EB is continuously scanned in direction B by the main deflector 20 and, at the same time, it is continuously scanned in direction C, which is perpendicular to direction B by the mobile stage 11. The length and width of the band BND may be 2 mm and 10 μm respectively, and the scanning time for one band may be 100 μs. In that case, the speed at which the mobile stage 11 moves is 10 μm/100 μs=100 mm/s. The sub deflector 30 is used to deflect the electron beam EB and conforms to the movement of the mobile stage 11 for every scanning pass performed by the main deflector 20. Its scanning width is equal to the width of the band BND, which may be, for example, 10 μm, i.e., relatively narrow.

Figure 25:
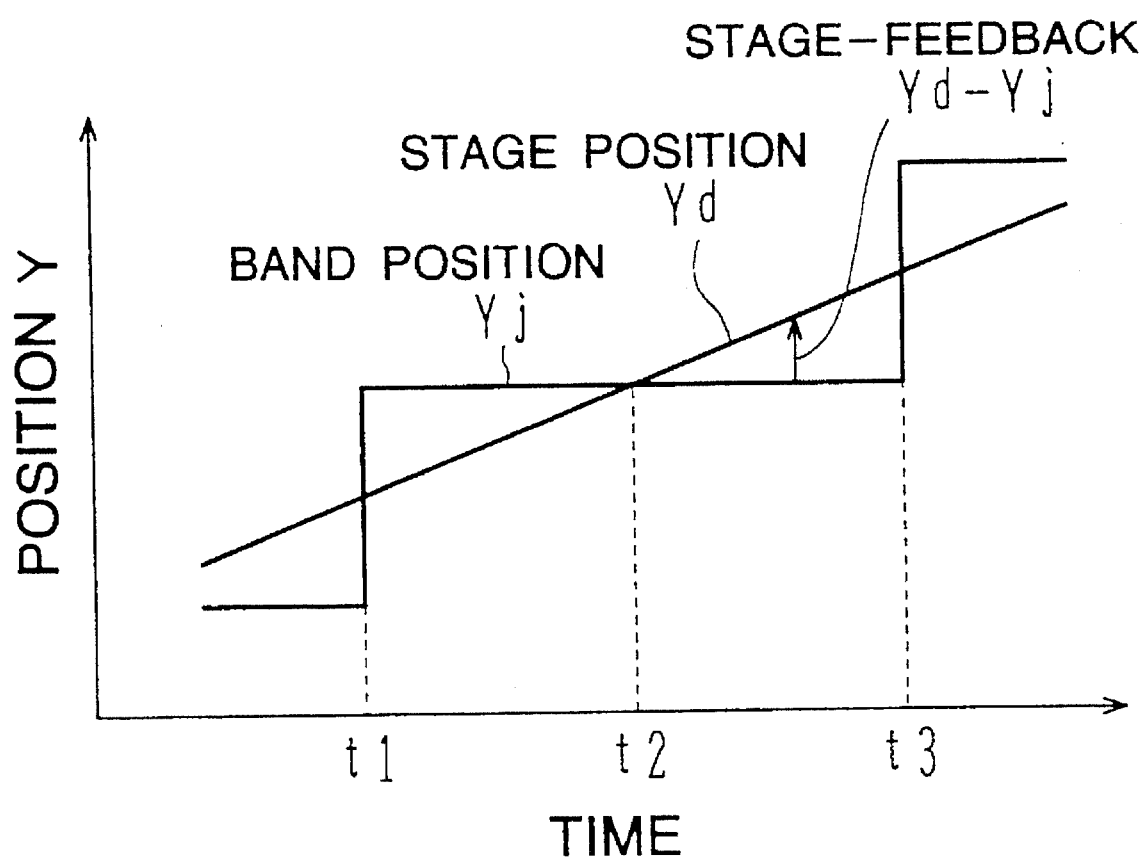
FIG. 25 is a chart showing the relationships among the stage detected position, the scanning band position, and the stage feedback quantity for the sup deflector in relation to the direction of stage movement.

FIG. 25 shows the relationships among the stage detection position Yd, the position Yj or the jth band in direction Y during scanning and the stage feedback quantity Yd–Yj for the sub deflector 30 as related to stage movement in direction Y in an ideal situation. The stage feedback quantity Yd–YJ indicates the position of the band during scanning, which corresponds to the electron beam radiation position when the amount or deflection induced by the sub deflector 30 in direction Y is 0. The time point t1 corresponds to the starting edge of jth band during scanning and the time point t3 corresponds to the finishing edge of this band. Also, at the time point t2, scanning is performed on the jth band with the quantity of deflection made by the sub deflector 30 in direction Y at 0.

Figure 24:
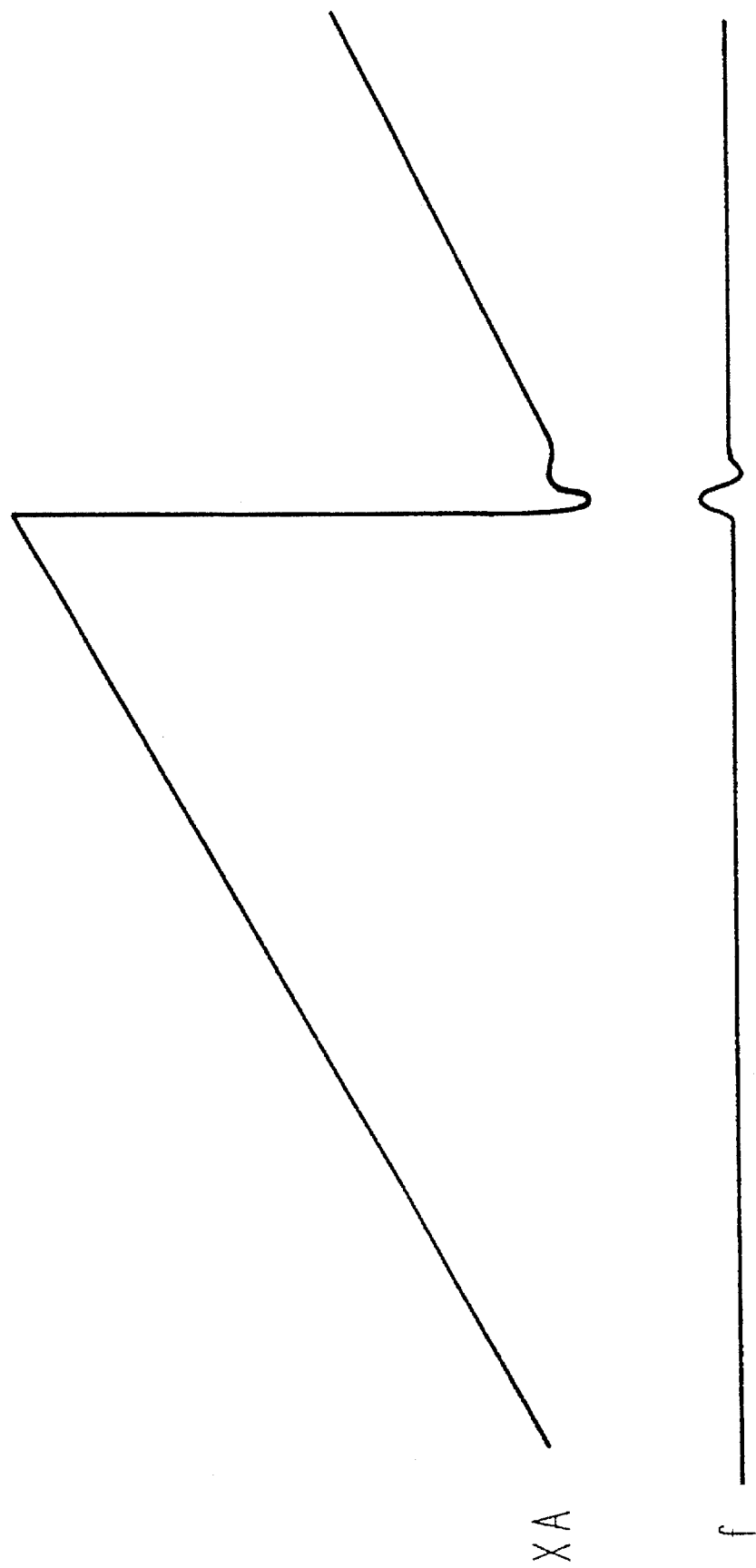
FIG. 24 shows the waveform output from the amplifying circuit 22 in FIG. 22 and its correction waveform.

In FIG. 22, since the change in the input value of the D/A converter 21 is small and the output or the D/A converter 21 is supplied to the amplifying circuit 22 via a smoothing circuit 28 constituted by, for example, a low-pass filter, the output XA of the amplifying circuit 22 continuously changes without waveform correction between the leading end and the trailing end of one scanning line made by the main deflector 0 as shown in FIG. 24, eliminating the necessity for the setting time. As a result, when the main deflector 20 swings back from the trailing edge to the leading edge of a scanning line, a transient waveform, as shown in FIG. 24, which is included in the output of the amplifying circuit 22 may be simply corrected with the waveform data stored in the waveform correction memory 36A.

When the count value i on the counter 25 changes from n to 0, i.e., when the main deflector 20 swings back from the trailing edge to the leading edge of a scanning line, the carry output of the counter 25 shifts from 0 to 1, the RS flip-flop 38 is set and the AND gate 39 is opened to supply the clock CLK 2 to the clock input end CK of the counter 35. At the beginning, the count value j on the counter 35 is cleared to 0. When the correction waveform data f (j), j=0 tom are output from the waveform correction memory 36A, the count value j on the m-ary counter 35 changes from m to 0 and its carry shifts from 0 to 1, the RS flip-flop is reset and the AND gate 39 is closed.

The correction waveform data f(j) are supplied to the adder 37 where it is added to the stage feedback quantity Xso described above and this sum, Xsoa, and a similar sum, Ysoa for the Y axis, are supplied to a coordinate conversion circuit 50.

The coordinate conversion circuit 50 corrects the positional error, the difference in deflection sensitivity between the direction of the X axis and the direction of Y axis and the like of the sub deflector 30. The output Xsa of the coordinate conversion circuit 50 may be, for instance, Xsa=gXsoa+rYsoa+o. Here, g, r and o are constants. After the analog conversion at the D/A converter 31, Xsa is supplied to the smoothing circuit 28A to be smoothed.

In this manner, in correspondence with the transient waveform which is included in the drive current XA, the correction waveform data f (j), j=0 to m are included in the deflection signal Xsa. The drive current XA and the correction waveform f are as shown in FIG. 24. Consequently, the deflection of the electron beam EB by the main deflector 20 based upon the transient waveform is canceled out with the deflection by the sub deflector 30 based upon the correction waveform f. As a result, the setting time necessitated by the transient waveform is eliminated and the throughput of the exposure by the electron beam is improved.

Figure 26:
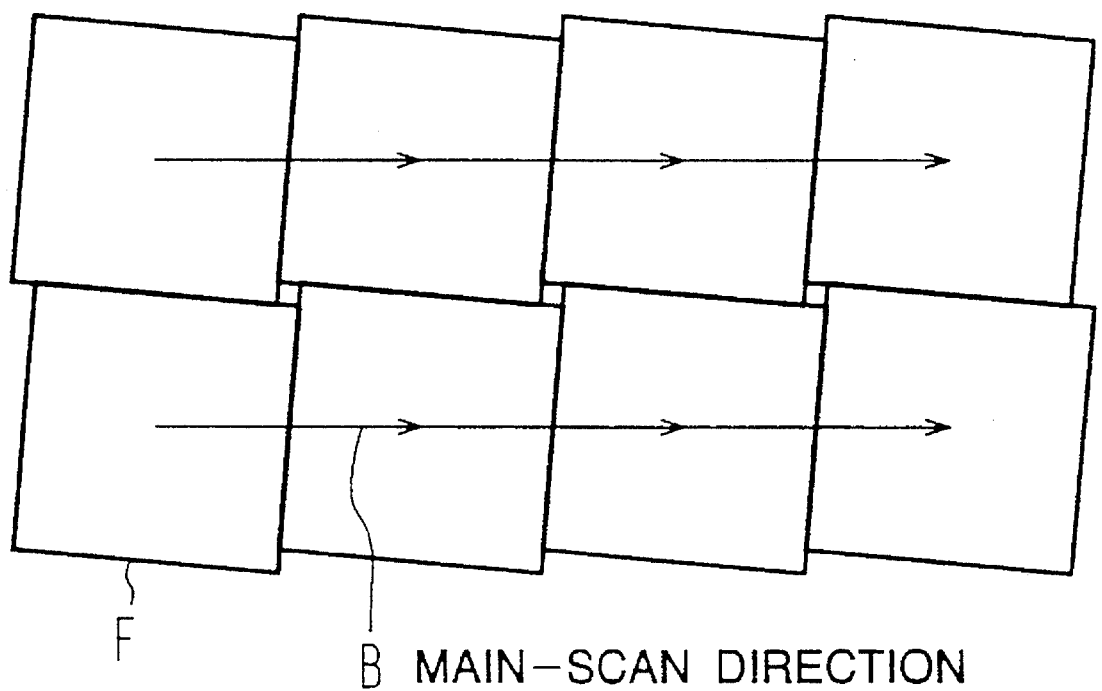
FIG. 26 illustrates the problems that the fourth embodiment presents.

Moreover, in the fourth embodiment described earlier, there is a likelihood of a connecting positional deviation occurring between the subfields F as shown in FIG. 26 if the scanning method in the prior art shown in FIG. 3 is employed, due to a positional deviation in the direction of deflection between the main deflector 20 and the sub deflector 30 (positional deviation in the X-Y deflection coordinate system) and an error in the deflection sensitivity (deflection intensity relative to the input of the deflector). This connecting positional deviation increases in proportion to the length of each side of the subfields F. However, if the continuous scanning method in the sixth embodiment according to the present invention is employed, this problem does not arise.

Furthermore, since a sawtooth waveform is generated by the counter 25, the main deflector scanning memory 26, the D/A converter 21 and the smoothing circuit 28, the scanning speed can be adjusted more accurately and easily with the frequency of the clock CLK 1 in comparison with that in an analog sawtooth wave generating circuit which employs a time constant circuit. At the same time, it is possible to prevent changes in the scanning speed caused by changes in the ambient temperature and changes occurring over time as in an analog sawtooth wave generating circuit.

In addition, the positional accuracy of the radiation of the electron beam EB on the semiconductor wafer 10 changes in inverse proportion to the width of scanning performed by the deflector, and since the width of scanning performed by the sub deflector 30 is relatively small, for example, 10 μm as mentioned earlier, the positional accuracy in the electron beam radiation improves in the direction of sub deflection. Also, as the scanning width is small, it becomes possible to use the D/A converter 31, which is both fast and highly accurate with a small number of bits. Consequently, it becomes possible to perform high-speed, high-accuracy scanning of the electron beam EB with the sub deflector 30.

A coordinate conversion circuit similar to the one described above for correcting positional error of the main deflector 30, the difference in deflection sensitivity in the direction of the X axis and the Y axis and the like, is connected, for instance, between the D/A converter 21 and the smoothing circuit 28. However, in FIG. 22, this is omitted for the purpose of simplification. It is the same in FIGS. 19, 21 and 27.

SEVENTH EMBODIMENT

Figure 27:
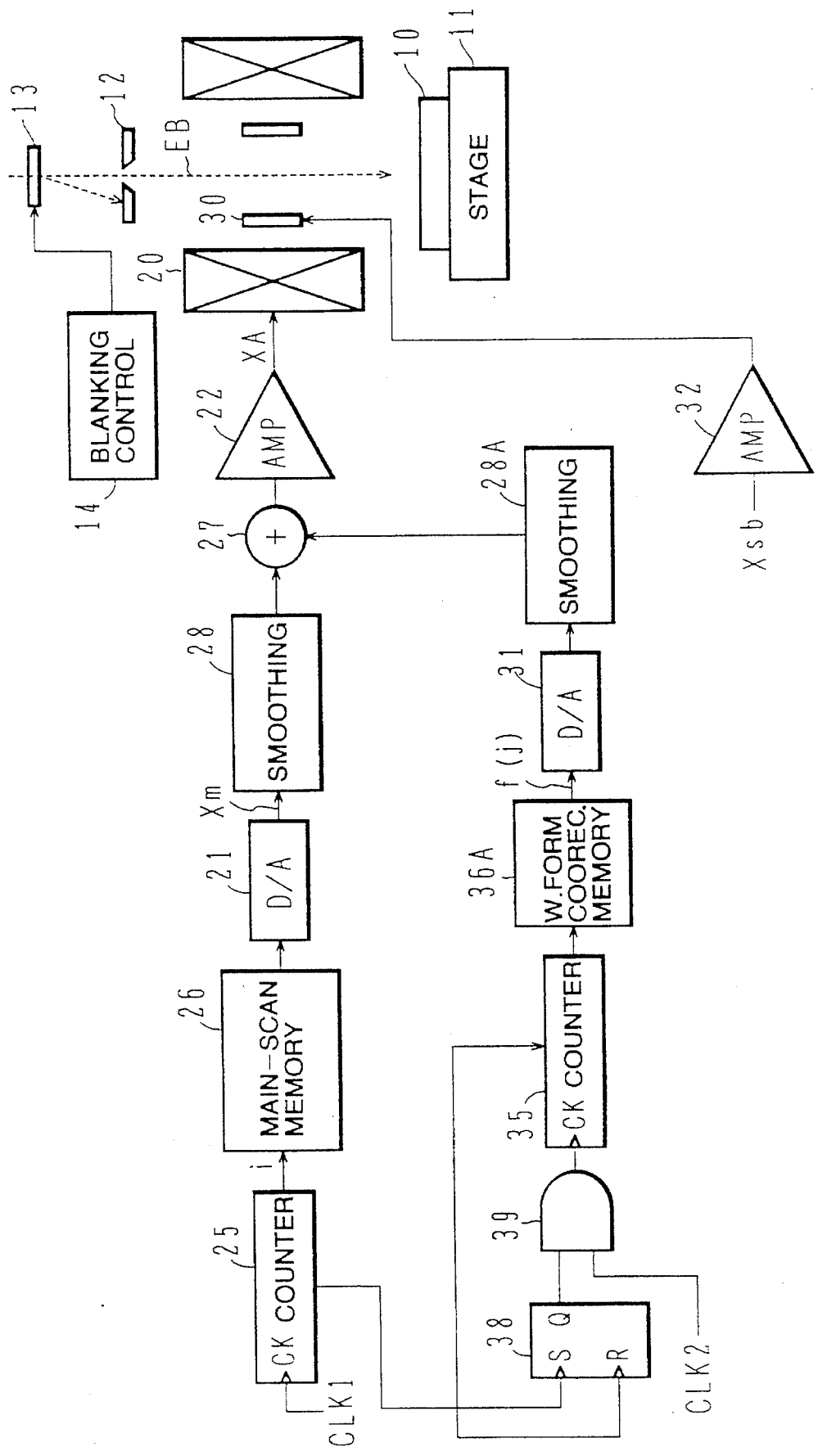
FIG. 27 is a block diagram of the parts of the charged particle beam exposure system in the seventh embodiment according to the present invention.

FIG. 27 shows the structure of the parts of the charged particle beam exposure system in the seventh embodiment. This seventh embodiment is an example of a variation of the sixth embodiment and is to the sixth embodiment what the fifth embodiment is to the fourth embodiment.

In short, the output of the waveform correction memory 36A, which is converted to analog at the D/A converter 31, passes through the smoothing circuit 28A and is then added to the output of the smoothing circuit 28 by the adder 27 to be supplied to the amplifying circuit 22. Then an analog signal Xsb, which is equivalent to the Xsa obtained when f(j)=0 in FIG. 22, is supplied to the amplifying circuit 32.

The present invention in relation to the fourth to seventh embodiments described above, includes a number of variations.

For example, in order to facilitate the generation of correction waveform data, the present invention may take a structure in which data for correcting a transient waveform based upon the characteristics of either the D/A converter 21 or the amplifying circuit 22 is stored in the waveform correction memory 36 and the transient waveform based upon the characteristics of the other is corrected with another method.

There has been no discussion of the transient waveform which is included in the output of the amplifying circuit 32, but the present invention may take a structure in which this transient waveform is corrected by employing another method or it may take a structure in which it is corrected by changing the data stored in the waveform correction memory 36.

Additionally, the present invention may take a structure in which the count value i is supplied as the high order address in the waveform correction memory, since the output g(i) of the main deflector scanning memory 26 is determined by the input i.

Moreover, the present invention may take a structure in which the output of the counter 25 is supplied to the D/A converter 21 without using a main deflector scanning memory 26.

EIGHTH EMBODIMENT

Figure 28:
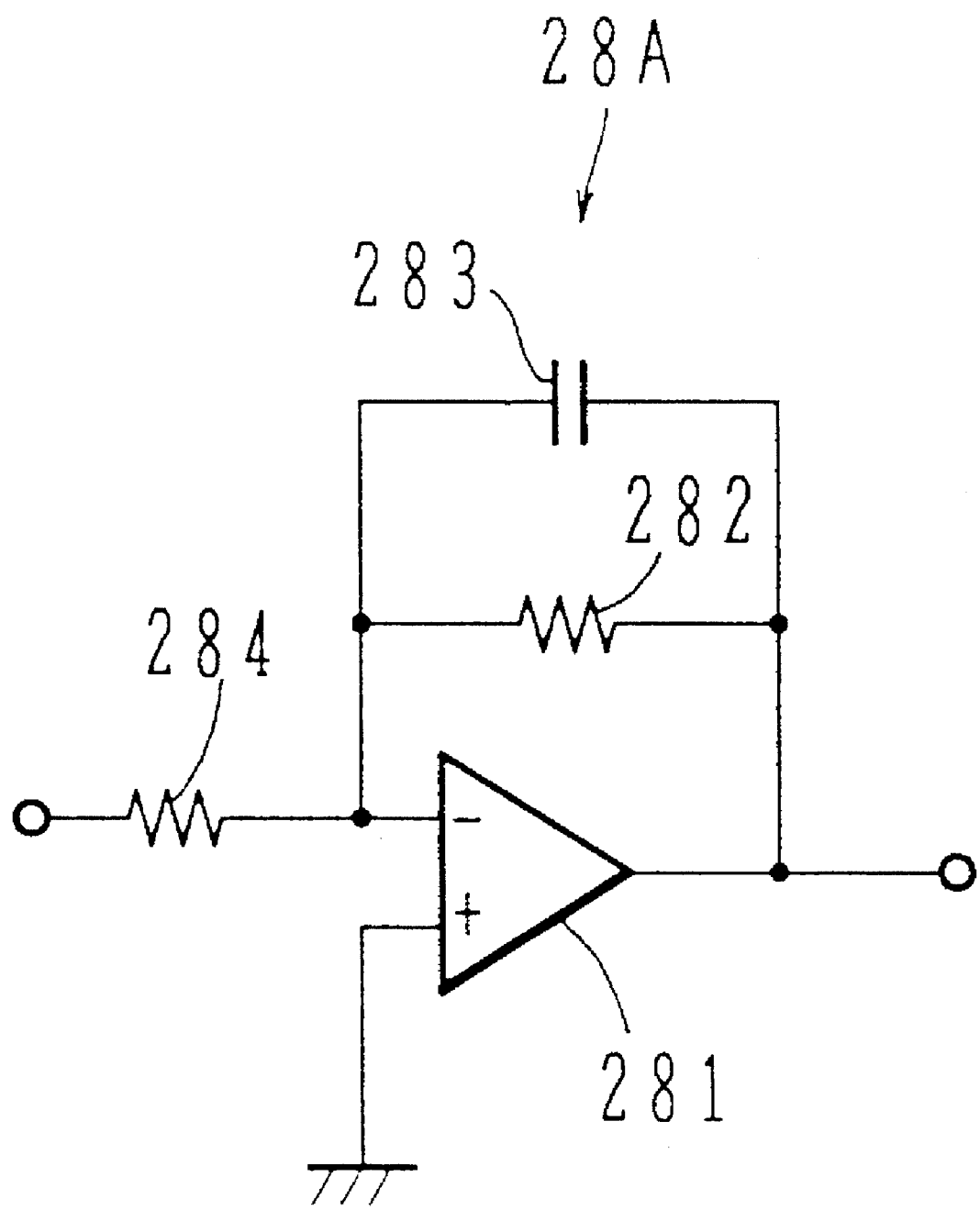
FIG. 28 shows a smoothing circuit in the eighth embodiment according to the present invention.

FIG. 28 shows the smoothing circuit 28A used in FIG. 22. An identical structure to that in the circuit 28A may be employed for the smoothing circuit 28 except for its circuit constant.

This circuit 28A itself is of the known art, in which the resistor 282 and the capacitor 283 are connected in parallel between the inverted input end and the output end of the operational amplifying circuit 281. One end of the resistor 284 is connected to the inverted input end while the non inverted input end of the operational amplifying circuit 281 is connected to the ground line.

The amplification factor is determined based upon the ratio of the resistance values of the resistor 282 and the resistor 284. The time constant, is the product of the resistance value of the resistor 282 and the capacity of the capacitor 283.

NINTH EMBODIMENT

Figure 29:
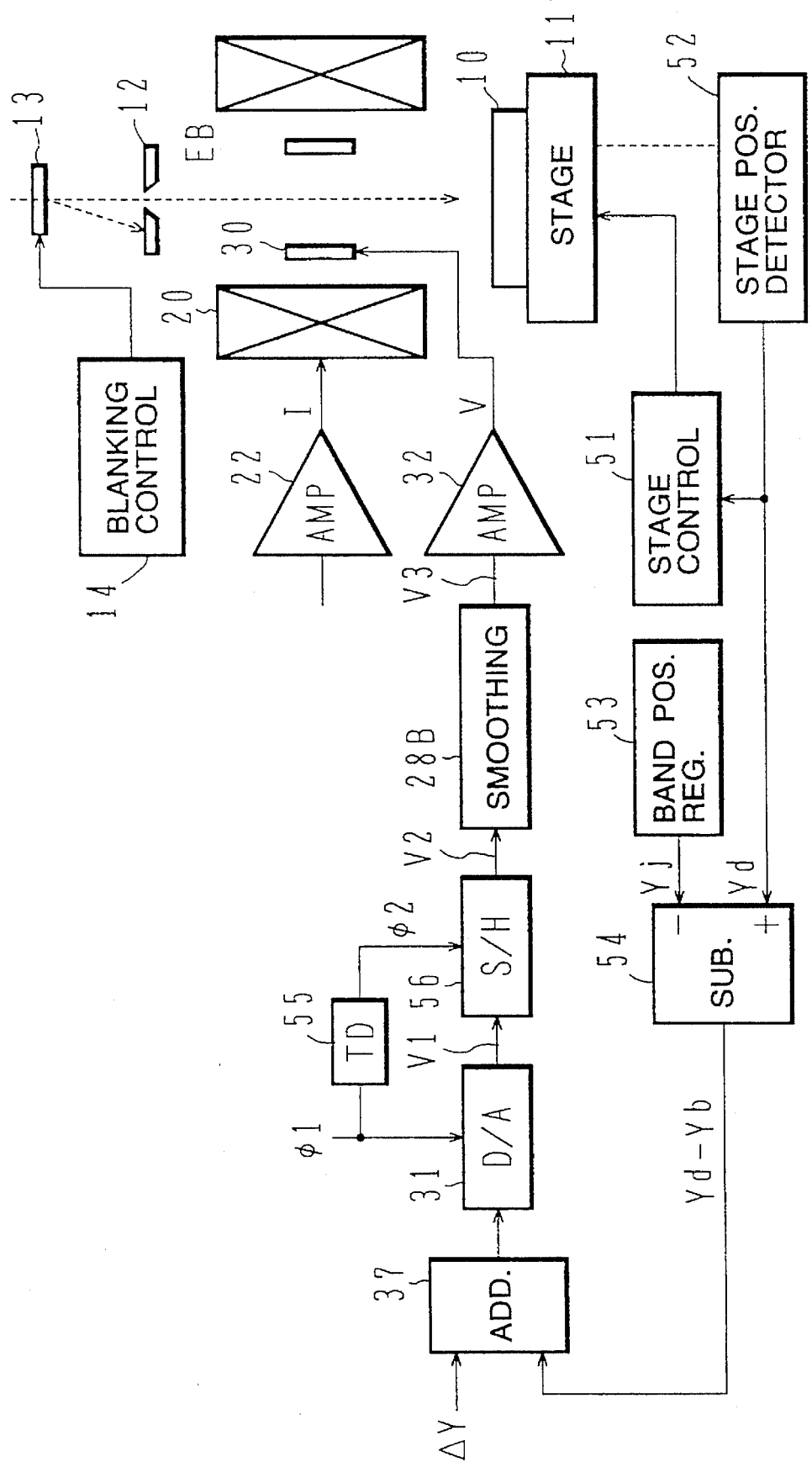
FIG. 29 is block diagram of the parts of the charged particle beam exposure system in the ninth embodiment according to the present invention.

FIG. 29 shows the structure of the parts of a charged particle beam exposure system.

The movement of the mobile stage 11 is controlled by the stage control circuit 51 and the position of the mobile stage 11 is detected by the stage position detector 52, which is a laser interferometric measuring device. In order to continuously expose the fine pattern with the scanning method illustrated in FIG. 23, a high-accuracy laser interferometric measuring device is required. However, when a high-accuracy laser interferometric measuring device is used, the following problem arises:

Laser interferometers which are commercially available include the type with which the gauge accuracy is fixed at $\lambda/120$ and the type with a high gauge accuracy with which the accuracy can be selected among $\lambda/512$, $\lambda/1024$ and $\lambda/2048$ with a program. The $\lambda$ here indicates the wavelength of the laser light and it may be, for instance, 0.63 µm.

The type with the fixed gauge accuracy of $\lambda/120$ is a pulse output type and outputs one pulse every time the stage moves 0.63/120 µm=0.0053 µm. These output pulses are counted by a counter and the difference between the count value and a specific value is used as a digital stage feedback quantity. The change in the stage feedback quantity for one pulse is one and it does not depend upon the speed at which the stage moves. Because of this, the digital stage feedback quantity is converted to analog with a D/A converter and then smoothed by the low-pass filter to interpolate the stage feedback quantity between pulses.

In contrast, the type with which the gauge accuracy can be selected in software is a parallel data output type in which the updating frequency for the output data can be set. However, even the shortest frequency is still relatively long at 1/10 MHz=100 ns. For instance, when the gauge accuracy is set at $\lambda/1024$ and the updating frequency for the output data are set to the minimum of 1/10 MHz, and if the stage movement speed is 100 mm/s=0.01 µm/100 ns, the output of the laser interferometric measuring device is updated every time the stage has moved 0.01 µm. The difference between the output value of the laser interferometric measuring device and the specific value is used as the digital stage feedback quantity.

Because of this, the stage feedback period becomes digitally longer than that at the accuracy of $\lambda/120$ described above and the quantity of change in the digital stage feedback quantity varies in conformance to the speed at which the stage moves. Consequently, when the digital stage feedback quantity is converted to analog with the D/A converter and smoothed by the low-pass filter, the analog interpolation of the stage feedback quantity within the updating frequency 100 ns for the output of the laser interferometric measuring device becomes inaccurate and, as a result, the exposure position becomes inaccurate as well, restricting the exposure of fine patterns.

This problem can be solved by using, instead of a low-pass filter, a smoothing circuit in which the inclination of the interpolating rectilinear line is variable.

In FIG. 29, the stage detection position Yd and the output Yj of the band position register 53 are supplied to the minuend and subtrahend input ends respectively of the subtractor 54. The band position, which is read out from the memory (not shown) immediately before the start of scanning a given band, is held in the band position register 53. The output Yd−Yj of the subtractor 54 at the point in time at which scanning of a given band starts should be ideally −Yw/2. The output Yd−Yj of the subtractor 54 is supplied to one of the input ends of the adder 37 as the stage feedback quantity.

Figure 31:
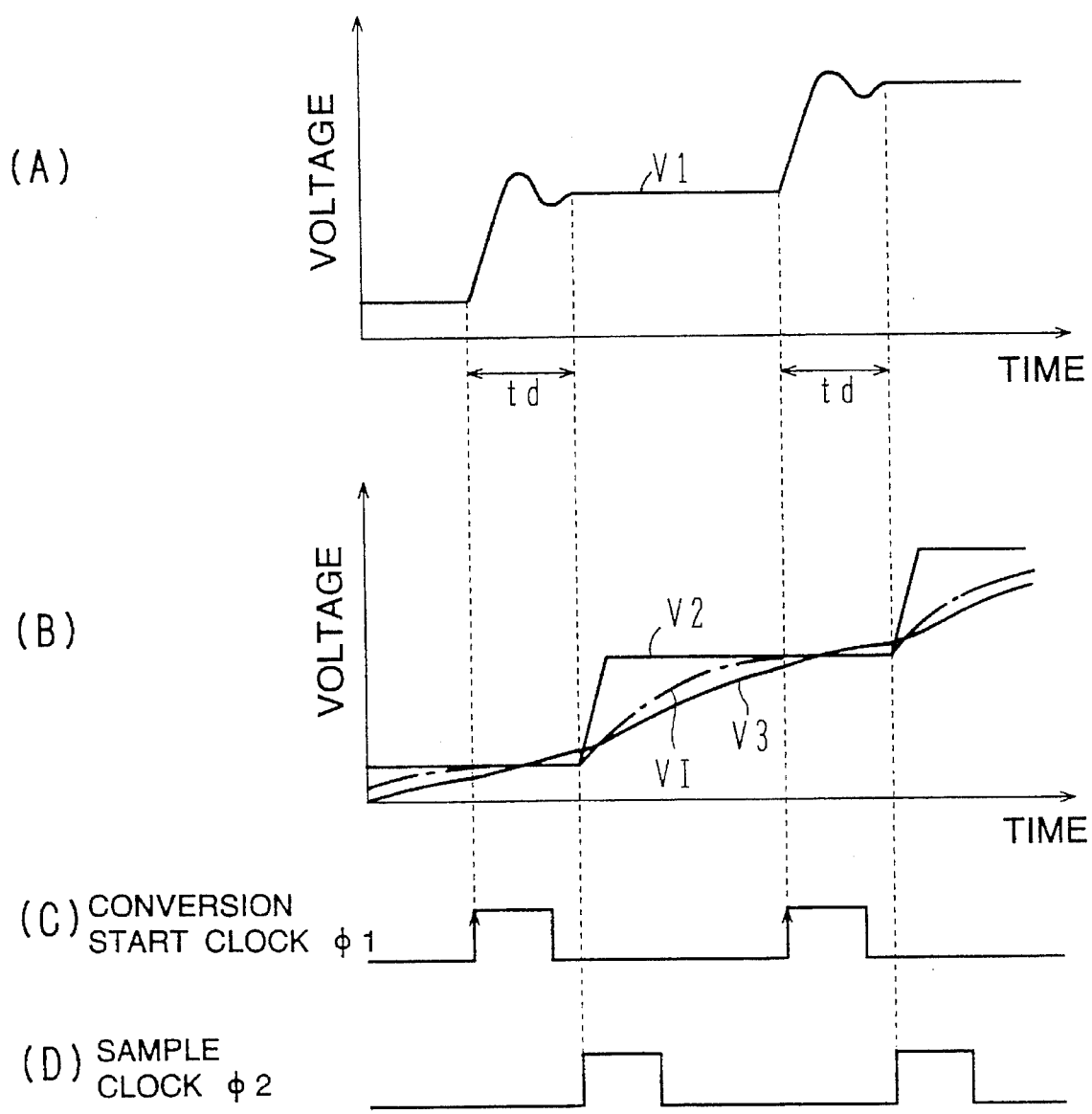
FIG. 31 is a waveform diagram of the voltages V1 to V3, VI in FIG. 30 and illustrates the relationships between these voltages and the clocks $\phi 1$, $\phi 2$.

The offset correction value ΔY, which is to be explained later, is supplied to the other input end of the adder 37. The output Yd−Yj+ΔY of the adder 37 is supplied to the D/A converter 31 and D/A conversion starts with the timing of the conversion start clock φ1, shown in FIG. 31 (C), to become the analog voltage V1. As shown in FIG. 31A, a glitch waveform is contained in the voltage V1 when it changes in steps.

The delay circuit 55 and the sample hold circuit 56 are provided in order to eliminate this glitch waveform. The conversion start clock φ1 is delayed by a specific length of time td, which may be, for example, the maximum value of the setting time at the time of step change, by the delay circuit 55 and is then supplied to the control input end of the sample hold circuit 56 as the sample clock φ2.

Figure 30:
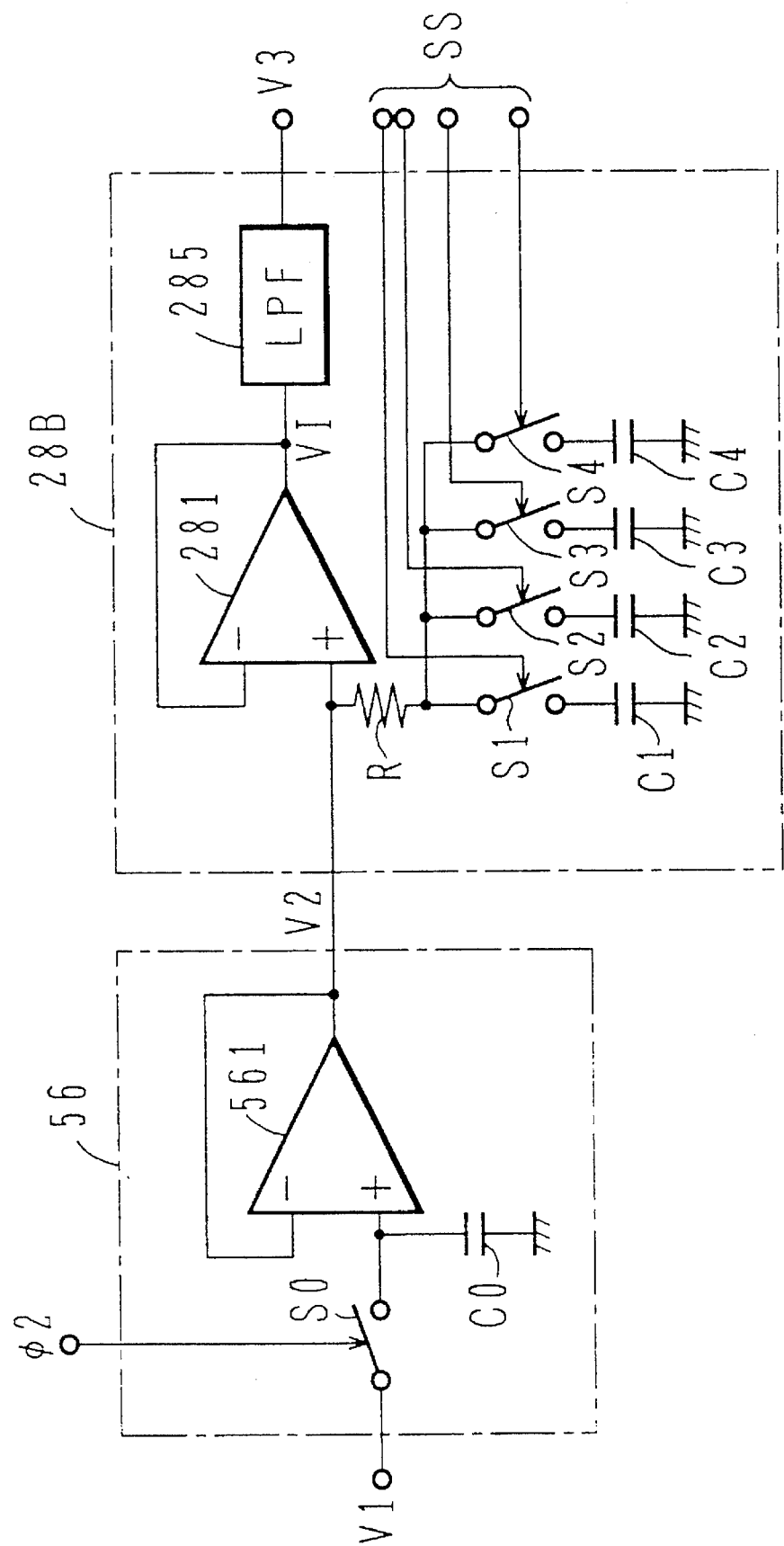
FIG. 30 shows a sample hold circuit and a smoothing circuit used in the ninth embodiment according to the present invention.

The sample hold circuit 56, as shown in FIG. 30, is provided with a voltage follower 561 with the amplification factor at 1, which shorts between the inverted input end and the output end of the operational amplifier. One end of its non inverted input end is connected to the ground via the capacitor C0 and the other end is connected to the output end of the D/A converter 31 shown in FIG. 29, via an analog switch S0.

While the sample clock φ2 is at high, the analog switch S0 is turned ON, the capacitor C0 is charged or discharged with the input voltage V1. While the sample clock φ2 is at low, the analog switch S0 is turned OFF and the voltage between the ends of the capacitor C0 is maintained. With this, the output voltage V2 of the sample hold circuit 56 becomes the step waveform indicated with the solid line in FIG. 31B, eliminating the glitch waveform contained in the voltage V1. The voltage V2 is supplied to the smoothing circuit 28B shown in FIG. 30. The smoothing circuit 28B is provided with a voltage follower 281 with the amplification factor at 1, with one end of its non inverted input end connected to one end of each of the analog switches S1 to S4 via the resistor R, and the other end connected to the output end of the voltage follower 561. The other ends of the analog switches S1 to S4 are connected to the ground line via the capacitors C1 to C4 respectively. The low-pass filter 285 is connected to the output end of the voltage follower 281.

The ratio of the capacities of the capacitors C1 to C4 may be, for instance, 1:2:4:8. With the ON/OFF combinations of the analog switches S1 to S4 set by the control signal SS. The integrated time constant can be set to nRC1, n=1 to 15. The output VI of the voltage follower 281 is as indicated with the 1-point chain line in FIG. 31B. The value of n is determined in correspondence with the step change quantity of the voltage V2, i.e., the speed at which the mobile stage 11 moves so that the output voltage V3 of the low-pass filter 285 approaches a straight line as much as possible.

The smoothing circuit 28B may be structured so that the resistance is switched instead of the capacities of the capacitors.

The offset correction value ΔY mentioned earlier is used for correcting the output of the amplifying circuit 32, which tends to become smaller than the target value due to the delay time td, by which the step change of the voltage V2 is delayed relative to that of the voltage V1, or the time required for the change in the output of the stage position detector 52 to be communicated to the output of the amplifying circuit 32 when there is no such delay.

The offset correction value ΔY is determined by the speed at which the mobile stage 11 moves. The speed at which the mobile stage 11 moves in direction Y changes depending upon the current density of the electron beam EB and the sensitivity of the resist on the semiconductor wafer 10.

In the ninth embodiment according to the present invention, since the glitch waveform contained in the output of the D/A converter 31 is eliminated at the sample hold circuit 56 and the step change is almost completely eliminated at the smoothing circuit 28B, the interpolation between steps performed by smoothing is performed more accurately compared to a structure in which only a low-pass filter is used. This further improves the exposure positional accuracy making it possible to expose more fine patterns.

The structure shown in FIG. 29 is common in the following tenth to thirteenth embodiments except in the structure of their smoothing circuits.

The example shown in FIG. 29, may take a form in which the adder 37 is omitted, the output of the subtractor 54 is supplied to the D/A converter 31 and the offset correction value is subtracted from the content of the band position register 53.

TENTH EMBODIMENT

Figure 32:
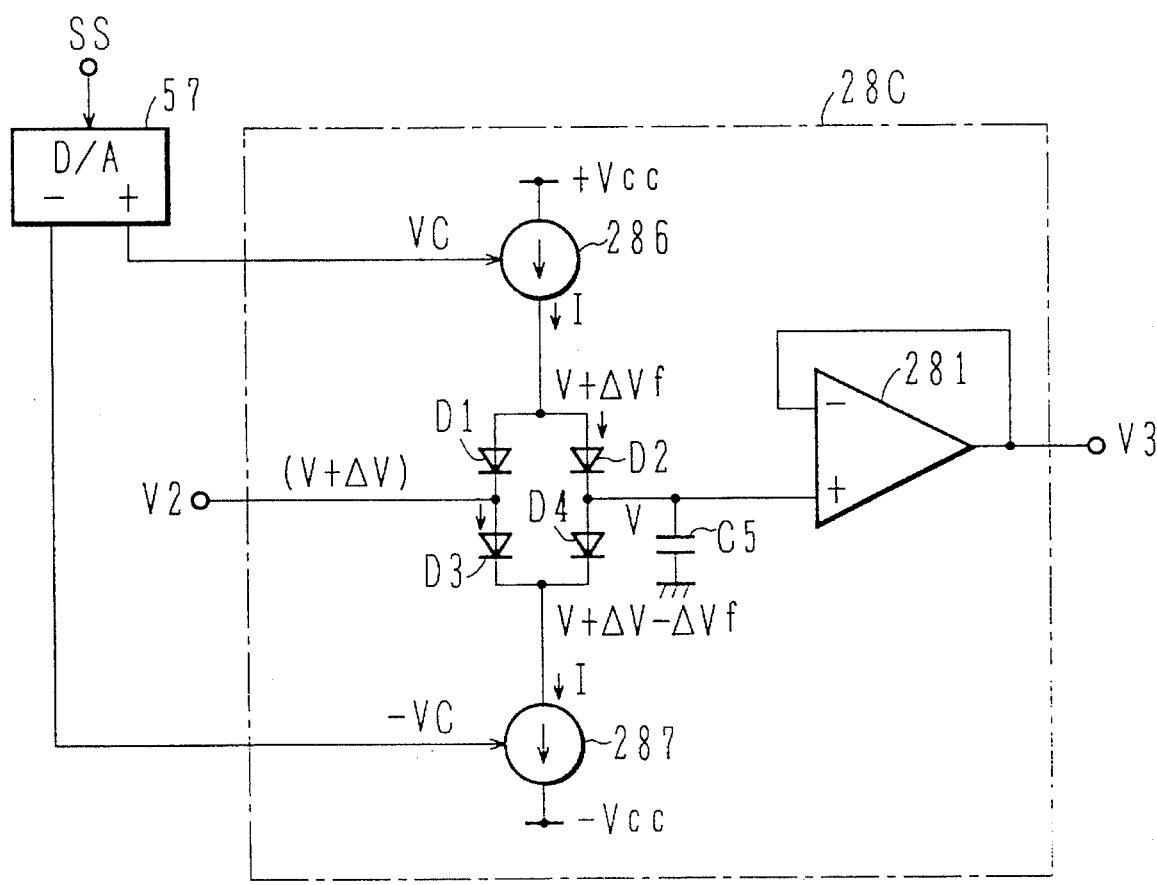
FIG. 32 shows the smoothing circuit used in the tenth embodiment according to the present invention.

In the ninth embodiment described above, a linear interpolation is not complete. The more linearly this interpolation is performed, the more accurate it is. Therefore, in the tenth embodiment, instead of the smoothing circuit 28B shown in FIG. 30, a smoothing circuit 28C as shown in FIG. 32 is used.

In this smoothing circuit 28C, the anodes of the diodes D1 and D2 are both connected to the source wire, the potential of which is +Vcc via the current source 286. The cathodes of the diodes D1 and D2 are connected to the anodes of the diodes D3 and D4 respectively and the cathodes of the diodes D3 and D4 are connected to the source wire, the potential of which is −Vcc via the current source 287. Vet may be, for instance, 15 V. The cathode of the diode D2 is also connected to one end of the capacitor C5 and to the non inverted input end of the voltage follower 281 and the other end of the capacitor C5 is connected to the ground line.

The current sources 286 and 287 are controlled in such a manner that the currents I that run to these sources are equal to each other. The current sources 286 and 287 may each be structured with a PNP transistor and an NPN transistor, for instance, and a pair of complementary potentials VC and −VC are applied the control input end of the current sources to control the current I. The potentials VC and −VC are obtained by converting the control signal SS to analog with the D/A converter 57.

The input end and the output end of the smoothing circuit 28C become the cathode of the diode D1 and the output end of the voltage follower 281 respectively.

Next, the operation of the smoothing circuit 28C structured as described above is explained.

Generally speaking, the voltage ΔVf between diode ends when an electric current flows forward through a diode is constant at approximately 0.6 V.

Figure 33:
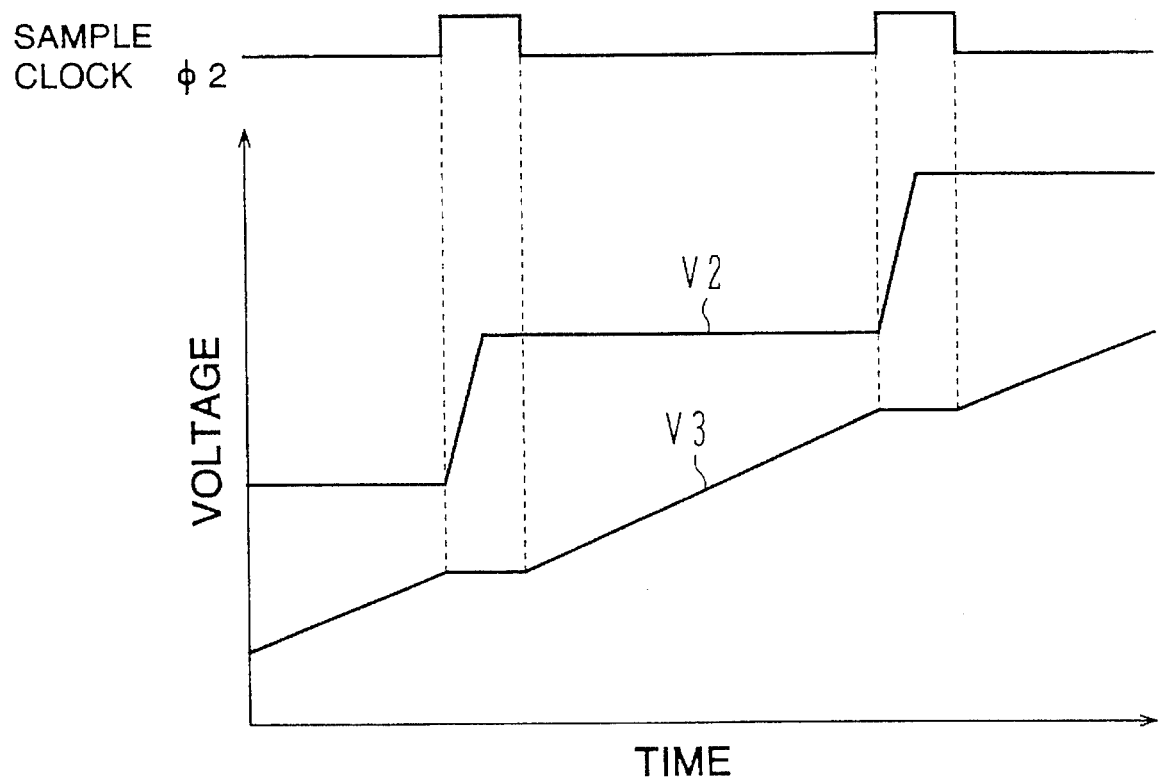
FIG. 33 is a waveform diagram showing the operation of the circuit shown in FIG. 32.

Now, consider a situation in which V2 step changes by ΔV0 from the state in which V2=V3 as shown in FIG. 33. Here, V2=V+ΔV=constant, and V3=V. The initial value of ΔV is ΔV0.

Since ΔV>0, the electric current I runs to the diodes D2 and D3 to set the anode potential of the diode D2 to V+ΔVf and the cathode potential of the diode D3 to V+ΔV−ΔVf. As the voltages between the ends of the diodes D1 and D4 are then both ΔVf−ΔV, which is smaller than ΔVf, no electric current flows.

As a result, the potential V3 increases linearly until it reaches V2 (ΔV=0), as shown in FIG. 33. As the speed at which it increases is in proportion to the electric current I, the speed at which the potential V3 increases can be adjusted with the control signal SS.

When V3=V2, the potential distribution of the diode bridge becomes symmetrical. Consequently, the electric current I/2 runs to the diodes D1 to D3 to stop the charging of the capacitor C5.

In this tenth embodiment, the potential V3 can be changed linearly. The optimal value for the inclination of the potential V3 is the inclination of the straight line which connects the step-up start points of the potential V2 in FIG. 33 and is: {(the prevailing output value at the adder 37)−(the previous output value of the adder 37)}/(output cycle of the stage position detector 52), in FIG. 29. This value is already determined before the step change of the potential V2 occurs. Therefore, with the control signal SS, the inclination of the potential V3 can be maintained at the optimum value at all times.

Figure 34A:
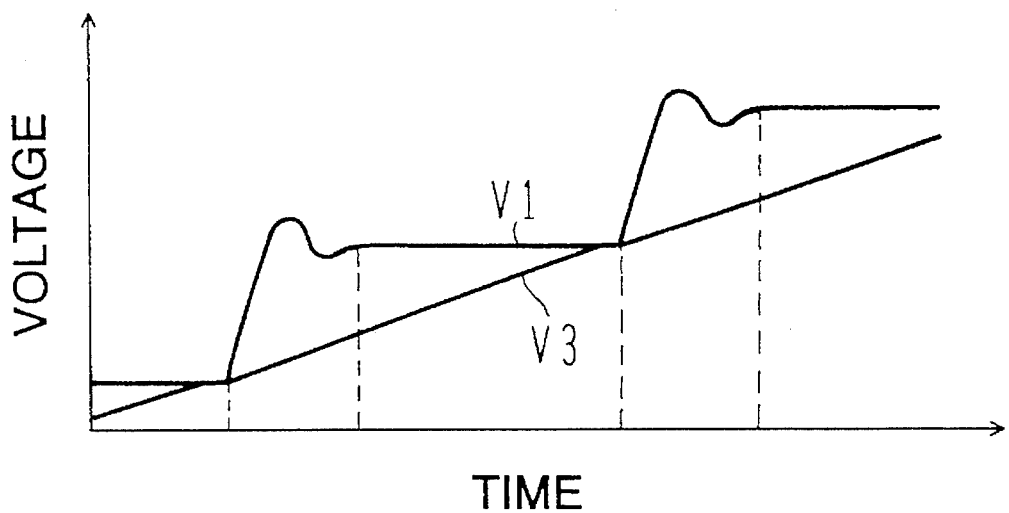
FIG. 34 is a waveform diagram showing the operation in the structure in which the sample hold circuit, which is in the preceding stage of the circuit in FIG. 32, is omitted.

This provides a variation since the potential V3 changes linearly, in which the sample hold circuit 56 in FIG. 29 is omitted and the output V1 of the D/A converter 31 is supplied directly to the smoothing circuit shown in FIG. 32. In this case, the potential V3 changes relative to the potential V1, as shown in FIG. 34A.

Figure 34B:
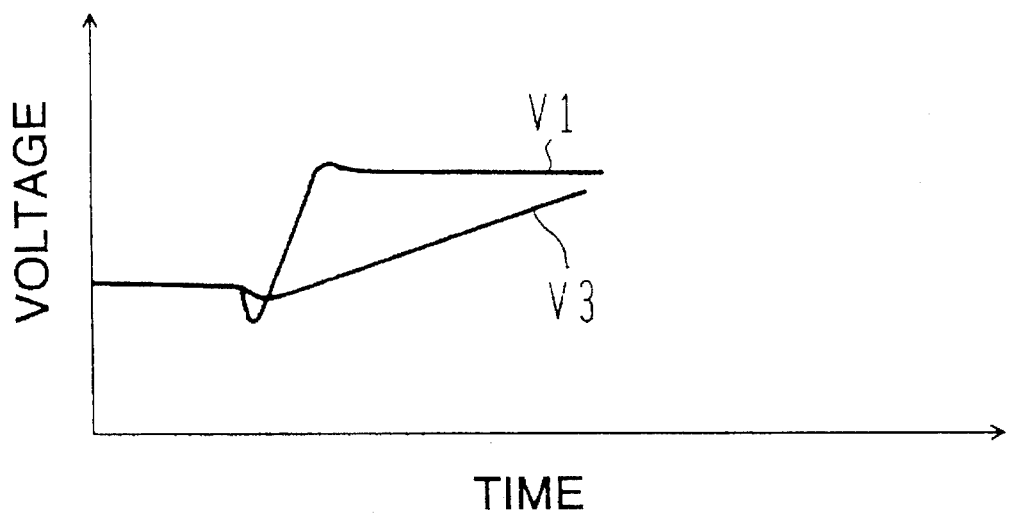

When the potential V1 steps up, if an undershoot glitch waveform, as shown in FIG. 34B, is present, the diodes D1 and D4 remain ON and the diodes D2 and D3 remain OFF until V3=V1. During this time span, the potential V3 goes down. In such a case, it is preferable to use the sample hold circuit 56 in FIG. 29. The same applies to the case in which an overshoot glitch waveform is present when the potential V1 steps down.

ELEVENTH EMBODIMENT

Figure 35:
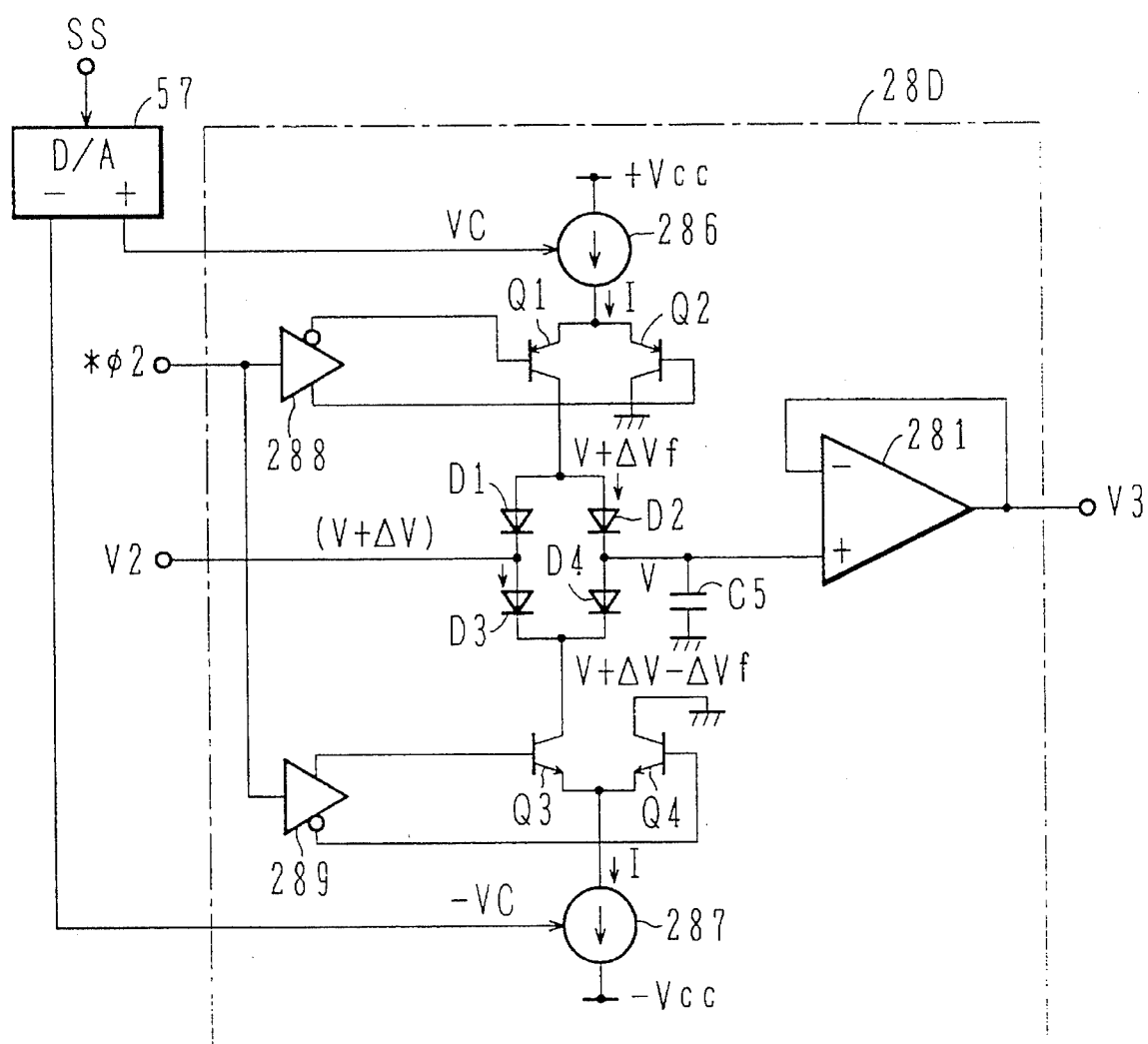
FIG. 35 shows the smoothing circuit used in the eleventh embodiment according to the present invention.

In the smoothing circuit 28C in FIG. 32, when the potential V2 changes due to the switching at the sample hold circuit which is at the preceding stage, this change is communicated to the capacitor C5. In the eleventh embodiment, in order to prevent this, in place of the smoothing circuit 28C shown in FIG. 32, the smoothing circuit 28D shown in FIG. 35 is employed to maintain the disconnected state between the input and the output of the smoothing circuit 28D during switching of the sample hold circuit at the preceding stage.

In this smoothing circuit 28D, a pair of PNP transistors Q1 and Q2 for switching are connected between the current output end of the constant current source 286 and the anodes of the diodes D1 and D2 and between the current output end of the constant current source 286 and the ground line respectively. Also, a pair of NPN transistors Q3 and Q4 for switching are connected between the current input end of the constant current source 287 and the cathodes of the diodes D3 D4 and between the current input end of the constant current source 287 and the ground line respectively.

The inverted output end and the non inverted output end of the level conversion circuit 288 are connected to the bases of the PNP transistors Q1 and Q2 respectively and the non inverted output end and the inverted output end of the level conversion circuit 289 are connected to the bases of the NPN transistors Q3 and Q4 respectively. The clock *ϕ2 is supplied to the input ends of the level conversion circuits 288 and 289. The clock *ϕ2 is obtained by inverting the logic level of the sample clock ϕ2 in FIG. 31D. The level conversion circuit 288 converts an input signal into a pair of complementary potentials to be used to turn ON/OFF the PNP transistors Q1 and Q2 and the level conversion circuit 289 converts an input signal into a pair complementary potentials to be used to turn ON/OFF the NPN transistors Q3 and Q4.

The other aspects of the smoothing circuit 28D are identical to those of the smoothing circuit 28C in FIG. 32.

Next, the operation of the smoothing circuit 28D structured as described above is explained in reference to FIG. 36.

When the clock *ϕ2 is at low, the PNP transistor Q2 and the NPN transistor Q4 are ON and the PNP transistor Q1 and the NPN transistor Q3 are OFF. With this, no electric current flows to the diode bridges D1 to D4. The voltage between the ends at the capacitor C5 is held and the potential. V3 is under no influence of the potential V2. In this holding state, the potential V2 steps up by ΔV0.

When the clock *ϕ2 shifts to high, the PNP transistor Q1 and the NPN transistor Q3 are turned ON and the PNP transistor Q2 and the NPN transistor Q4 are turned OFF and an operation similar to that in the tenth embodiment described above is performed.

The smoothing circuit 28D may also be used as the sample hold circuit 56 shown in FIG. 29 by making the potentials VC, −VC applied to the control input ends of the constant current sources 286 and 287 constant and also by reducing the capacity of the capacitor C5.

TWELFTH EMBODIMENT

Figure 37:
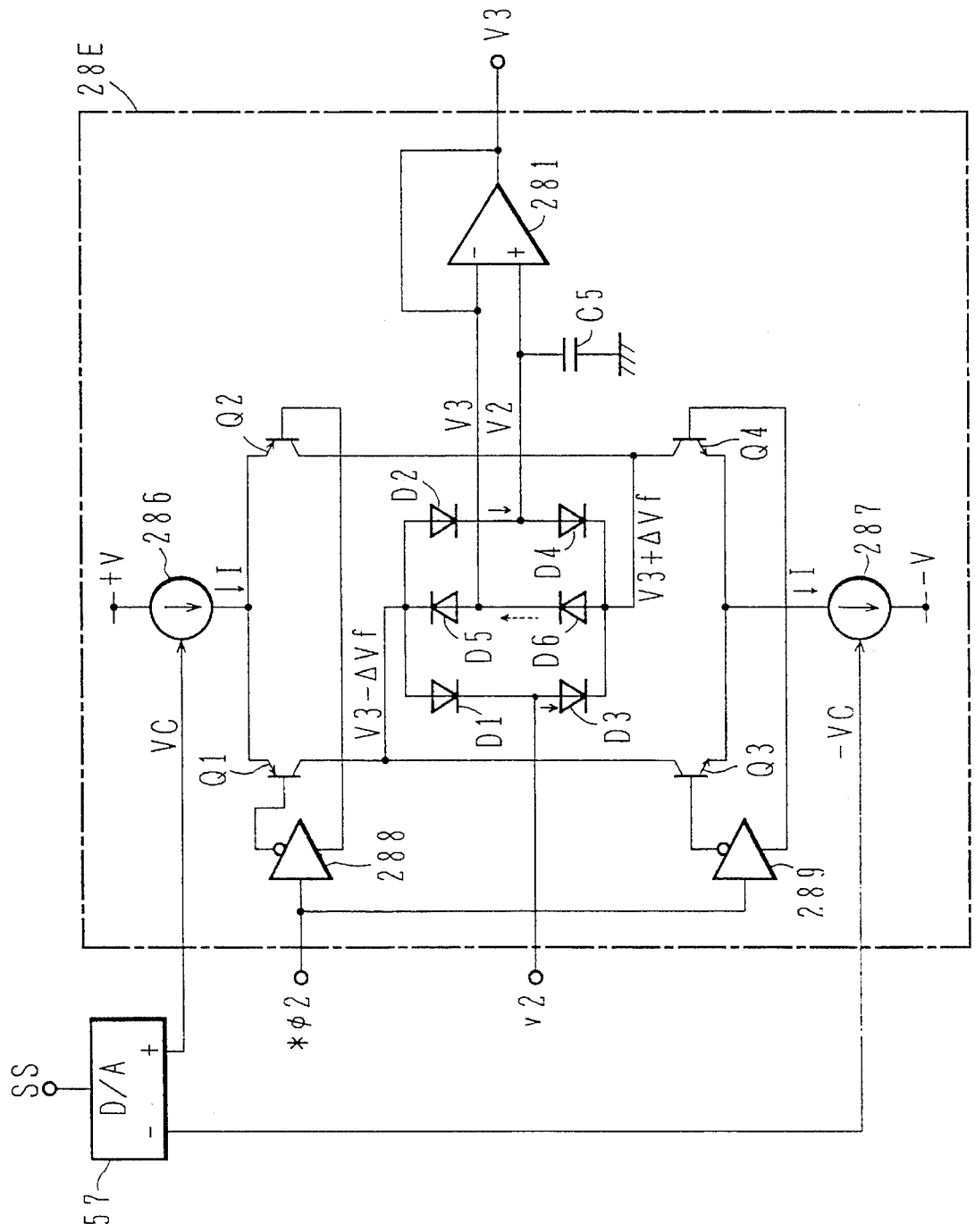
FIG. 37 shows the smoothing circuit used in the twelfth embodiment according to the present invention.

With the smoothing circuit 28D in FIG. 35, if there is an offset voltage generated in the output of the voltage follower 281, this offset voltage cannot be eliminated. Therefore, in order to eliminate such an offset voltage, the smoothing circuit 28E shown in FIG. 37 is used instead of the smoothing circuit 28D in the twelfth embodiment.

In the smoothing circuit 28E, the cathode of the diode D5 is connected to the anode of the diode D1, the anode of the diode D6 is connected to the cathode of the diode D3, and the cathode of the diode D6 is connected to the anode of the diode D5. Also, the collectors of the PNP transistor Q2 and the NPN transistor Q4 are both connected to the anode of the diode D6, the cathode of the diode D6 is connected to the inverted input end of the voltage follower 281 and the cathode of the diode D5 is connected to the collectors of the PNP transistors Q1 and Q2. The inverted output end and the non inverted output end of the level conversion circuit 289 are connected to the bases of the NPN transistors Q3 and Q4 respectively.

Other aspects of this circuit are identical to those of the smoothing circuit 28D in FIG. 35.

Next, the operation of the smoothing circuit 28E, structured as described above, is explained.

When the clock *ϕ2 is at high, the PNP transistor Q1 and the NPN transistor Q4 are ON and the PNP transistor Q2 and the NPN transistor Q3 are OFF, and when V2>V, an operation similar to that in FIG. 32 is performed. When the voltage V between the ends of the capacitor C5 increases to V2, the electric current I/2 runs to all of the diodes D1 to D4.

When the clock ϕ2 shifts to high in this state, the PNP transistor Q2 and the NPN transistor Q3 are turned ON, the PNP transistor Q1 and the NPN transistor Q4 are turned OFF and an electric current flows to the diode D6 to increase its anode potential to V3+ΔVf. With this, the diodes D3 and D6 are turned OFF and the voltage between the ends at the capacitor C5 is maintained at V2. Then, an electric current flows to the diode D5 to reduce its cathode potential to V3−ΔVf and with this, the diodes D1 and D2 are turned OFF. During such an operation, the potential V3 becomes equal to the potential V2 to eliminate the offset voltage at the voltage follower 281.

THIRTEENTH EMBODIMENT

Figure 36:
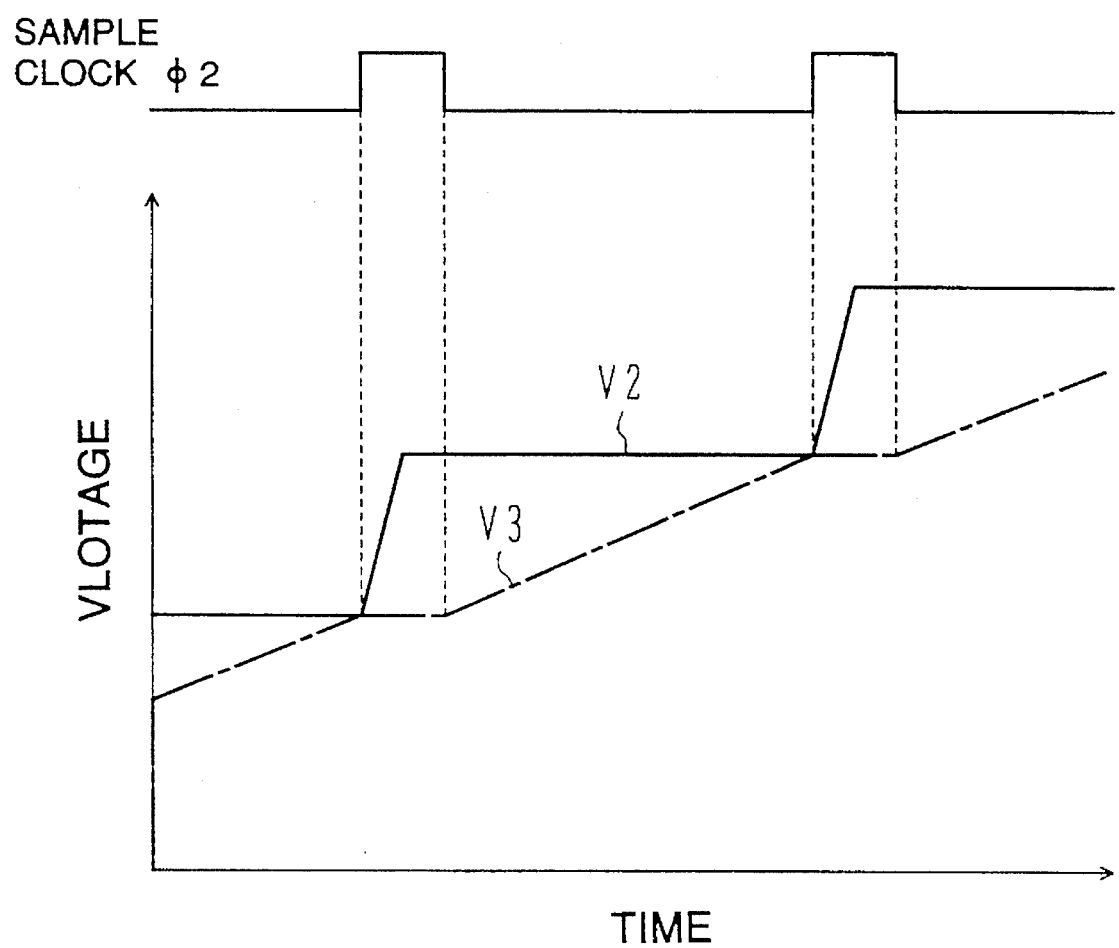
FIG. 36 is a waveform diagram showing the operation of the circuit shown n FIG. 35.
Figure 38:
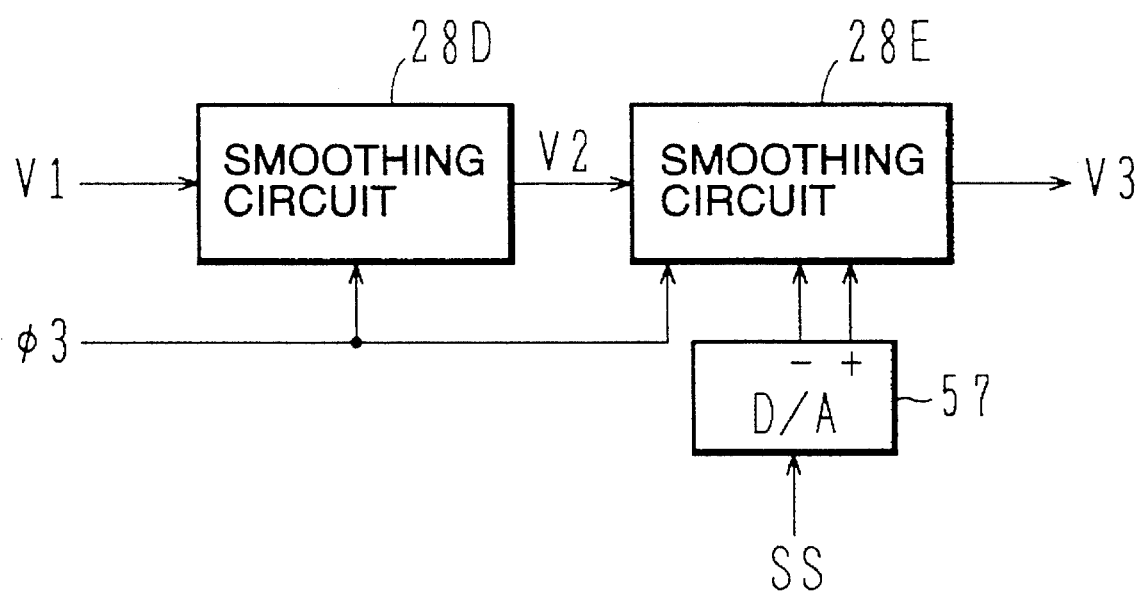
FIG. 38 shows the smoothing circuit used in the thirteenth embodiment according to the present invention.

In FIG. 36, the shorter the period of time during which the potential V3 is at a fixed value, the more accurately the interpolation through smoothing can be performed. Thus, in the thirteenth embodiment, as shown in FIG. 38, the smoothing circuit 28D shown in FIG. 35 is employed in place of the sample hold circuit 56 shown in FIG. 30, and the smoothing circuit 28E in FIG. 37 is employed in place of the smoothing circuit 28C shown in FIG. 30.

For the smoothing circuit 28D, an electric current that runs to its current source is made constant. Also, as shown in FIG. 39B, the inclination of V2 is such that it is always larger than the inclination of V3.

Figure 39:
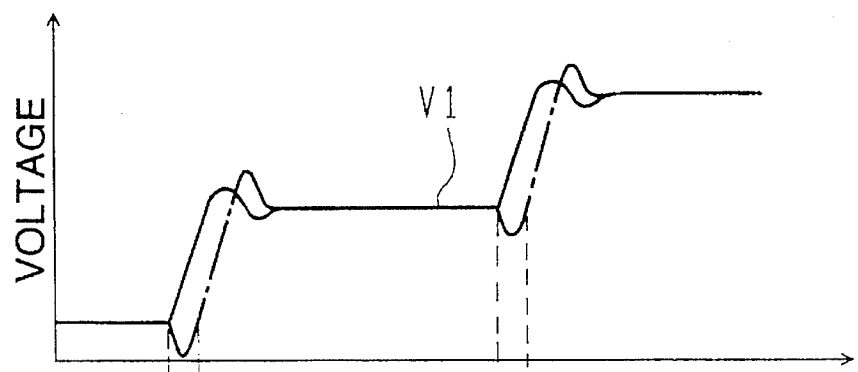
FIG. 39 is a waveform diagram of the voltages V1 to V3 in FIG. 38 and illustrates the relationships between these voltages and the clocks $\phi 1$, $\phi 3$.
Figure 39:
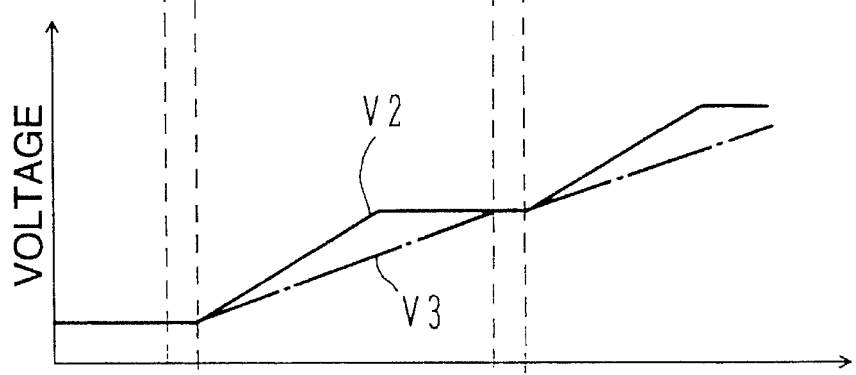
Figure 39:
Figure 39:

The flow of the electric current to the smoothing circuits 28D and 28E is controlled through switching with a clock φ3 with a negative pulse which falls at the rise of the clock φ1 as shown in FIG. 39D. The pulse width of the clock φ3 is approximately equal to the width of the undershoot when the potential V1 steps up (the width of the overshoot when the potential V1 steps down) as shown in FIG. 39A and is relatively small. This ensures that no glitch waveform is included in the potential V2 even if the potential V3 changes as indicated with either the solid line or the two-point chain line when it steps up, as shown in FIG. 39A.

FOURTEENTH EMBODIMENT

Figure 40:
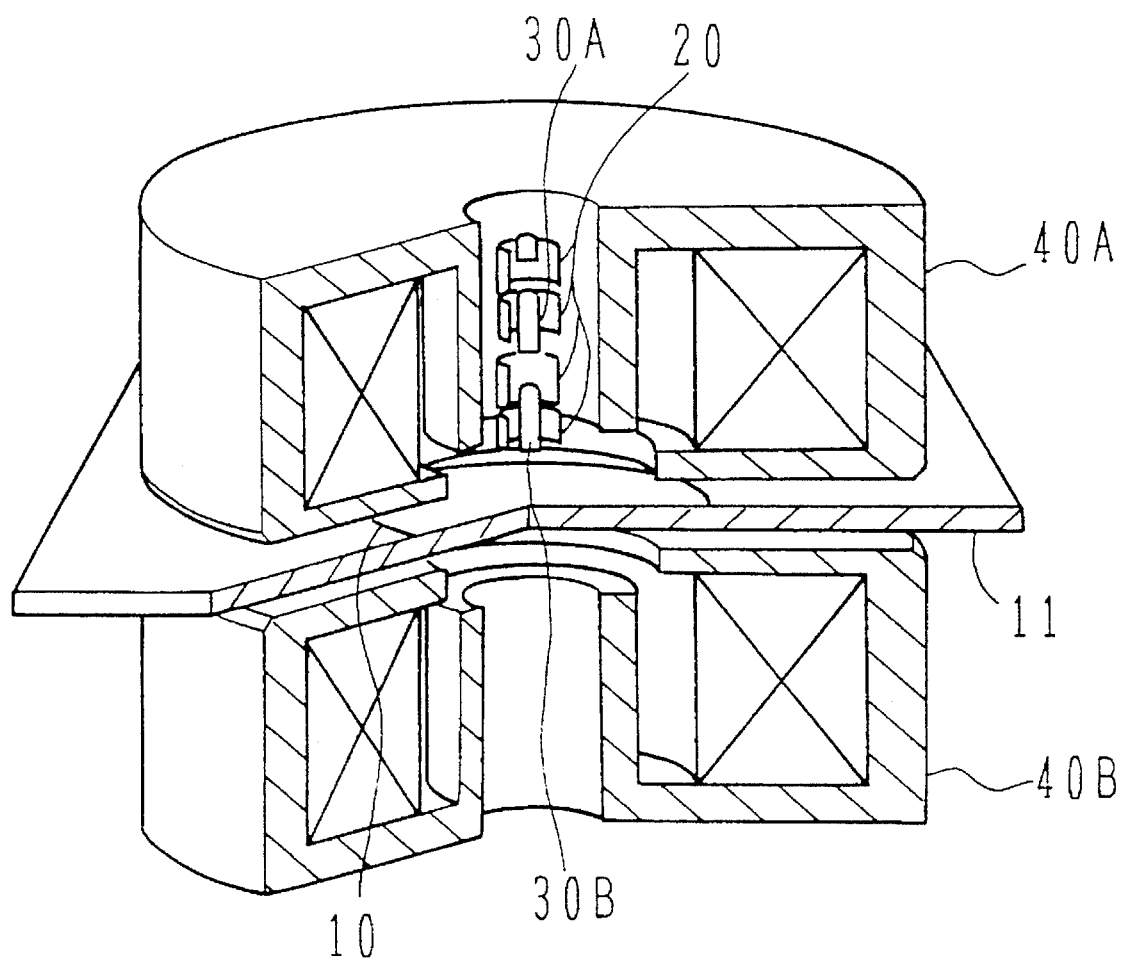
FIG. 40 is a schematic cut-away perspective view of the electrostatic deflector and its periphery in the fourteenth embodiment according to the present invention.

FIG. 40 is a schematic cut-away perspective view of the electrostatic deflector and its periphery.

The immersion lens is constituted with electromagnetic lenses 40A and 40B and the sub deflector, i.e., the electrostatic deflector 30A, 30B as well as the main deflectors, i.e., the electromagnetic deflectors 20, which are provided on the inside of the electromagnetic lens 40A along its central axis.

Figure 41:
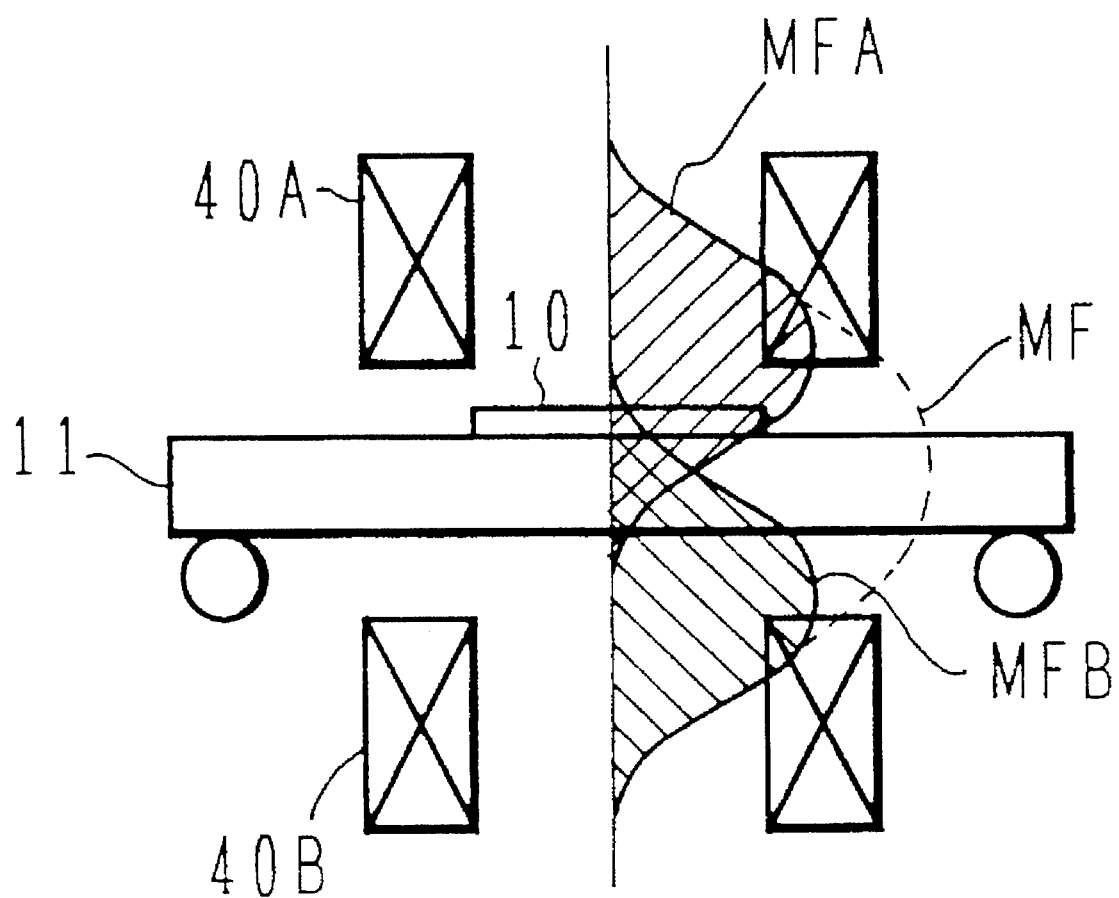
FIG. 41 shows the intensity of a magnetic field on the optical axis generated by the electromagnetic lens shown in FIG. 40.

FIG. 41 shows the intensity MF of the composite magnetic field which is a combination of the intensity MFA of the magnetic field generated by the electromagnetic lens 40A and the intensity MFB of the magnetic field generated by the electromagnetic lens 40B.

Figure 42:
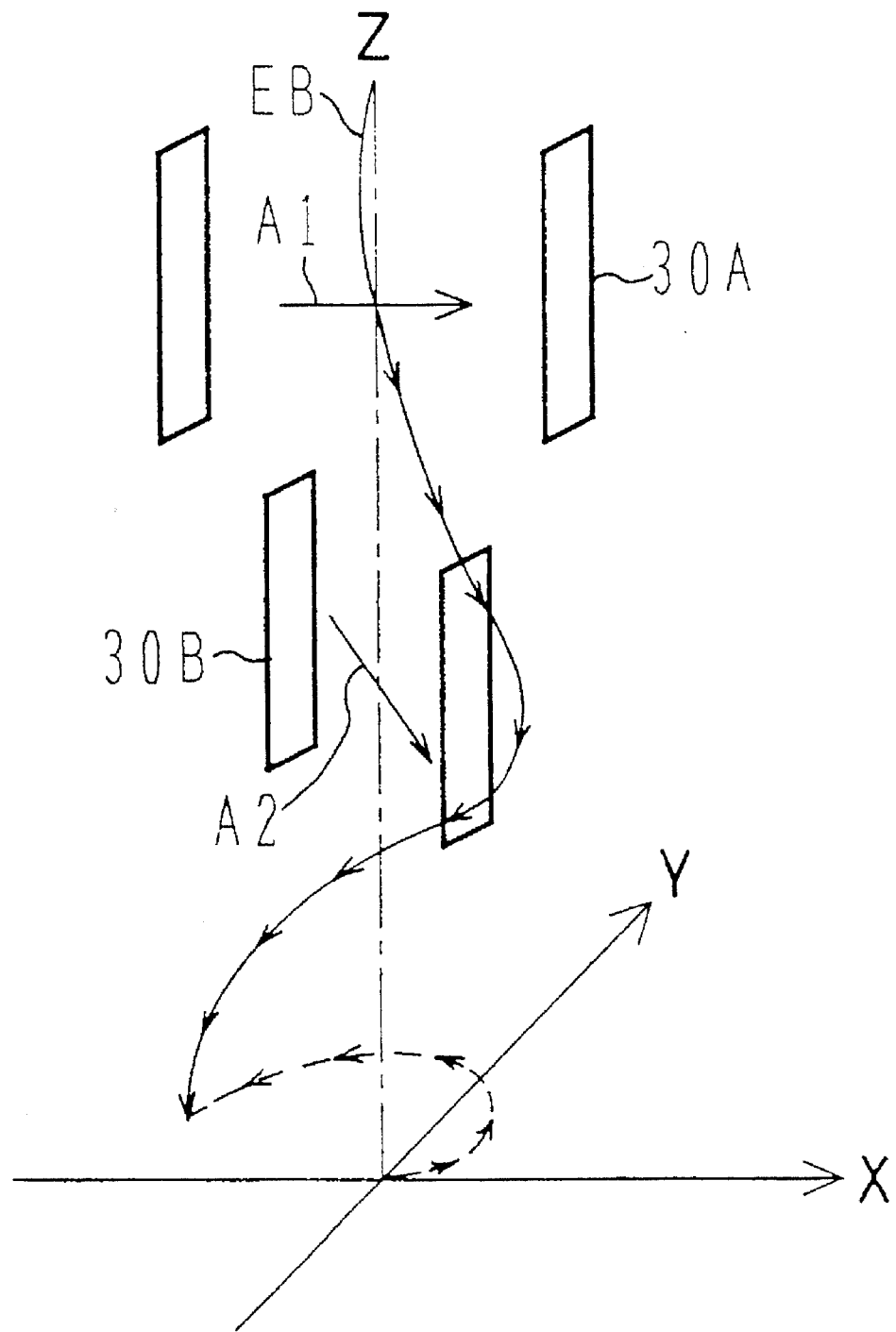
FIG. 42 is a perspective view of the path of an electron beam when it is deflected by a two-stage electrostatic deflector inside an electromagnetic lens.

As shown in FIG. 42, since the electron beam EB is subject to a converging force due to the magnetic field of the electromagnetic lens when it is deflected by the first stage electrostatic deflector 30A, it rotates spirally. With the angle of this rotation at the position of the second electrostatic deflector 30B assigned θ, the force component applied by the electrostatic deflector 30B in the direction away from the z-axis becomes the maximum if the electrostatic deflector 30B is positioned by rotating it by approximately the angle θ around the z-axis, achieving maximum deflection quantity on the wafer.

With this, the number of scanning passes performed by the electromagnetic main deflector, in which the setting time is relatively long, is reduced, improving the throughput of the charged particle beam exposure system.

Figure 43:
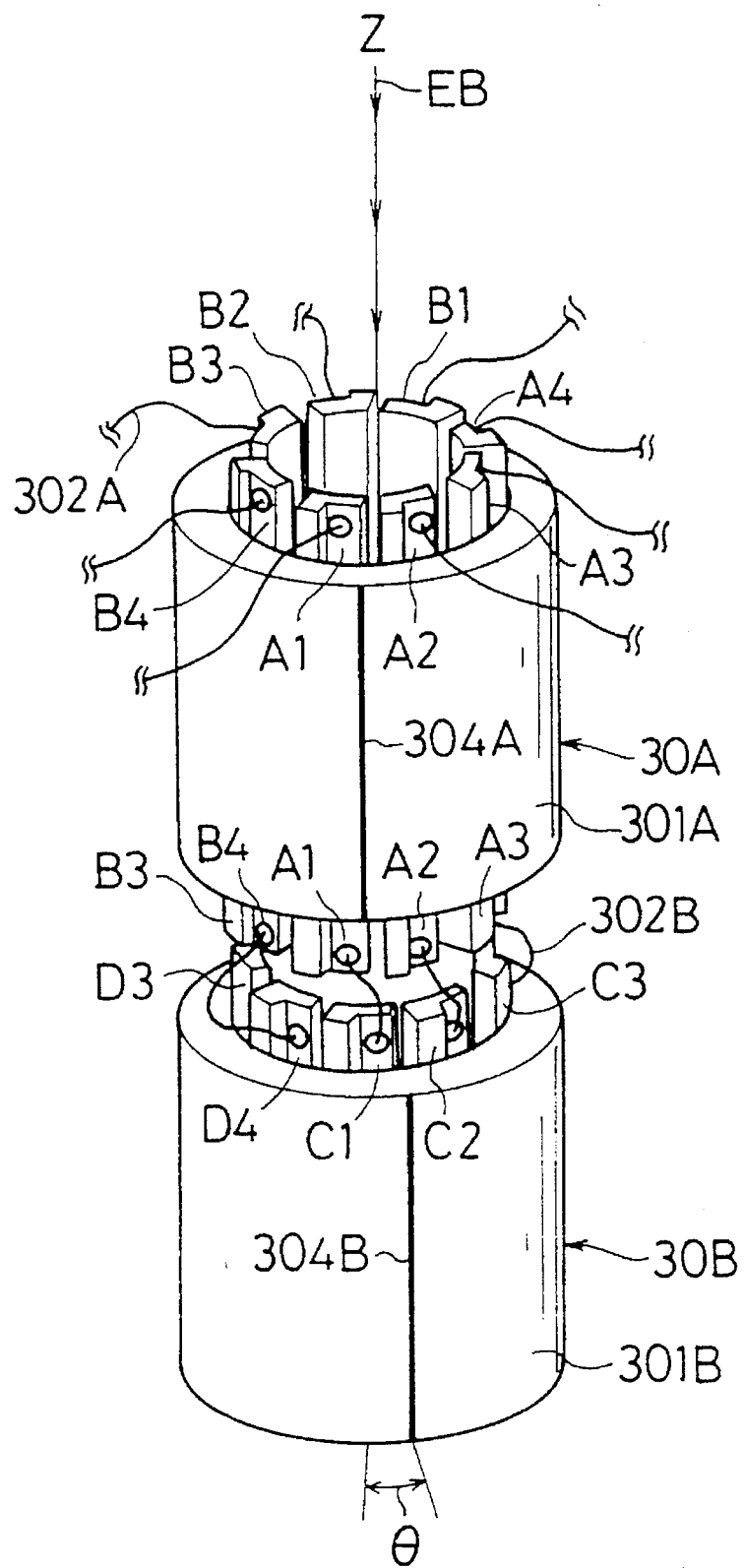
FIG. 43 is a perspective view of the electrostatic deflector in the fourteenth embodiment according to the present invention.

FIG. 43 is a perspective view showing the structure of this embodiment in more detail.

Figure 6A:
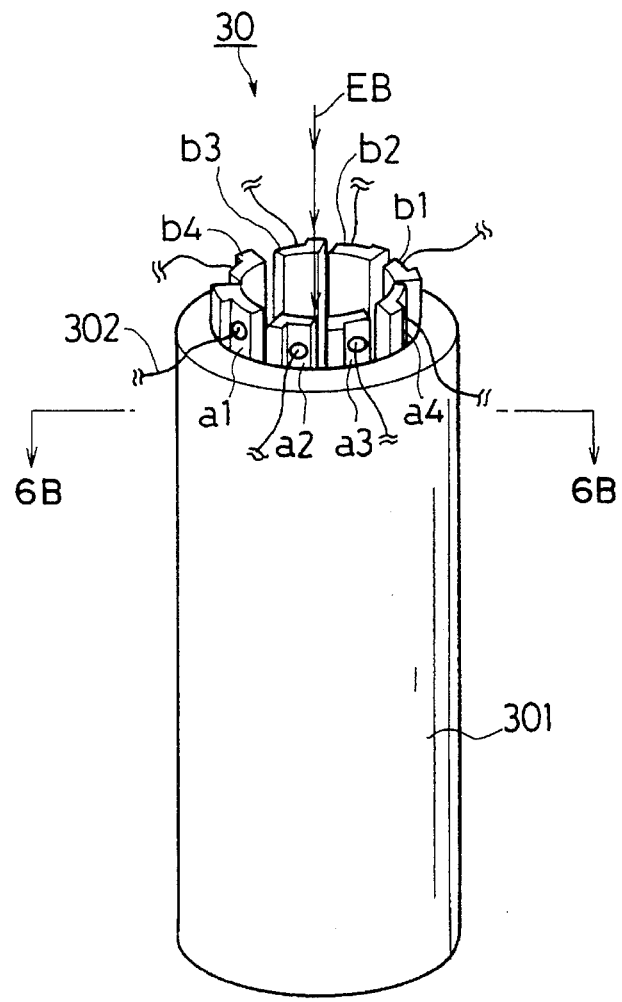
FIG. 6A is a perspective view of an electrostatic deflector in the prior art.
Figure 6B:
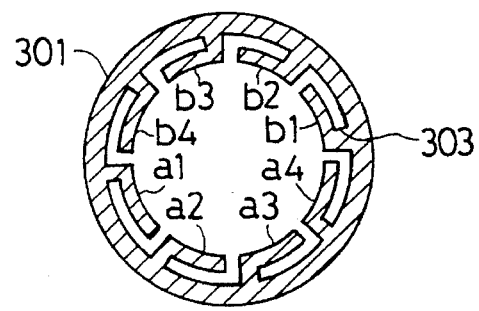
FIG. 6B is a cross sectional view taken along the plain A—A in FIG. 6A.
Figure 7:
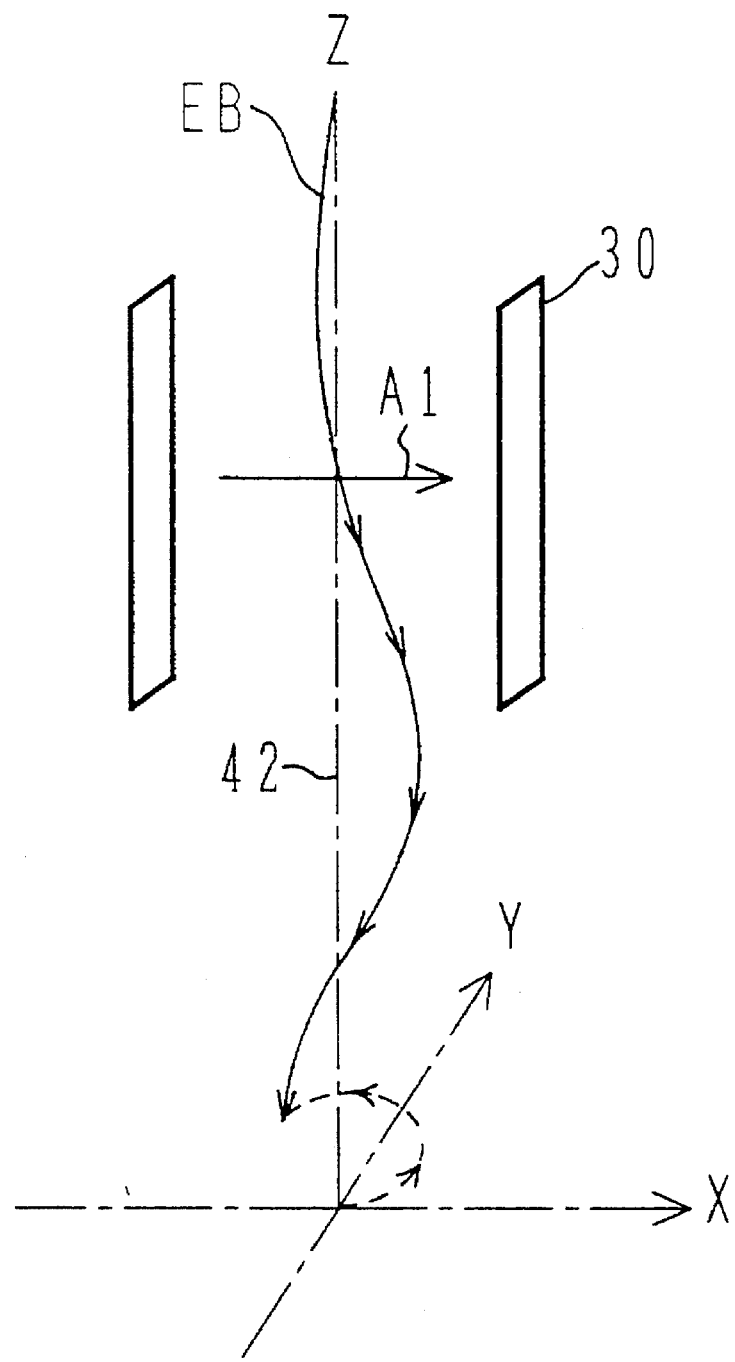
FIG. 7 is a perspective view of the path of an electron beam when it is deflected with an electrostatic deflector in the prior art inside an electromagnetic lens.
Figure 8:
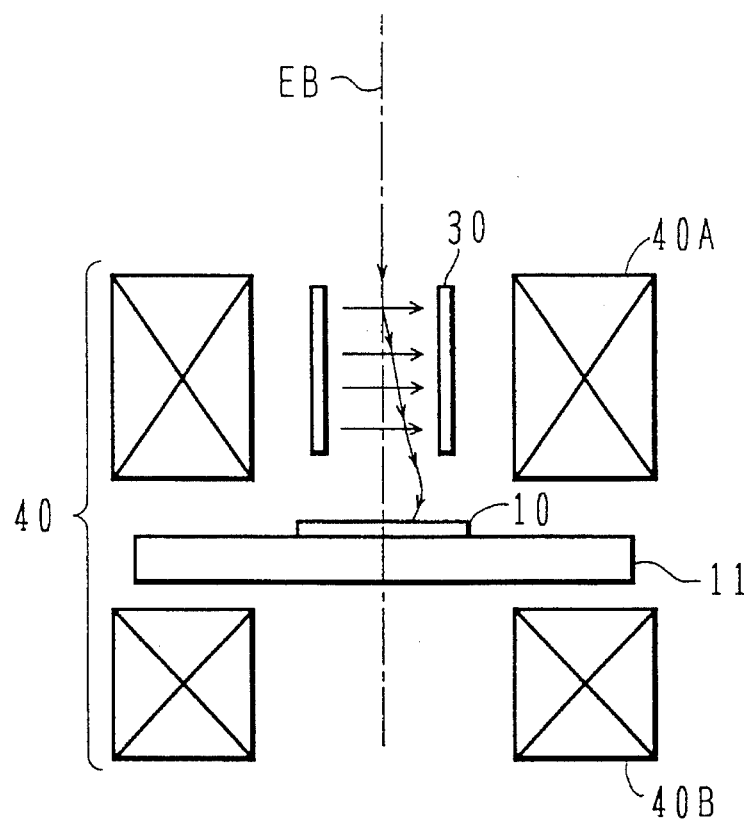
FIG. 8 shows the path of an electron beam when an electrostatic deflector in the prior art is placed inside an immersion lens.
Figure 9:
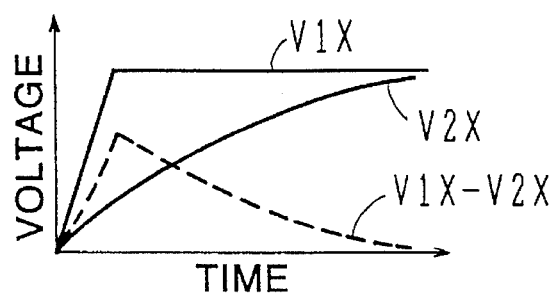
FIG. 9 is a waveform diagram illustrating problems that exist in the prior art.

The electrostatic deflector 30A differs from the one shown in FIG. 6A in that the electrode ends for connection project out from both ends, whereas the one in FIG. 6A has an electrode end projecting from only one end. In the electrostatic deflector 30A, electrically conductive material is plated on the inner surface of a cylindrical member 301A and four pairs of electrostatic deflecting electrodes A1 to A4 and B1 to B4 are formed facing opposite each other. The cylindrical member 301A may be constituted of, for instance, ceramic, and it is formed as a unit by injection. The wire 302A for applying voltage from the outside is connected to the electrode end for connection on the upper side.

With the four pairs of electrodes, a consistent electrical field is generated over a wider area compared to an arrangement in which two pairs of electrodes are positioned at a right angle to each other in order to deflect in direction X and in direction Y. In each pair of electrodes, one is set at 0 V, or, potentials whose absolute values are equal to each other but whose signs are opposite are applied from a complementary output type amplifier.

The electrostatic deflector 30B is identical to the electrostatic deflector 30A except that in the electrostatic deflector 30B, an electrode end for connection projects out from only one end. The electrostatic deflecting electrodes A1 to A4 and B1 to B4 of the electrostatic deflector 30A are electrically connected to the corresponding electrostatic deflecting electrodes C1 to C4 and D1 to D4 respectively (FIG. 43 shows only part of these) of the electrostatic deflector 30B with the wire 302B.

Since the inner surfaces of the cylindrical members 301A, 301B have complex forms, if electrostatic deflecting electrodes are formed by directly gold-plating the inner surfaces of the ceramic, the adhesion of the gold is too weak and it can peel off easily. To deal with this problem, gold plating is implemented after plating the inner surfaces directly with a NiP undercoat film to form electrostatic deflecting electrodes.

If the thickness of the NiP undercoat film, which is magnetic substance, is too great, hysteresis arises by the magnetic fields of the main deflectors, thereby causing the setting time of the main deflector large. Thus, it is desirable to set the thickness of the NiP undercoat film at approximately 1 μm or less. At the same time, if the gold plate film is too thick, an excess current due to the change in the magnetic field of the electromagnetic deflectors occurs within the electrostatic deflecting electrodes to reduce the electrostatic deflection accuracy. Therefore it is desirable to set the thickness of the gold plate film at approximately 2 μm or less.

The electrostatic deflectors 30A and 30B are positioned in such a manner that the electrostatic deflecting electrodes C1 to C4 and D1 to D4 are offset by the angle θ around the central axis relative to the electrostatic deflecting electrodes A1 to A4 and B1 to B4 respectively.

Alignment marks 304A and 304B are provided on the external surfaces of the cylindrical members 301A and 301B respectively at positions that correspond to each other in order to facilitate adjustment of the angle θ. The angle θ may be adjusted using a jig (not shown), for instance.

The inner diameter of the cylindrical members 301A and 301B, i.e., the distance between the electrostatic deflecting electrodes that face opposite each other may be 6 mm, for example, and the length of each electrostatic deflecting electrode in the direction of the z-axis may be 30 mm.

Next, the method with which the angle θ mentioned above is determined is explained.

Figure 44:
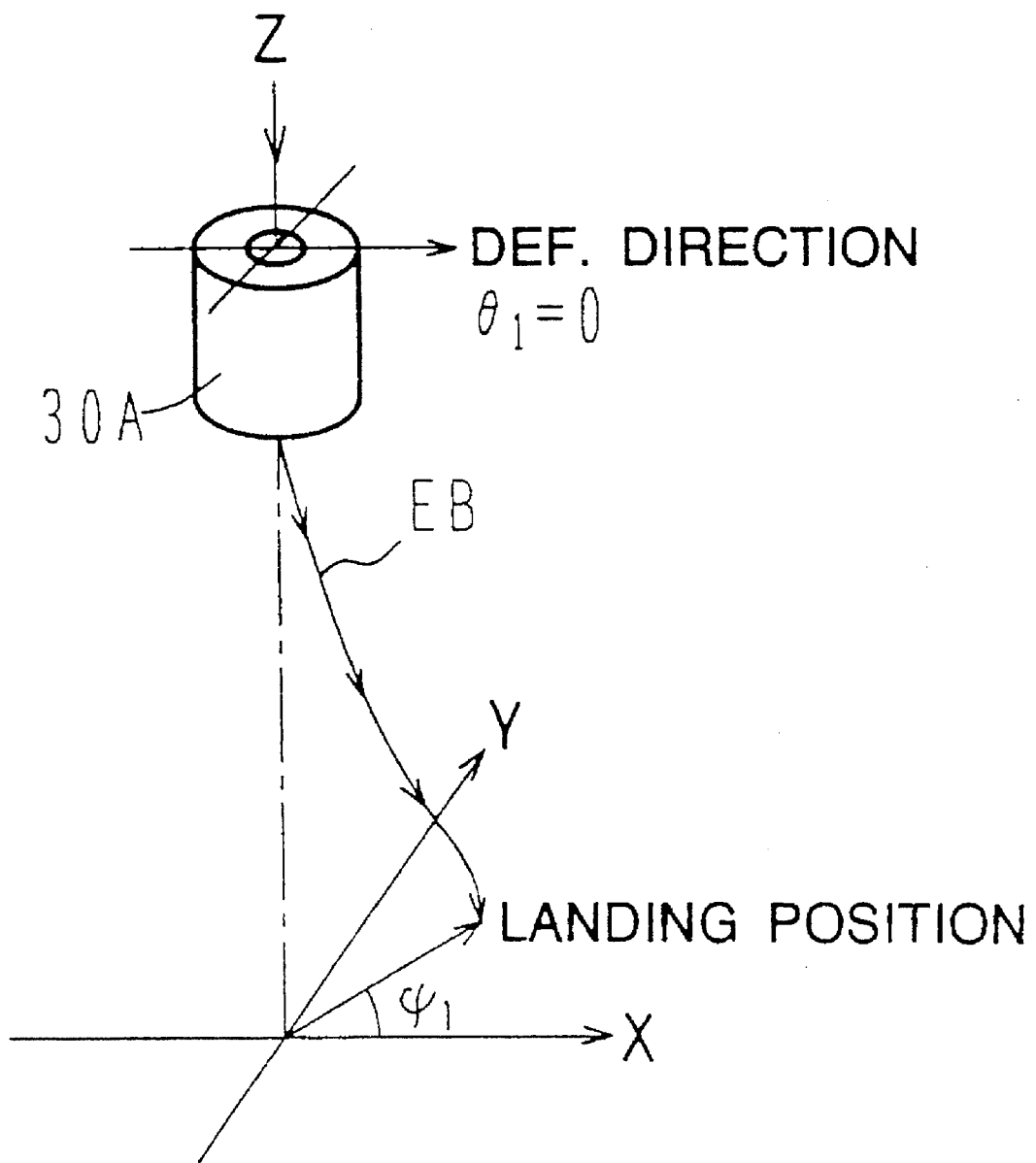
FIG. 44 shows a path of an electron beam and its landing position on the wafer when the first stage electrostatic deflector is used.

FIG. 44 shows the path of the electron beam EB, which is obtained when a voltage is applied to only the electrostatic deflector 30A of the electrostatic deflectors 30A, 30B positioned within the electromagnetic lens, to deflect the electron beam EB in direction x. The electrostatic deflector 30A is positioned so that the rotational angle $\theta_1$ is 0 relative to the x-axis around the z-axis. If there is no magnetic field present, the electron beam EB is deflected in direction of the x-axis when there is a deflection of the beam in the direction of the x-axis with the electrostatic deflector 30A. Now, the angle $\psi_1$ at the point at which the electron beam EB impacts on the wafer is determined relative to the x-axis, when there is a magnetic field present due to the electromagnetic lens. The angle $\psi_1$ is determined by the force applied to the electron beam EB by the magnetic field of the electromagnetic lens after the electron beam EB is deflected by the electrostatic deflector 30A and becomes offset from the z-axis before it reaches the wafer.

Figure 45:
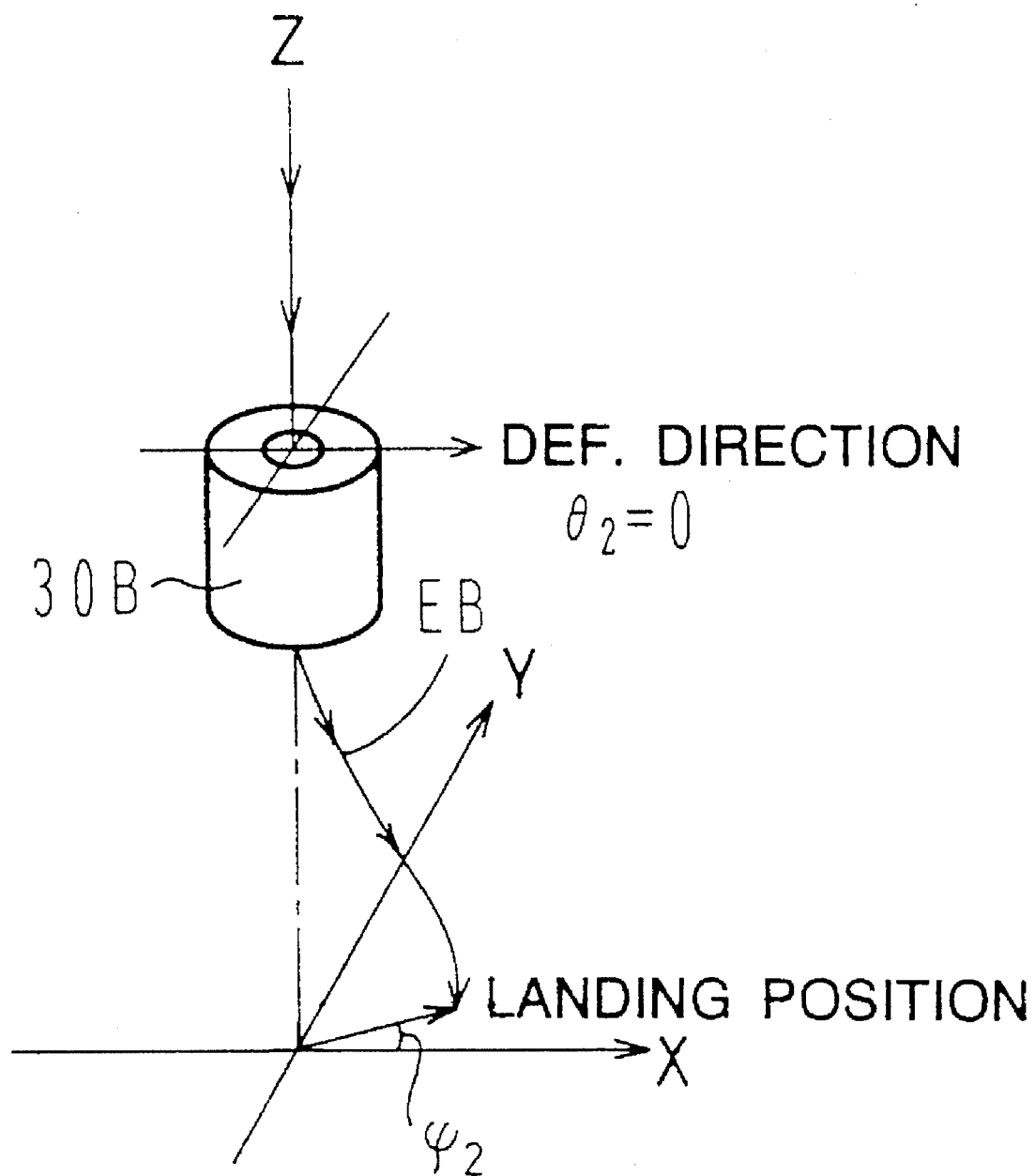
FIG. 45 shows a path of an electron beam and its landing position on the wafer when the second stage electrostatic deflector is used.

FIG. 45 shows the path of the electron beam EB which is obtained when a voltage identical to that shown in FIG. 44 is applied to only the electrostatic deflector 30B of the electrostatic deflectors 30A, 30B positioned within the electromagnetic lens, to deflect the electron beam EB in direction x. The electrostatic deflector 30B is positioned so that the rotational angle $\theta_2$ is 0 relative to the x-axis around the z-axis. Now, the angle $\psi_2$ at the point at which the electron beam EB impacts on the wafer relative to the x-axis, when there is a magnetic field present due to the electromagnetic lens is determined. The angle $\psi_2$ is determined by the force applied to the electron beam EB by the magnetic field of the electromagnetic lens after the electron beam EB is deflected by the electrostatic deflector 30B and becomes offset from the z-axis before it reaches the wafer.

Figure 46:
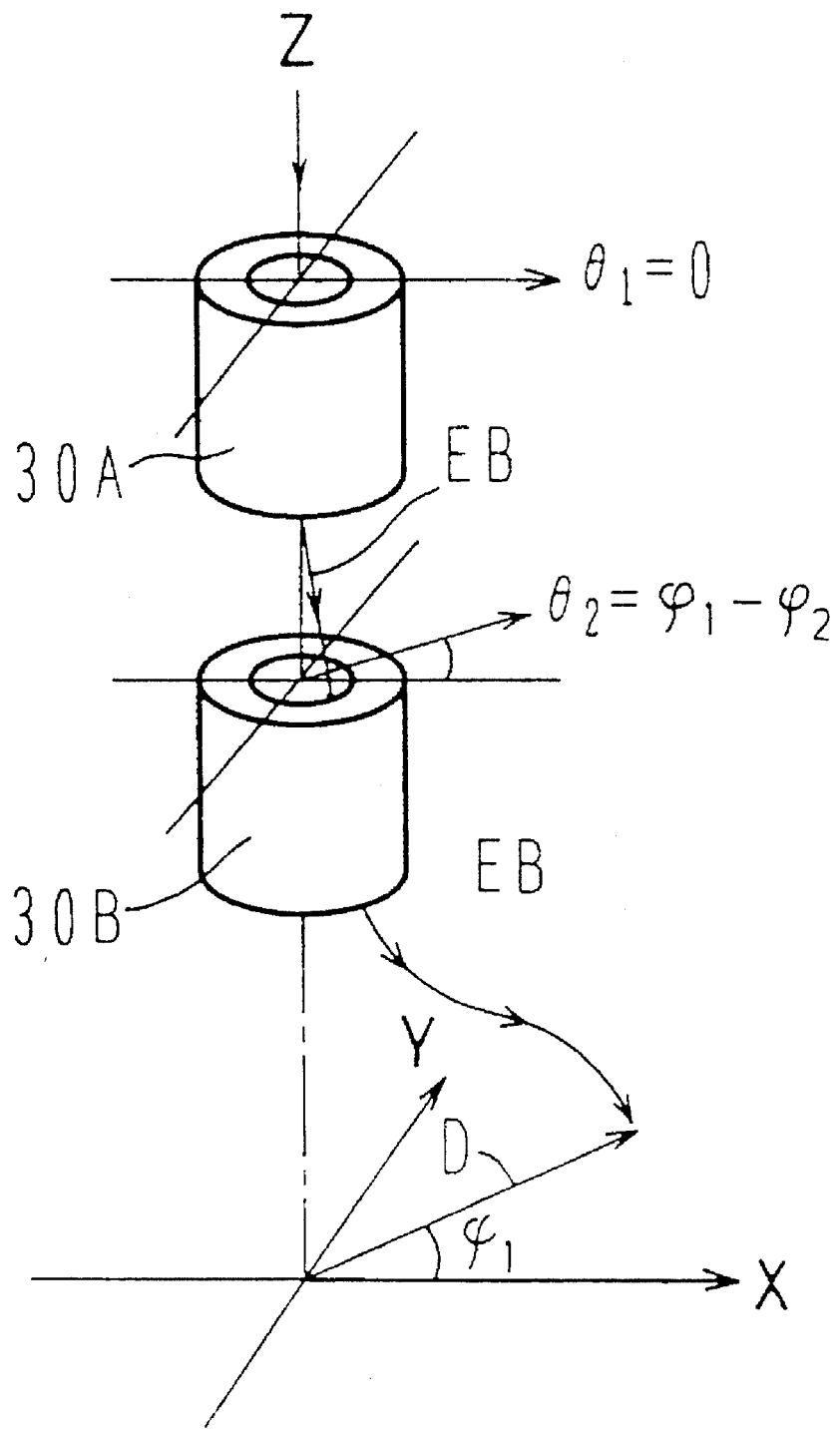
FIG. 46 shows a path of an electron beam and its landing position on the wafer when the first and the second stage electrostatic deflectors are used.

In FIG. 46, the rotational angle of the electron beam EB on the plane of incidence of the electrostatic deflector 30A relative to the x-axis around the z-axis in the case shown in FIG. 44 is approximately $\psi_1-\psi_2$.

Consequently, with the electrostatic deflectors 30A and 30B respectively positioned at $\theta_1=0$ and $\theta_2=\theta=\psi_1-\psi_2$, the angle at the point at which the electron beam EB impacts on the wafer relative to the x-axis is approximately $\psi_1-\psi_2+\psi_2=\psi_1$ and the deflection quantity of the electron beam EB on the wafer is at an approximate maximum.

FIFTEENTH EMBODIMENT

Figure 47:
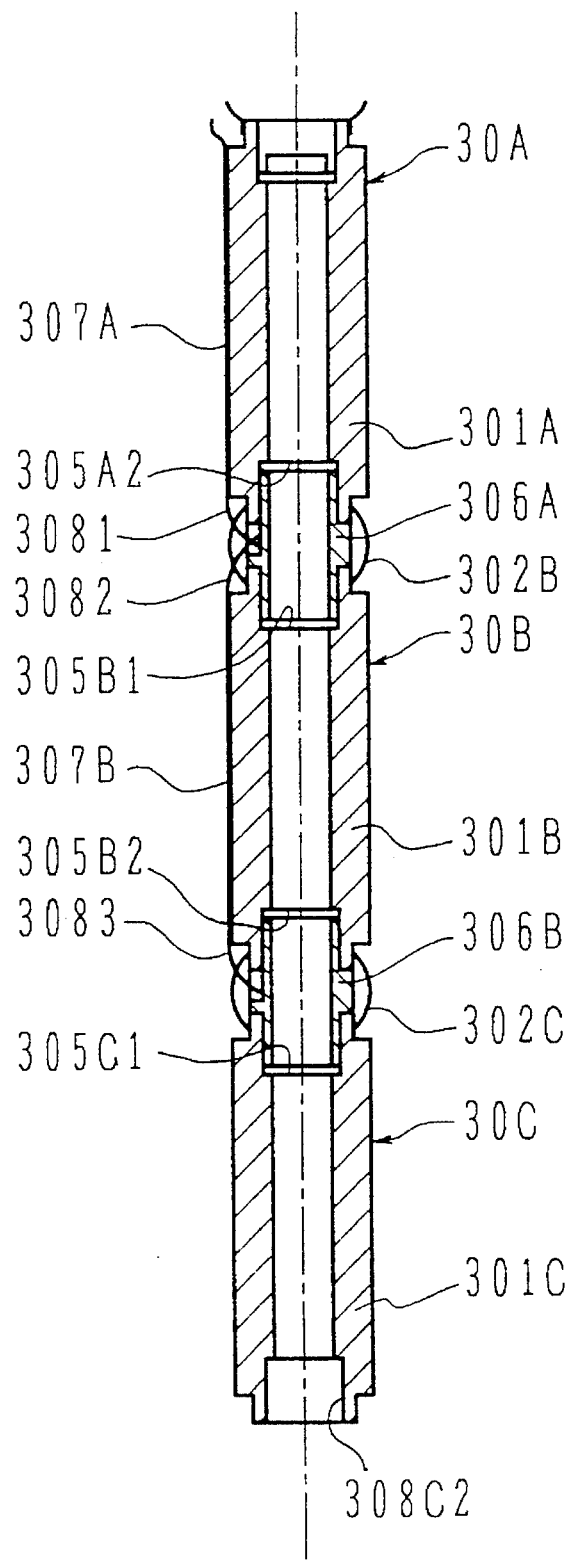
FIG. 47 is a perspective view of the electrostatic deflector in the fifteenth embodiment according to the present invention.
Figure 48:
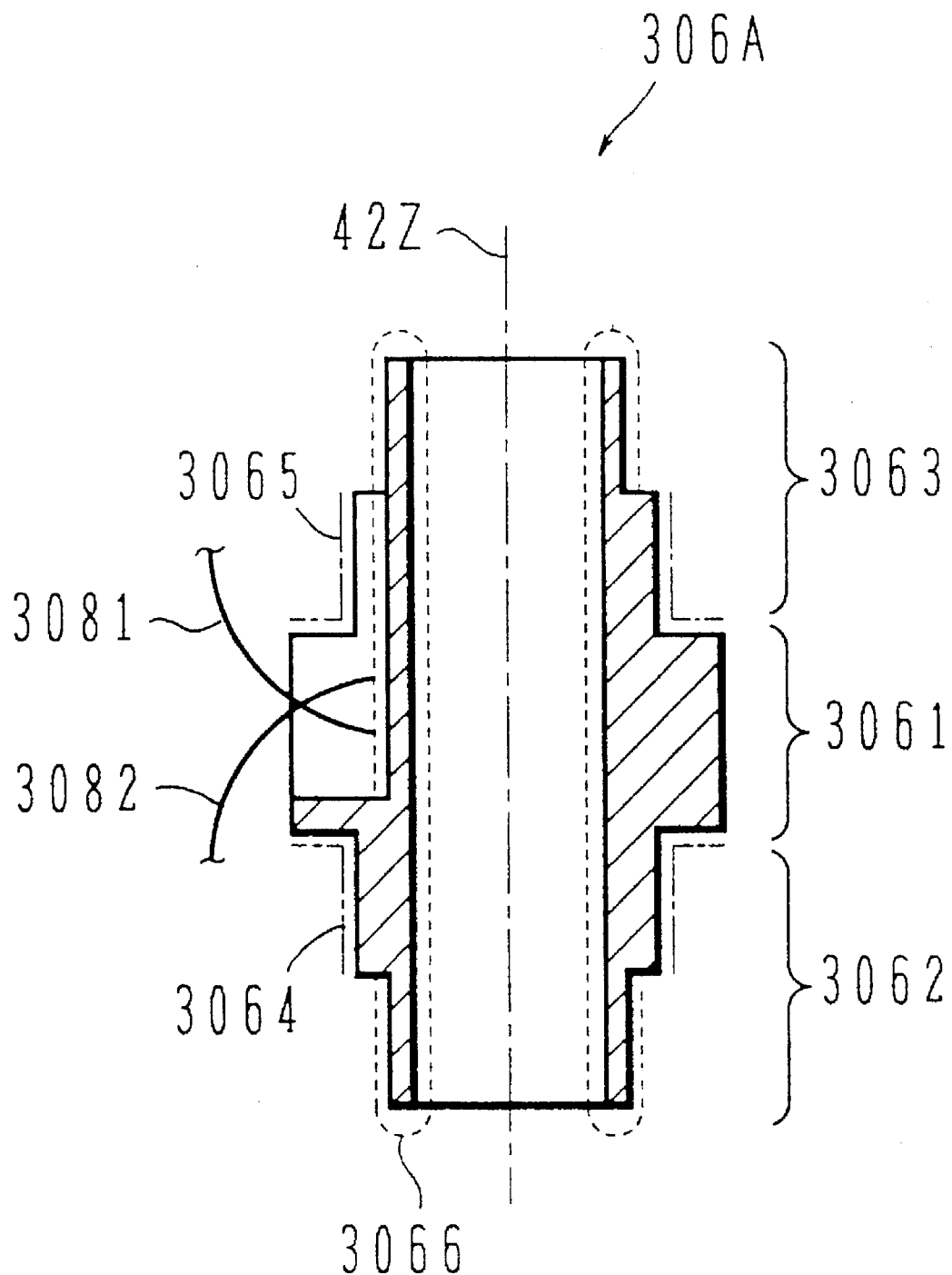
FIG. 48 is an enlarged cross sectional view of a connecting member shown in FIG. 47.

FIG. 47 is a cross section of the three-stage electrostatic deflectors according to the fifteenth embodiment. FIG. 48 is a cross section showing the connecting member in FIG. 48 in more detail.

The electrostatic deflectors 30A to 30C are structured identically. Indented portions are formed on both ends of cylindrical members 301A to 301C so that a connecting member 305A can be fitted in concentrically between the indented portions 305A2 and 305B1 which face opposite each other in the electrostatic deflectors 30A and 30B and a connecting member 305B is fitted in concentrically between the indented portions 305B2 and 305C1 which face opposite each other in the electrostatic deflectors 30B and 30C. This arrangement enables setting of the angle mentioned above between the electrostatic deflectors which are adjacent to each other in the direction of the axis.

The inner diameter of the cylindrical members 301A to 301C may be 6 mm, for example, and the length of each electrostatic deflecting electrode in the direction of the z-axis may be 20 mm.

The electrostatic deflecting electrodes of the electrostatic deflectors 30A to 30C are structured identically to those of the electrostatic deflector 30A shown in FIG. 43 except that they have stages of more large inner diameter at their ends.

The connecting members 306A and 306B are structured identically to each other. They are formed as a unit of ceramic, for instance, and are hollow, as shown in FIG. 48. Each consists of a base portion 3061 and protruding portions 3062 and 3063 on both ends of the base portion 3061.

The portions indicated with a one point chain line, 3064 and 3065 of the projected portions 3062 and 3063, and the areas toward the base portion 3061, are the areas that come in direct contact with the electrode end portions of the electrostatic deflector and in order to prevent shorting between the electrodes inside the same electrostatic deflector, these portions are insulators. At the same time, a gold plate film 3066 as indicated with the broken line, is formed on the inner surface of the connecting member 11, the outer surface of the base portion 3061 where it does not contact the electrostatic deflecting electrodes and the ends of the projected portions 3063, 3062.

The corresponding electrostatic deflecting electrodes of the electrostatic deflectors 30A and 30B, and the corresponding electrostatic deflecting electrodes of the electrostatic deflectors 30B and 30C, are connected though the wires 302B and 302C respectively, as in the case shown in FIG. 43. The wiring films 307A and 307B formed on the surfaces of the cylindrical members 301A and 301B are grounded and they are electrically connected with the gold plate film 3066 of the connecting members 306A and 306B via wires 3081 to 3083. This prevents the inner surfaces of the connecting members, which are constituted of insulating bodies, from becoming charged, which could cause a deflection of the electron beam EB.

The deflection efficiency improves if the length of each electrostatic deflector in the direction of the axis is reduced and the number of stages over which electrostatic deflectors are provided is increased. However, if there are many of these stages, it becomes difficult to maintain the accuracy of relative phase shift between the electrostatic deflectors, and the structures of the electrostatic deflectors become more complicated. Therefore, the number of stages should be two or three.

The fourteenth and fifteenth embodiments described above include a number variations.

For instance, the number of stages of electrostatic deflectors may be more than three, as the deflection efficiency improves if the length of each electrostatic deflector in the direction of the axis is reduced and the number of stages over which electrostatic deflectors are provided is increased. However, as explained above, if there are many of these stages, it becomes difficult to maintain the accuracy of relative phase shift between the electrostatic deflectors, and the structures of the electrostatic deflectors become more complicated. Therefore, the preferred number of stages is two or three.

In addition, while the shape of the electrostatic deflecting electrodes is linear, as described above, which facilitates processing in which a cylindrical members of ceramic are formed by injection molding, if possible, it is desirable to shape them in a spiral along the z-axis, i.e., a continuous multi-stage structure, as the shape will improve the deflection efficiency.

SIXTEENTH EMBODIMENT

Figure 49:
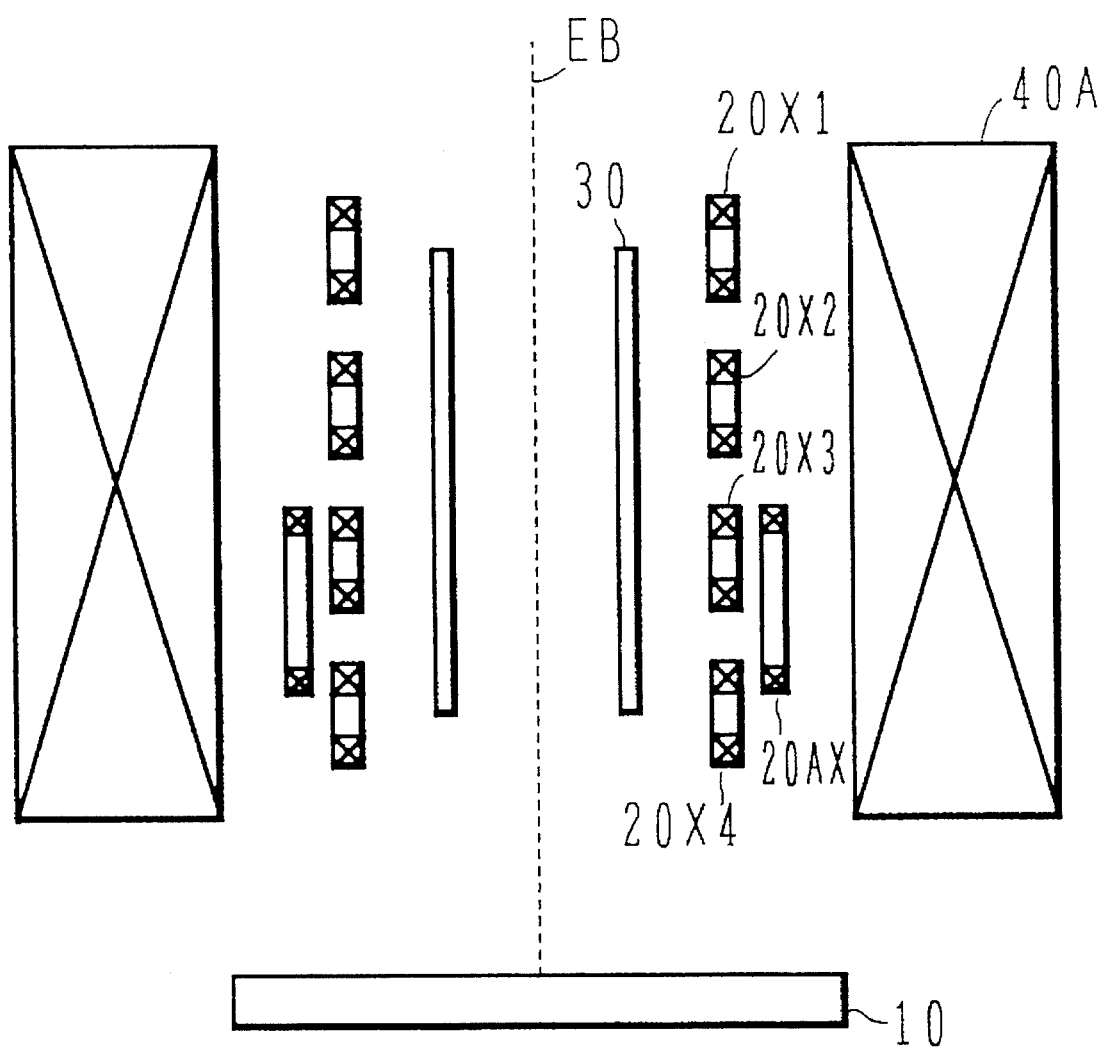
FIG. 49 is an schematic cross sectional view of a deflector positioned on the inside of an electromagnetic lens in the 16th embodiment according to the present invention.

FIG. 49 is a schematic cross section showing the basic structure of the deflector and its periphery in the sixteenth embodiment. This cross section intersects the optical axis and the Y-axis.

Four stages of electromagnetic main deflectors 20X1 to 20X4 with their coils are connected in series (equivalent to the main deflector 20X in FIG. 50) for deflecting an electron beam EB in direction X are positioned, separated from one another in the direction of the optical axis, on the inside of the electromagnetic lens 40A, for converging the electron beam at the last stage. A single-stage electromagnetic auxiliary deflector 20AX for deflecting the electron beam EB in direction X is positioned in the vicinity of the main deflectors 20X1 to 20X4. The single-stage electromagnetic auxiliary deflector 20AX is provided with a pair of coils facing opposite each other across the optical axis just as each stage of the main deflectors 20X1 to 20X4 is, and these coils are connected in series. For instance, while the deflection area is −1 to 1 mm and the coils have a total or 80 turns in the main deflectors 20X1 to 20X4, the auxiliary deflector 20AX has a deflection area of −50 µm to 50 µm and the coils have one turn. A main deflector and an auxiliary deflector for deflecting the electron beam EB in direction Y within a cross section intersecting the optical axis and the X-axis are positioned identically to that described above.

A number of different arrangements are possible for positioning of the auxiliary deflector and the structure may have, for example, auxiliary deflectors with their coils connected in series positioned to correspond with each stage of the main deflector, or, auxiliary deflectors with their coils connected in series may be provided in correspondence with only some of the stages.

Figure 52A:
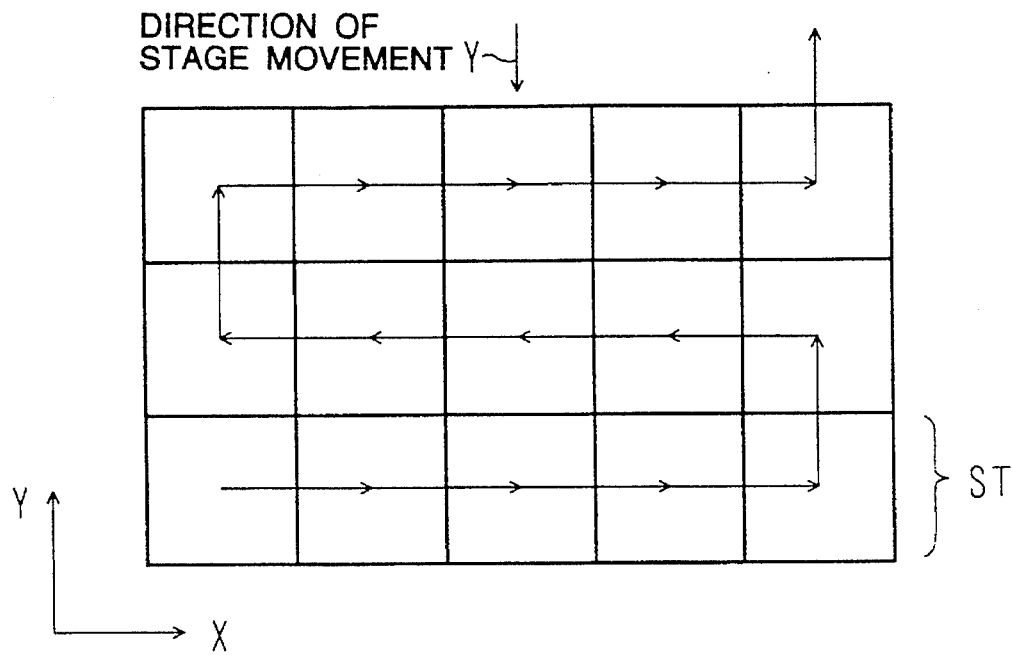
FIG. 52A shows the scanning method in the main deflector.

As shown in FIG. 52A, main scanning is performed by the main deflectors and the auxiliary deflector as indicated with the arrows between square subfields, one side of which may be, for example, $2a=100$ µm. The actual number of subfields in the stripe ST, may be, for instance, 20. Within the subfields, sub scanning is performed at high speed by a sub deflector as shown, for example, in FIG. 3. The stage is moved continuously in direction −Y.

Figure 52B:
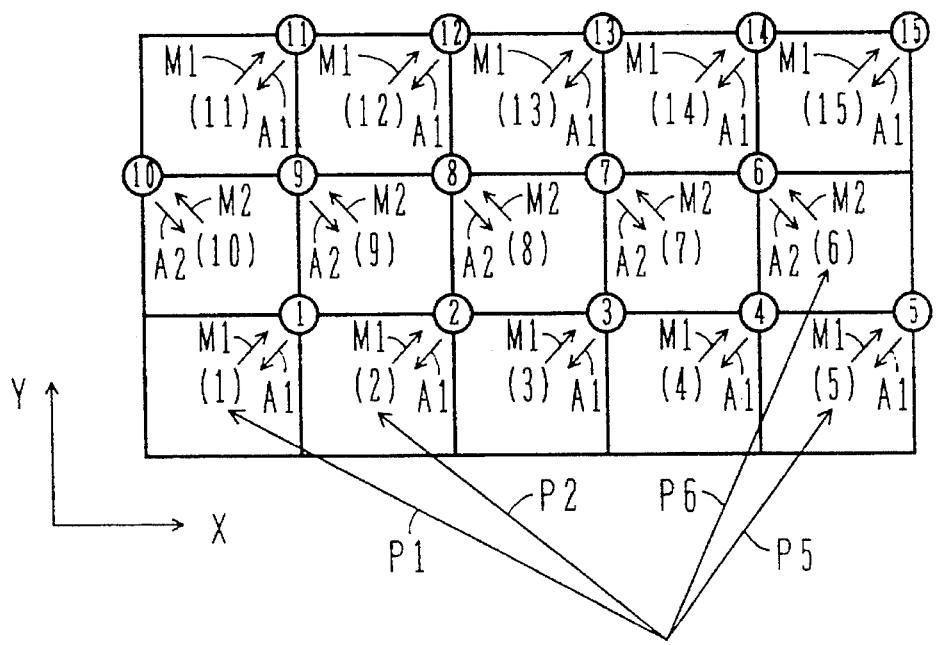
FIG. 52B shows the vectors that are set in the register in the drive circuit in FIG. 50 when the main scanning position is at the center of each subfield.

As shown in FIG. 52B, the position vectors P of the centers (1) to (15) of the subfields are assigned P1, P2, . . . . FIG. 52B shows a situation in which the vector M is either M1 or M2. The meaning of the vectors M and A will be made clear later on. Generally speaking, the vector $M=(\lambda a, \mu a)$ is determined by which of the four main scanning types is employed (scanning information). When ST is scanned in direction X, $\lambda=1$, when ST is scanned in direction −X, $\lambda=-1$, when ST is formed towards direction Y, $\mu=1$, and when ST is formed towards direction −Y, $\mu=-1$. The direction of vector A is the reverse of vector M and A1−M1=0 and A2+M2=0.

Figure 50:
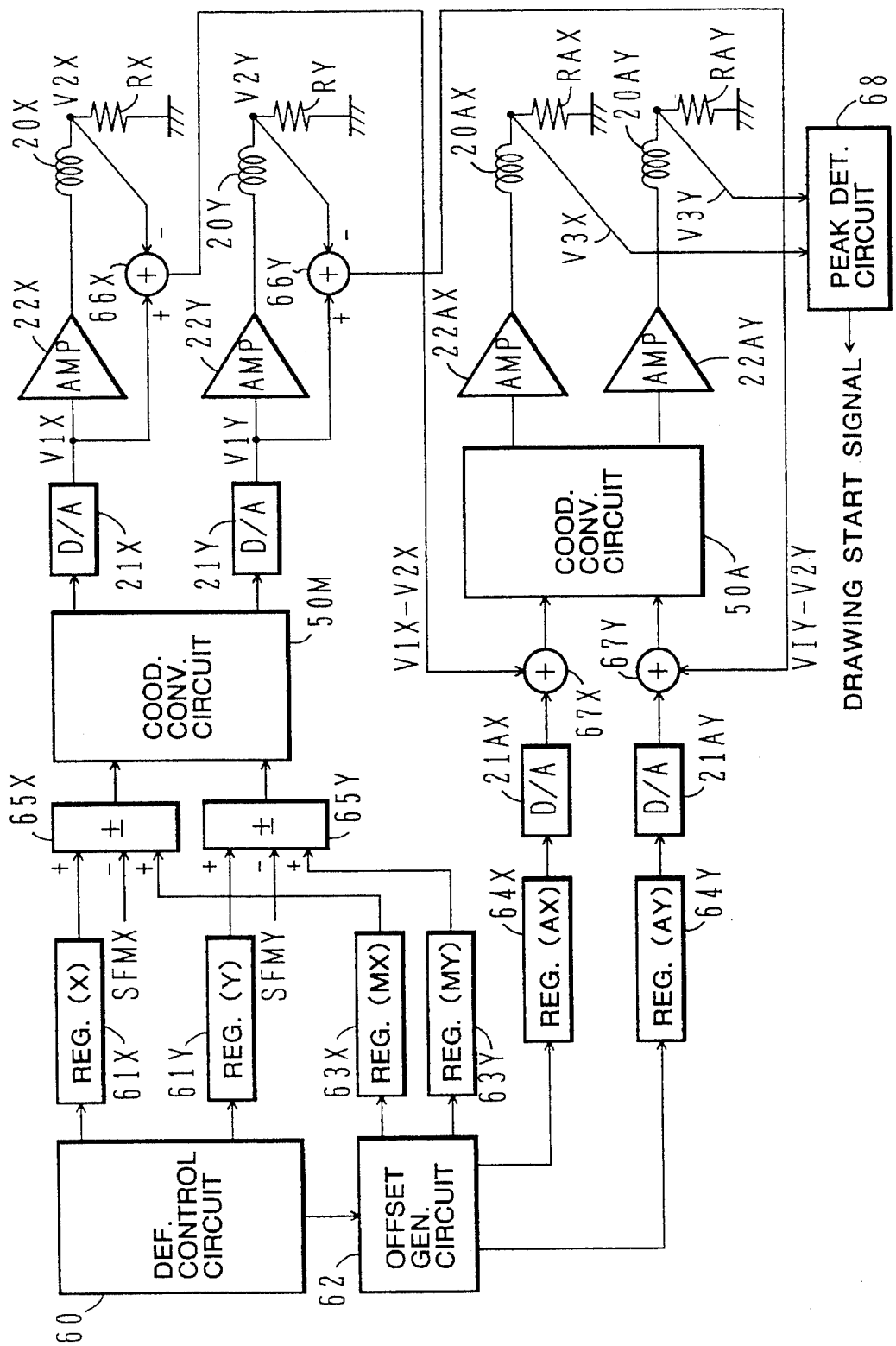
FIG. 50 shows a drive circuit for the main deflector and the auxiliary deflector shown in FIG. 49.

FIG. 50 shows the drive circuit for the main deflectors and the auxiliary deflector.

The deflection control circuit 60 writes the position vector $P=(X,Y)$ at the center of a subfield in the registers 61X and 61Y. The offset generating circuit 62 writes the vector $M=(MX, MY)$ described above in the registers 63X and 63Y, and the vector $A=(AX, AY)$ described above in the registers 64A and 64Y, based upon the scanning information sent from the deflection control circuit 60.

With the vector of the stage feedback quantity, i.e., the vector SFM, which is expressed with the sum of the portion corresponding with the main deflectors SFM and the portion corresponding to the sub deflector SFS, indicated as (SFMX, SFMY), X+MX−SFMX is calculated by the adder/subtractor 65X, and Y+MY−SFMY is calculated by the adder/subtractor 65Y. The results are supplied to the X-component input end and the Y-component input end respectively, of the coordinate conversion circuit 50M.

The coordinate conversion circuit 50M corrects positional errors of the main deflectors 20A and 20Y and corrects differences in deflection sensitivity between the main deflector 20X and the main deflector 20Y and the like, and performs matrix calculation. In an ideal situation, the coordinate conversion circuit 50M functions as a unit matrix.

Figure 51:
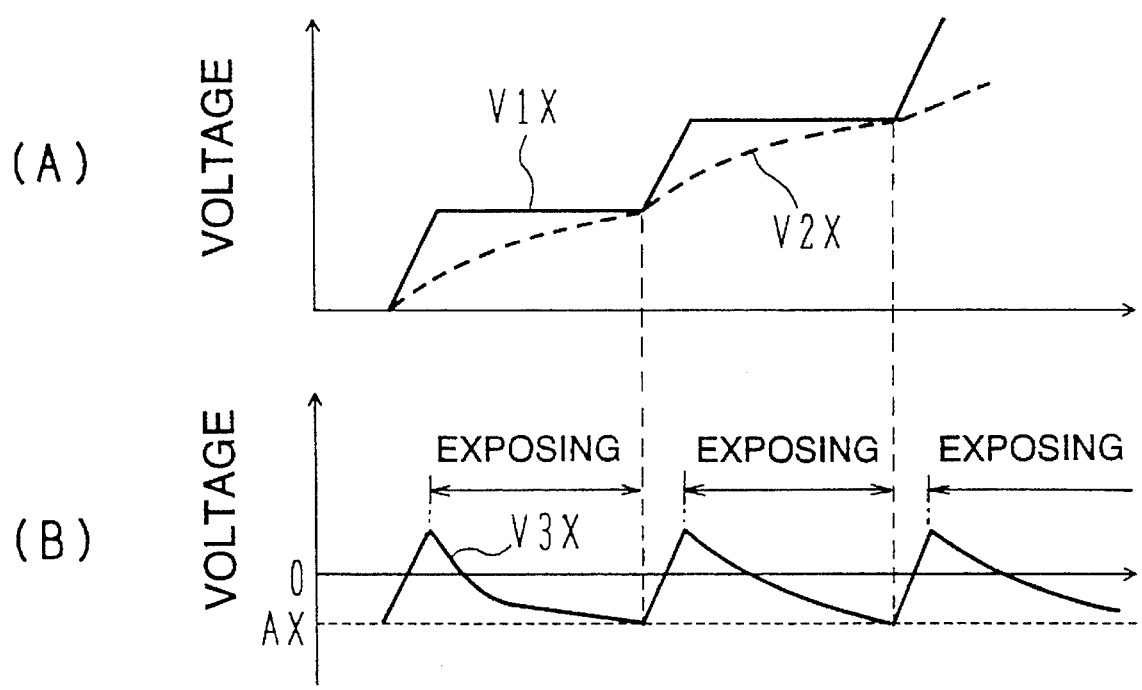
FIG. 51 is a waveform diagram showing the response of the main deflector and the auxiliary deflector.

The X component and the Y component in the output of the coordinate conversion circuit 50M are converted to analog at the D/A converters 21X and 21Y respectively and become the voltages V1X and V1Y respectively. The voltage V1X is current amplified at the amplifying circuit 22X and supplied to the main deflector 20X and the voltage V1Y is current amplified at the amplifying circuit 22Y and supplied to the main deflector 20Y. One end of the main deflector 20X is connected to a ground line via the resistor RX and one end of the main deflector 20Y is connected to a ground line via the resistor RY for voltage detection. The voltages detected at the resistors RX and RY are referred to as voltages V2X and V2Y respectively. The resistance values at the resistors RX and RY are selected so that V2X=V1X and V2Y=V1Y in a steady state. V1X−V2X and V1Y−V2Y are calculated by the subtractors 66X and 66Y respectively. As shown in FIG. 51A, the voltage V2X responds mildly to a step change in the voltage V1X, due to the inductance of the main deflector 20X.

AX is converted to analog by the D/A converter 21X, added to V1X−V2X by the adder 67X and then supplied to the X-component input end of the coordinate conversion circuit 50A, AY is converted to analog by the D/A converter 21Y, added to V1Y−V2Y by the adder 67Y and then supplied to the Y-component input end of the coordinate conversion circuit 50A.

The coordinate conversion circuit 50A corrects positional errors of the auxiliary deflectors 20AX and 20AY and differences in deflection sensitivity between the auxiliary deflector 20AX and the auxiliary deflector 20AY and the like, and performs matrix calculation. In an ideal situation, the coordinate conversion circuit 50A functions as a unit matrix. The magnetic fields of the auxiliary deflectors 20AX and 20AY are small; approximately 1/80 of those of the main deflectors 20X and 20Y and, therefore, only linear conversion will suffice for the coordinate conversion circuit 50A. In contrast, the conversion performed by the coordinate conversion circuit 50M includes a term of the product XY which takes into consideration distortion.

The X component in the output of the coordinate conversion circuit 50A is current amplified by the amplifying circuit 22AX and then supplied to the auxiliary deflector 20AX and the Y component in the output of the coordinate conversion circuit 50A is current amplified by the amplifying circuit 22AY and then supplied to the auxiliary deflector 20AY. One end of the auxiliary deflector 20AX is connected to a ground line via the resistor RAX and one end of the auxiliary deflector 20AY is connected to a ground line via the resistor RAY for voltage detection. The voltages V3X and V3Y detected at the resistors RAX and RAY are supplied to the peak detection circuit 68 where peak point in time that is equal to or exceeds a set value is detected and this peak point in time is output as a drawing start signal.

As shown in FIG. 51B, the inductance of the auxiliary deflector 20AX is small, for example, approximately 1/80 that of the main deflector 20X and, therefore, the voltage V3X responds to a step change of the voltage V1X quickly.

The operation of the drive circuit described above is explained below. To simplify the explanation, it is assumed that both the stage feedback quantities SFMX and SFMY are 0 and that the coordinate conversion circuits 50M and 50A both function as unit matrices.

The registers 63X, 63Y, 64X and 64Y are over-written for each stripe ST.

First, we examine a situation in which shifting is performed from the center (1) to the center (2) of the subfields in FIG. 52B.

Immediately before the shifting starts, the coordinates of the position vector P1 are already written in the registers 61X and 61Y, the coordinates of the vector M1 are already written in the registers 63X and 63Y, the coordinates of the vector A1 are already written in the registers 64X and 64Y and V1X=V2X and V1Y=V2Y. The position vector Q (main deflection vector) of the electron beam EB on the wafer when the electron beam EB is deflected only by the main deflectors 20X and 20Y, is P1+M1, to which the deflection performed by the auxiliary deflectors 20AX and 20AY is added, so that Q+A1=P1+M1+A1=P1 for the position vector (deflection vector) of the electron beam EB on the wafer (FIG. 53A).

The shifting is started by writing the coordinates of the position vector P2 in the registers 61X and 61Y. With this, the voltage V1X step changes and V1X–V2X changes rapidly. There is no change in the voltage V1Y and so V1Y remains equal to V2Y. With the auxiliary deflection vector B=A1+S, S=(V1X–V2X, 0), the magnetic field generated by the auxiliary deflector 20AX changes rapidly. This causes the vectors Q, S and B to change as in FIGS. 53A through 53E in that order. In FIG. 53C, the deflection vector has already settled at Q+B=P2, enabling the start of drawing.

Figure 53:
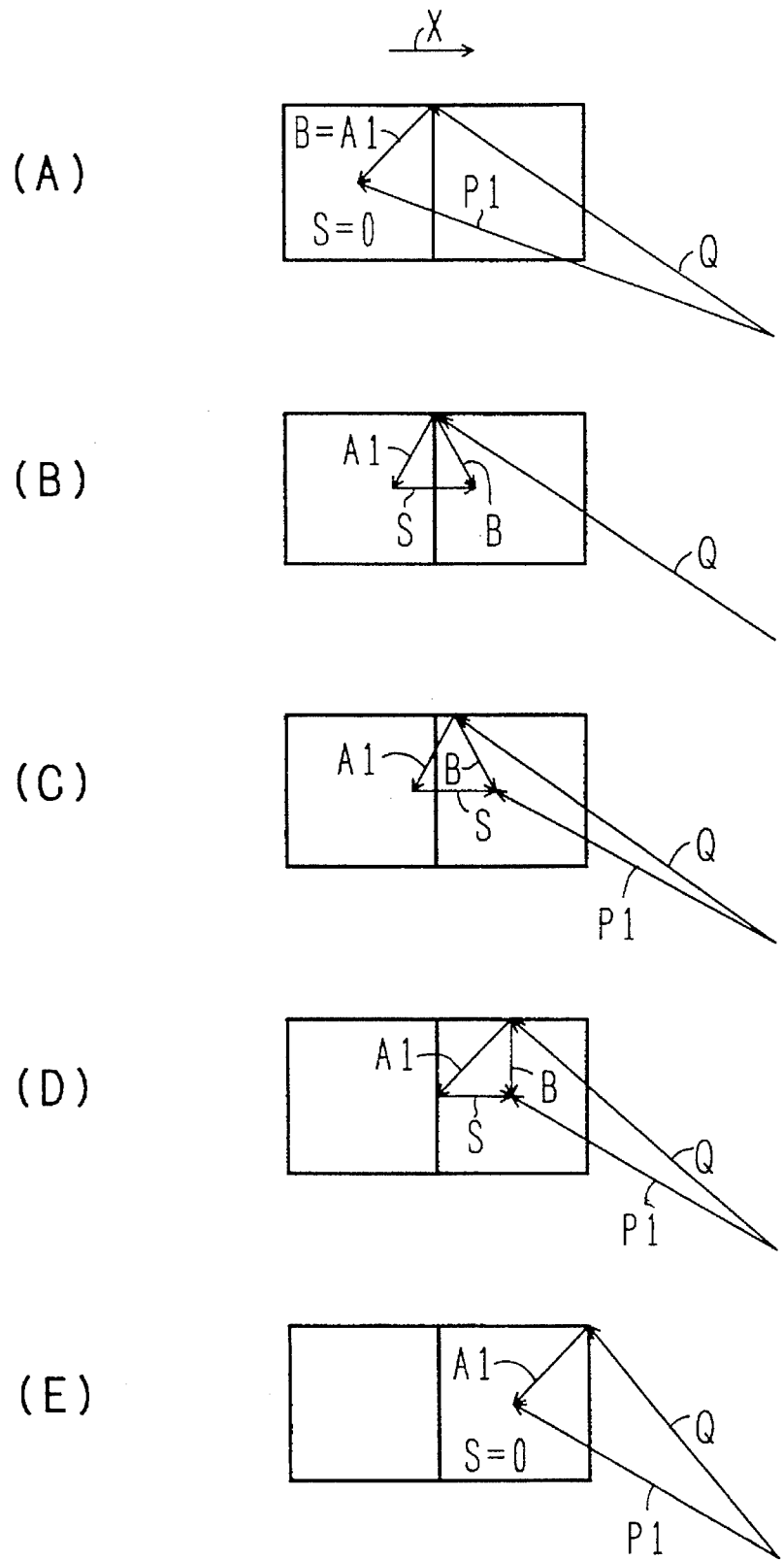
FIG. 53 shows the changes in the deflection vectors when shifting between subfields in direction X.

Roughly speaking, simply by setting the electric current flowing to the auxiliary deflector 20AX from the state shown in FIG. 53A to 0, the front end of the deflection vector Q+B moves by (a, 0). So the remaining half (a, 0) only has to be moved by the high-speed auxiliary deflector 20AX and the low-speed main deflector 20X.

Next, a situation in which shifting is performed from the center (5) to the center (6) of the subfields in FIG. 52B is explained.

Immediately before the shifting starts, the coordinates of the position vector P5 are already written in the registers 61X and 61Y, the coordinates of the vector M1 are already written in the registers 63X and 63Y, the coordinates of the vector A1 are already written in the registers 64X and 64Y and V1X=V2X and V1Y=V2Y. The vectors P5, Q and A1 at this point are shown in FIG. 54A.

The shifting is started by writing the coordinates of the position vector P6 in the registers 61X and 61Y, the coordinates of the vector M2 in the registers 63X and 63Y and by writing the coordinates of the vector A2 in the registers 64X and 64Y. With this, the voltages V1X and V1Y change in steps and V1X–V2X and V1Y–V2Y changes rapidly. Due to the auxiliary deflection vector B=A2+S, S= (V1X–V2X, V1Y–V2Y), the magnetic fields generated by the auxiliary deflectors 20AX and 20AY change rapidly. This causes the vectors Q, S and B to change as in FIGS. 54A through 54E in that order. In FIG. 54C, the deflection vector has already settled at Q+B=P6, enabling the start of drawing.

Figure 54:
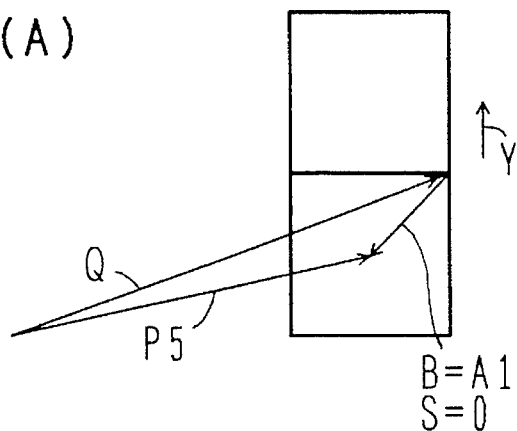
FIG. 54 shows the changes in the deflection vectors when shifting between subfields in direction Y.
Figure 54:
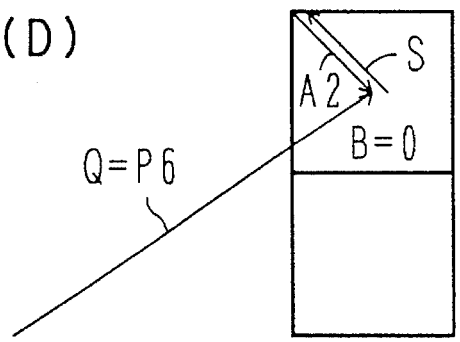
Figure 54:
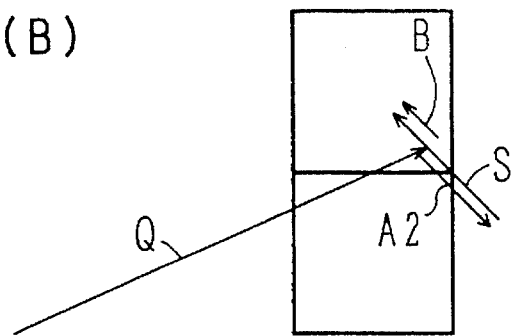
Figure 54:
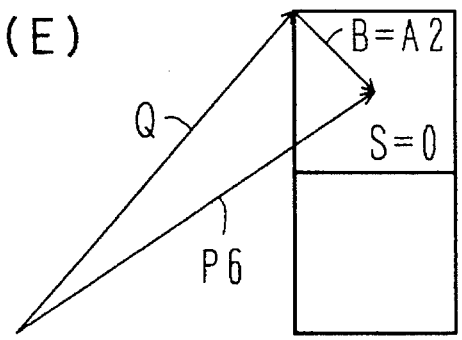
Figure 54:
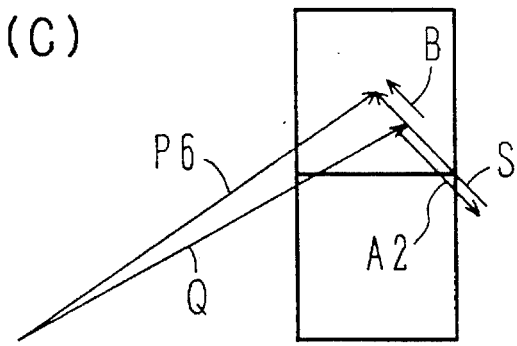

Roughly speaking, simply by setting the electric currents running to the auxiliary deflector 20AX and the main deflector 20Y from the state shown in FIG. 54A to 0, the front end of the deflection vector Q+B moves to 5 from the position (5) shown in FIG. 52B and the remaining (–a, a) only has to be moved with the high-speed auxiliary deflector 20AX and the main deflector 20Y and the low-speed main deflectors 20X and 20Y.

In any of the operations described above, the absolute value of the movement range of the vector B is equal to or smaller than a. Thus, by reducing the number of turns of the coils of the auxiliary deflectors 20AX and 20AY, it is possible to speed up their response compared to that achieved with the main deflectors 20X and 20Y.

Figure 52C:
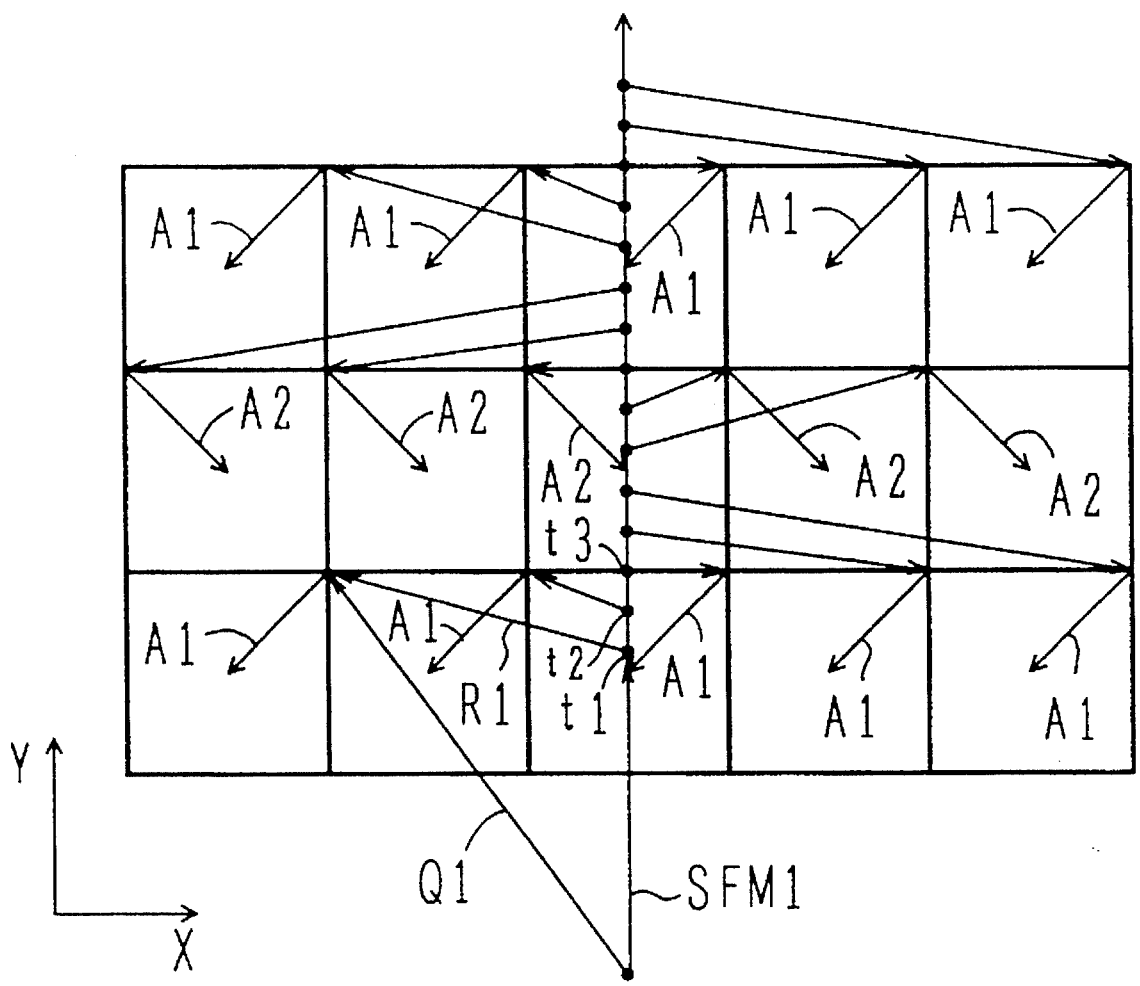
FIG. 52C shows deflection vectors of the main deflector and the auxiliary deflector with the stage feedback quantity taken into account when the main scanning position is at the center of each subfield.

FIG. 52C shows a vector relationship when the vector of the stage feedback quantity changes on the central line in the direction opposite to the direction in which the stage moves as scanning of the stage progresses. As it is not necessary for the deflectors to deflect the distance the stage moves, the quantities of deflection performed by the main deflectors 20X and 20Y become smaller compared with the situation described above.

For instance, when the stage feedback quantity is at SFM1, subtraction is performed on this vector by the adders/subtractors 65X, 65Y in FIG. 50, and the main deflection vector Q=Q1 becomes vector R1=Q1–SF1. The front end of the vector of the stage feedback quantity changes from t1 to t2 and to t3 in that order every time shifting is performed between subfields in FIG. 52C.

Figure 55A:
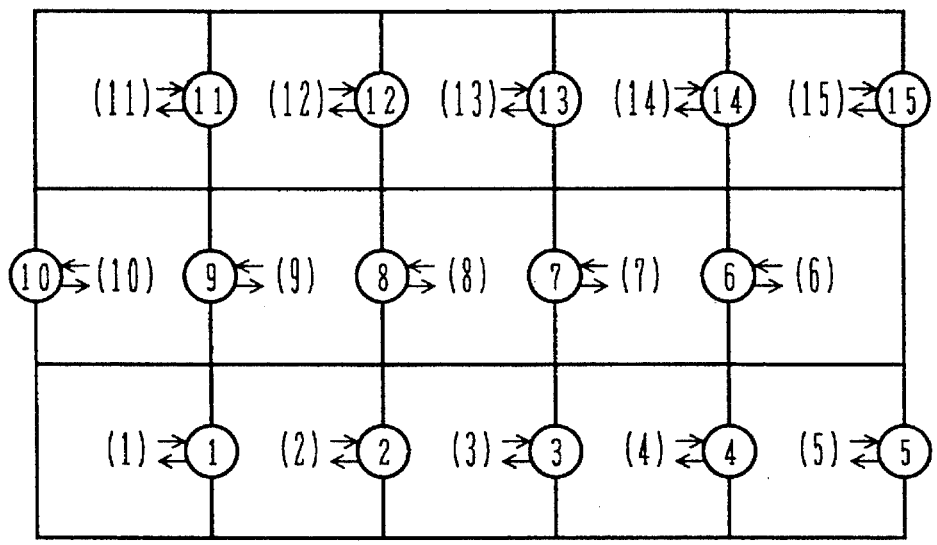
FIGS. 55A and 55B show vectors in variations of the sixteenth embodiment, which correspond to those shown in FIG. 52B.
Figure 55B:
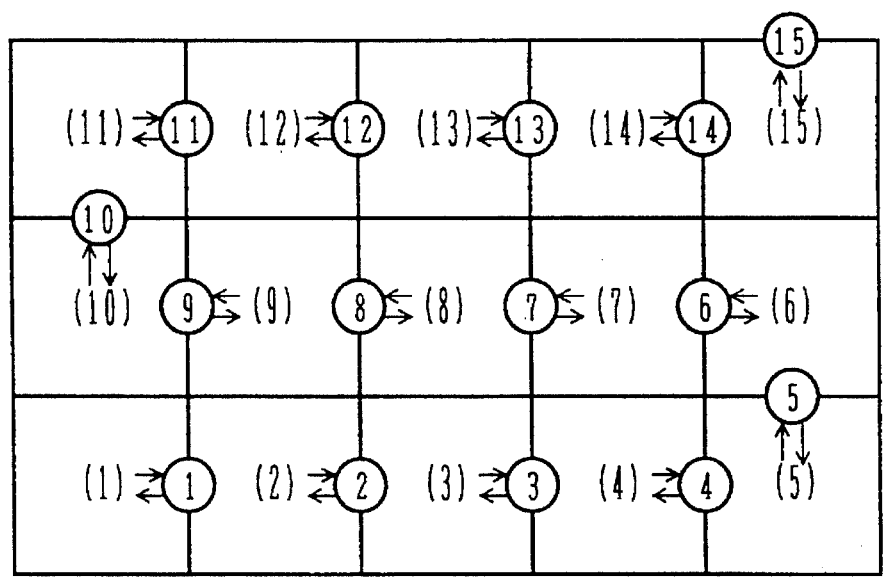

The way in which vectors M and A are obtained in FIG. 52B is only an example and a number of variations are possible. FIGS. 55A and 55B show other methods for obtaining vectors M and A, but in those cases too, identical advantages to those already discussed are achieved.

SEVENTEENTH EMBODIMENT

Figure 59:
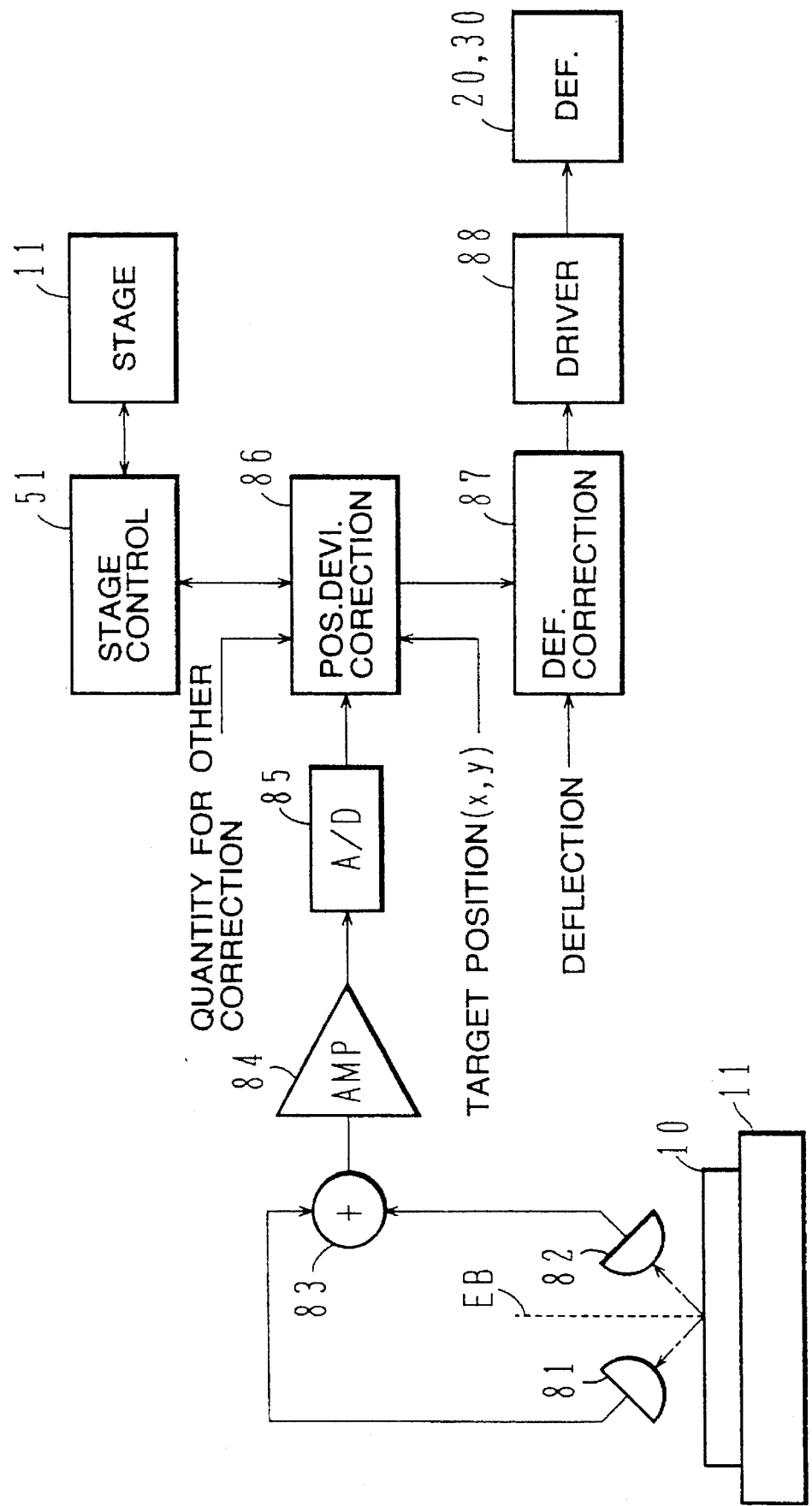
FIG. 59 is a block diagram showing the positional deviation correction portion of the exposure control device.

FIG. 59 shows the positional deviation correction portion of the exposure control apparatus for the charged particle beam exposure system.

When an electron beam EB is radiated on a semiconductor wafer 10, back-scattered electrons, which include secondary electrons, come from the irradiation point and they are detected by electron detectors 81 and 82 for detecting the positions of aligning marks on the semiconductor wafer 10.

Figure 60:
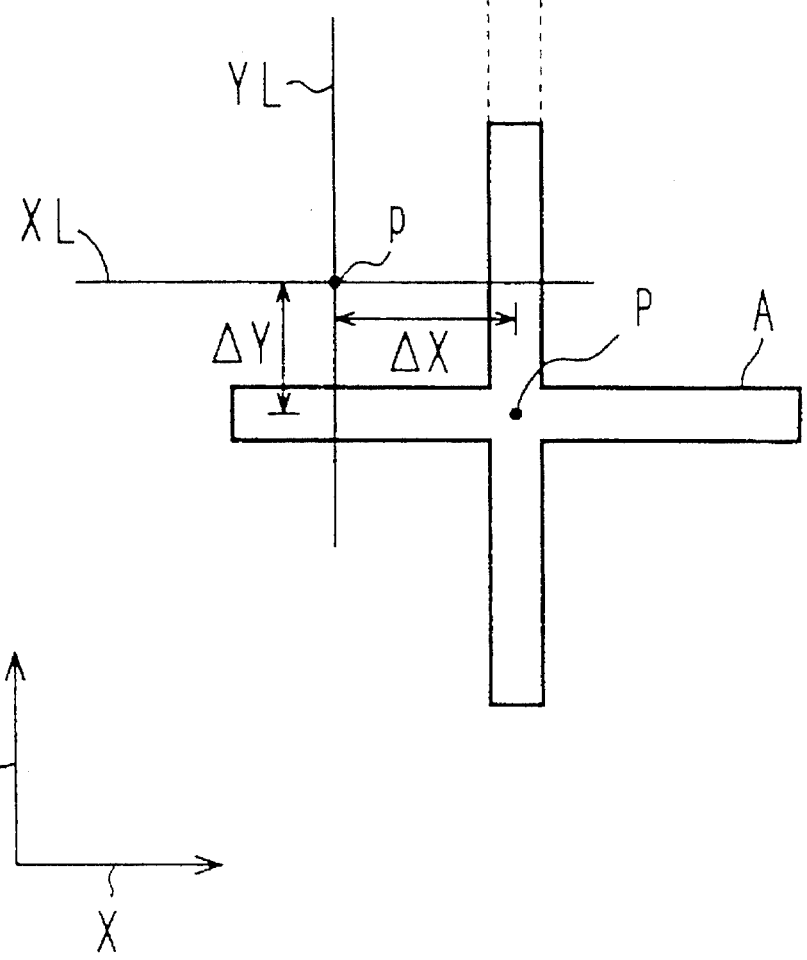
FIG. 60 illustrates the detection of the aligning mark positions.

When the mobile stage is driven in such a manner that the intersection (center) p of the aligning marks in design on the semiconductor wafer 10 is positioned on the optical axis, this position p is offset from the actual intersection P of the actual alignment marks A on the semiconductor wafer 10, as shown in FIG. 60. This positional deviation is caused by a positional deviation of the semiconductor wafer 10 relative to the mobile stage 11 and also by deformation, such as warping of the semiconductor wafer 10. The aligning marks A may be a pattern which projects out from or indents into the surface of the surrounding area. When the electron beam EB is scanned in direction X by the sub deflector 30, the sum of the outputs from the electron detectors 81 and 82 changes along the electron beam scanning line XL as shown in FIG. 60. The average position of the minimum values of this output corresponds to the position P of the aligning marks A. With this, the X component X of the offset vector from the position p to the position P can be determined. Likewise, the Y component Y of the offset vector is determined along the electron beam scanning line YL. In order to determine this offset vector, the position p is not required to be a design position that corresponds to the position P and it may be a position in the vicinity.

Figure 10:
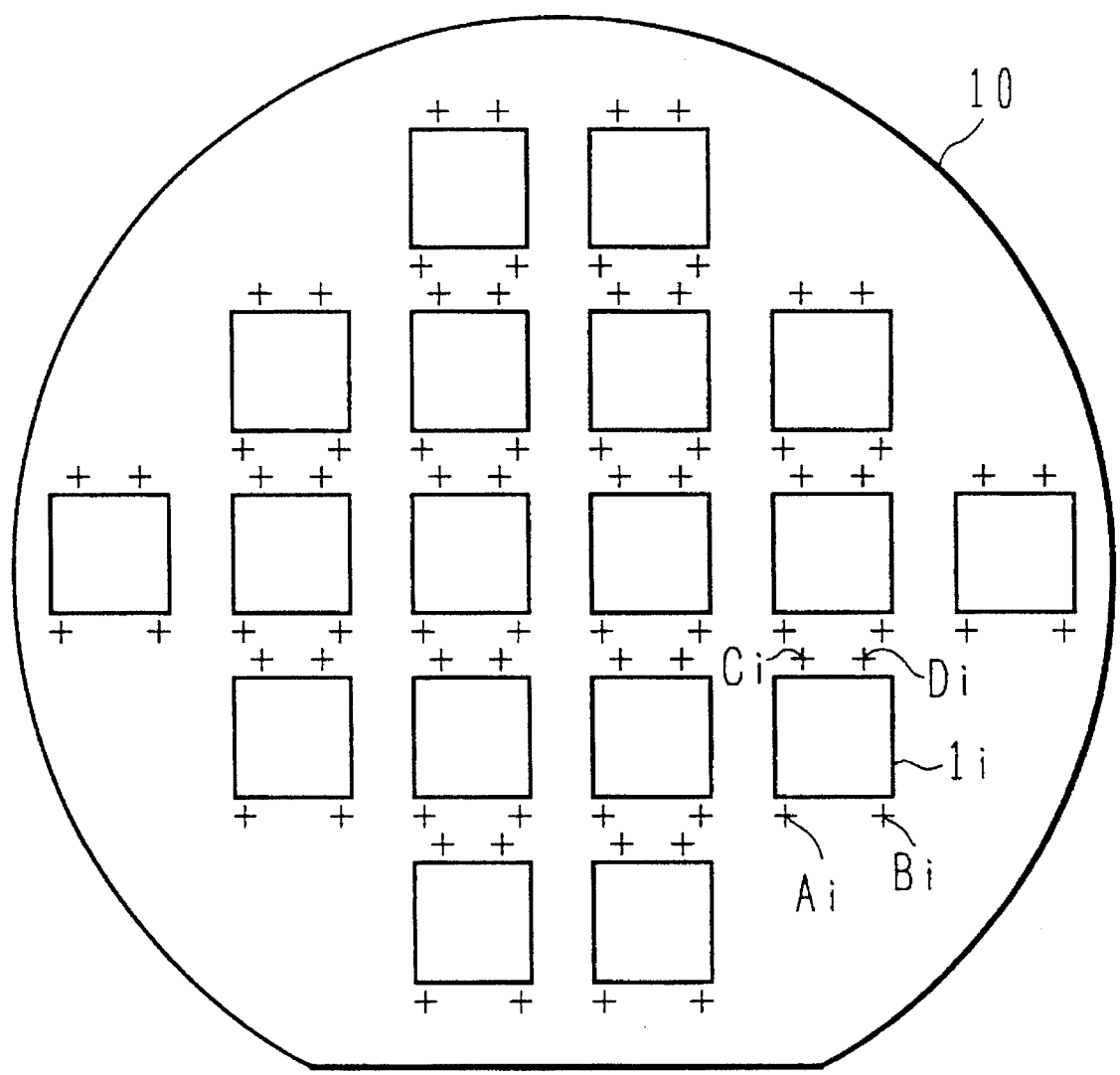
FIG. 10 shows chip areas and the aligning marks surrounding them on a semiconductor wafer.
Figure 57:
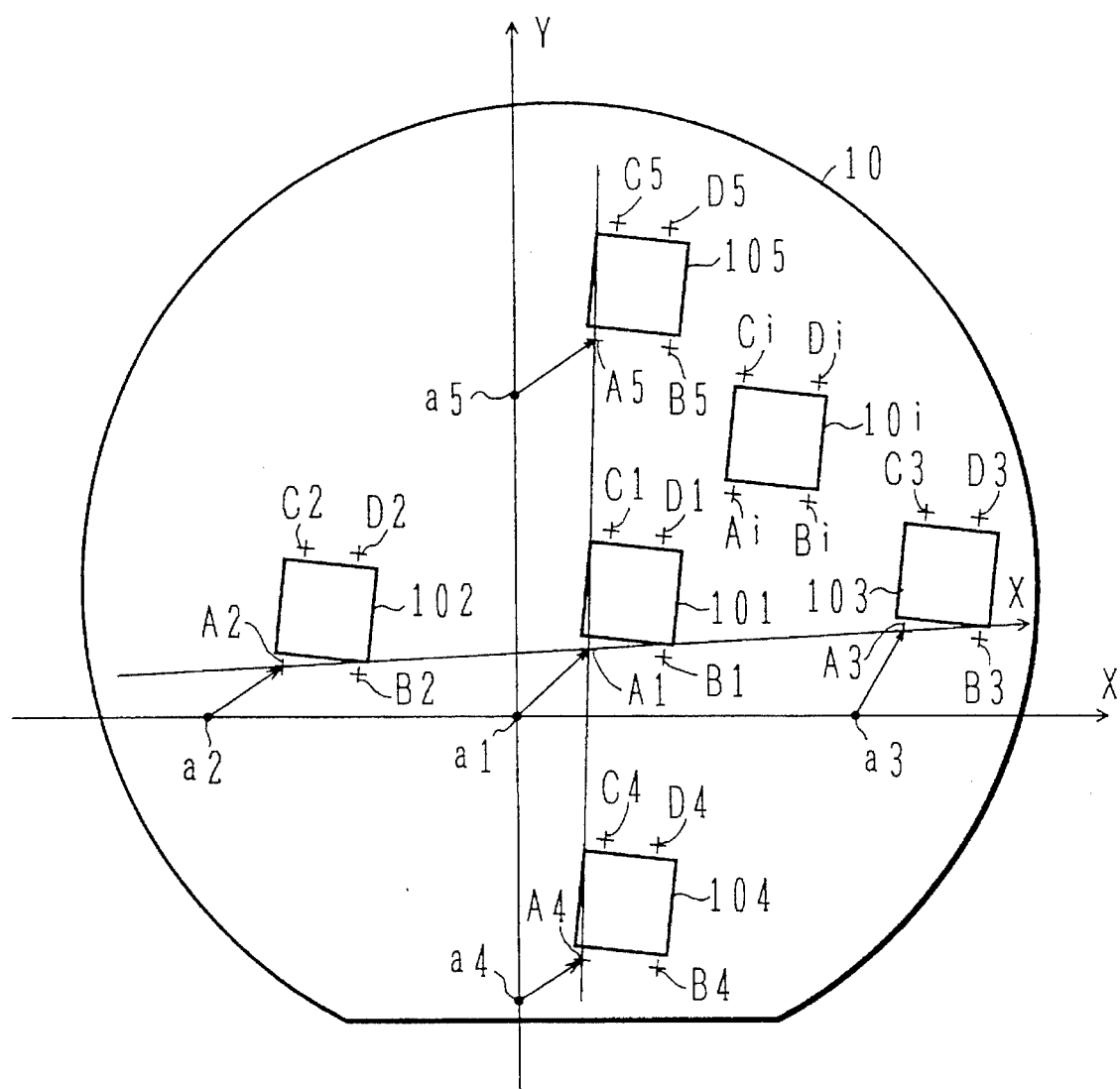
FIG. 57 illustrates the processing performed in step 72 in FIG. 56.

FIG. 57 shows the n number of chip areas 10i and part of the aligning marks Ai, Bi, Ci and Di surrounding them on the semiconductor wafer 10 shown in FIG. 10 with the positional deviation illustrated in an exaggerated manner. a1 to a5 are the aligning mark positions in design that correspond to the positions of the actual aligning marks A1 to A5. The X-axis is a straight line whose origin point is at the position a1 and which passes through the positions a2 and a3 and the Y-axis is a straight line perpendicular to the X-axis, whose origin point is at the position a1 and which passes through the positions a4 and a5. It is also feasible to consider the positions a1 to a5 as the positions of the actual aligning marks A1 to A5 (intersection positions, hereafter the same) on a coordinate system which is expressed with the x-axis and the y-axis as shown in the figure.

In FIG. 59, the outputs from the electron detectors 81 and 82 are supplied to an adder circuit 83 to be added together, amplified in the amplifying circuit 84, converted to digital at the A/D converter 85 and then supplied to the positional deviation correction circuit 86. The positional deviation correction circuit 86 may be constituted with a computer, for instance. Correction quantities for the positional deviation between the coordinate system of the mobile stage 11 and the coordinate system of the charged particle beam exposure system and also for the offset due to the deflection characteristics of the main deflector 20 and the sub deflector 30 are supplied to the positional deviation correction circuit 86. These correction quantities are to be referred to as the other correction quantities to differentiate from the correction quantity as pertinent to the present invention.

The deflection quantity is corrected at the deflector correction circuit 87 and then is supplied to the main deflector 20 and the sub deflector 30 via the driver 88.

Figure 56:
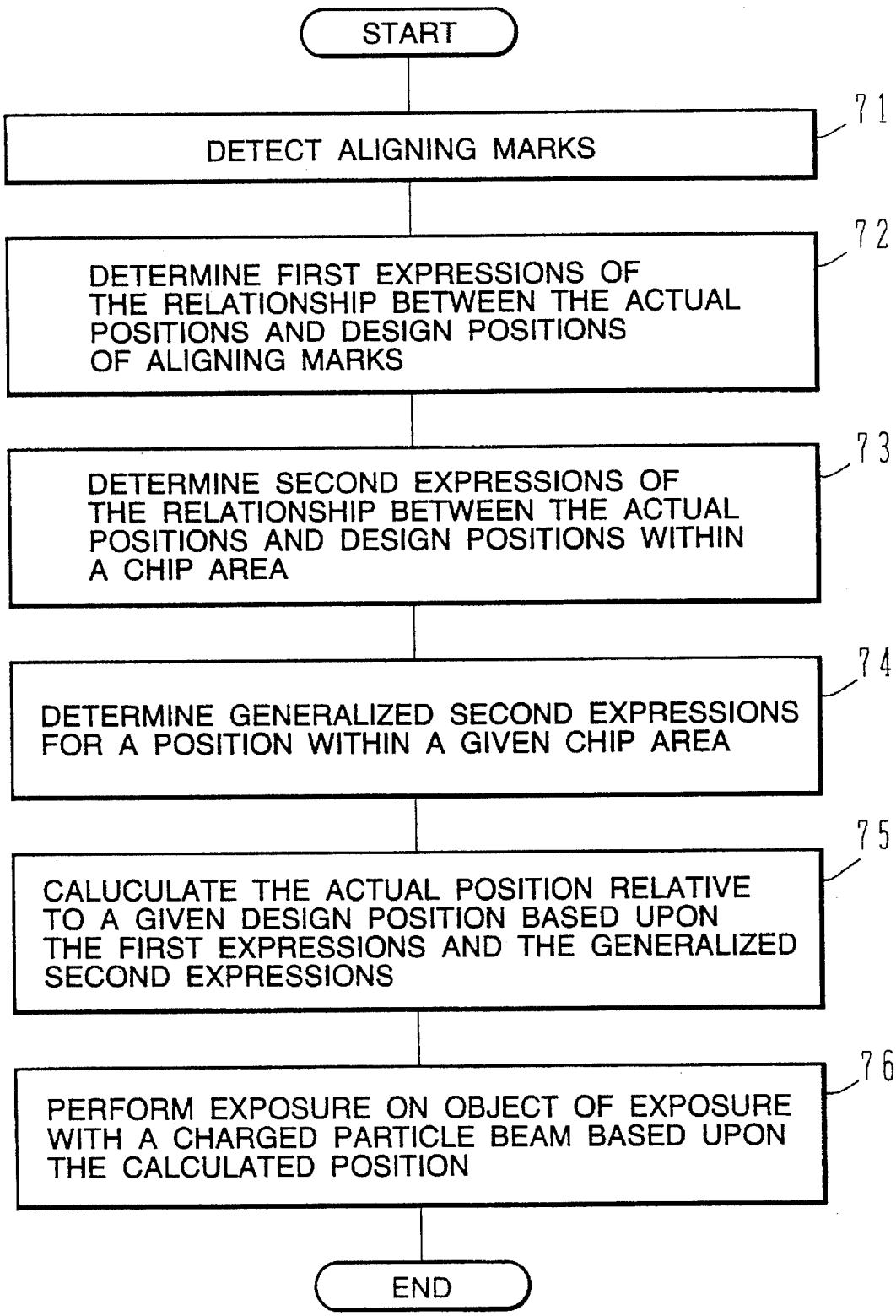
FIG. 56 is a flow chart showing the procedure for positional deviation correction in the seventeenth embodiment according to the present invention.

Next, detailed explanation of the operation of the positional deviation correction circuit 86 is given in reference to the flow chart in FIG. 56.

(71) In order to determine the first and second relational expressions described below with a high degree of accuracy, ideally, the positions of the aligning marks Aj, Bj, Cj and Dj (j=1 to 5, hereafter the same) surrounding each chip area are detected using the method described above in reference to FIG. 60, for 4 to 5 chip areas which are distributed over the peripheral area of the semiconductor wafer 10 and also for 1 to 2 chip areas near the center of the semiconductor wafer 10, for example, the chip areas 101 to 105 shown in FIG. 57. When the detection is performed, in FIG. 59, the other correction quantities are divided and distributed to the stage control circuit 51 and the deflection quantity correction circuit 87, as shown in FIG. 59, and the electron beam EB is scanned with these other correction quantities taken into consideration.

(72) Based upon the relationship between the coordinates (XAj, YAj) of the detected positions of the corresponding aligning marks A1 to A5 of the chip areas 101 to 105 which are separate areas, and the coordinates (xaj, yaj) of the corresponding positions in design, the first rotational expressions (1) and (2) expressing the relationship between the actual position of the aligning mark AI corresponding to a given chip area $10i$ (i=1 to n, hereafter the same) on the semiconductor wafer 10 and the corresponding position in design are determined.

$$X=g11x+r11y+h11xy+o1 \qquad (1)$$

$$Y=g12x+r12y+h12xy+o2 \qquad (2)$$

Here, g11, r11, h11, o1, g12, r12, h12 and o2 are constants.

The constants in the expressions (1) and (2) are determined using, for instance, the method of least square. Specifically, the constants g11, r11, h11, o1, g12, r12, h12 and o2 are determined so that $$I0=\Sigma\{XAj-(g11xaj+r11yaj+h11xajyaj+o1)\}^2+\Sigma\{YAj-(g12xaj+r12yaj+h12xajyaj+o2)\}^2$$

is the minimum value. Here, $\Sigma$ means the sum of j=1 to 6.

Figure 58:
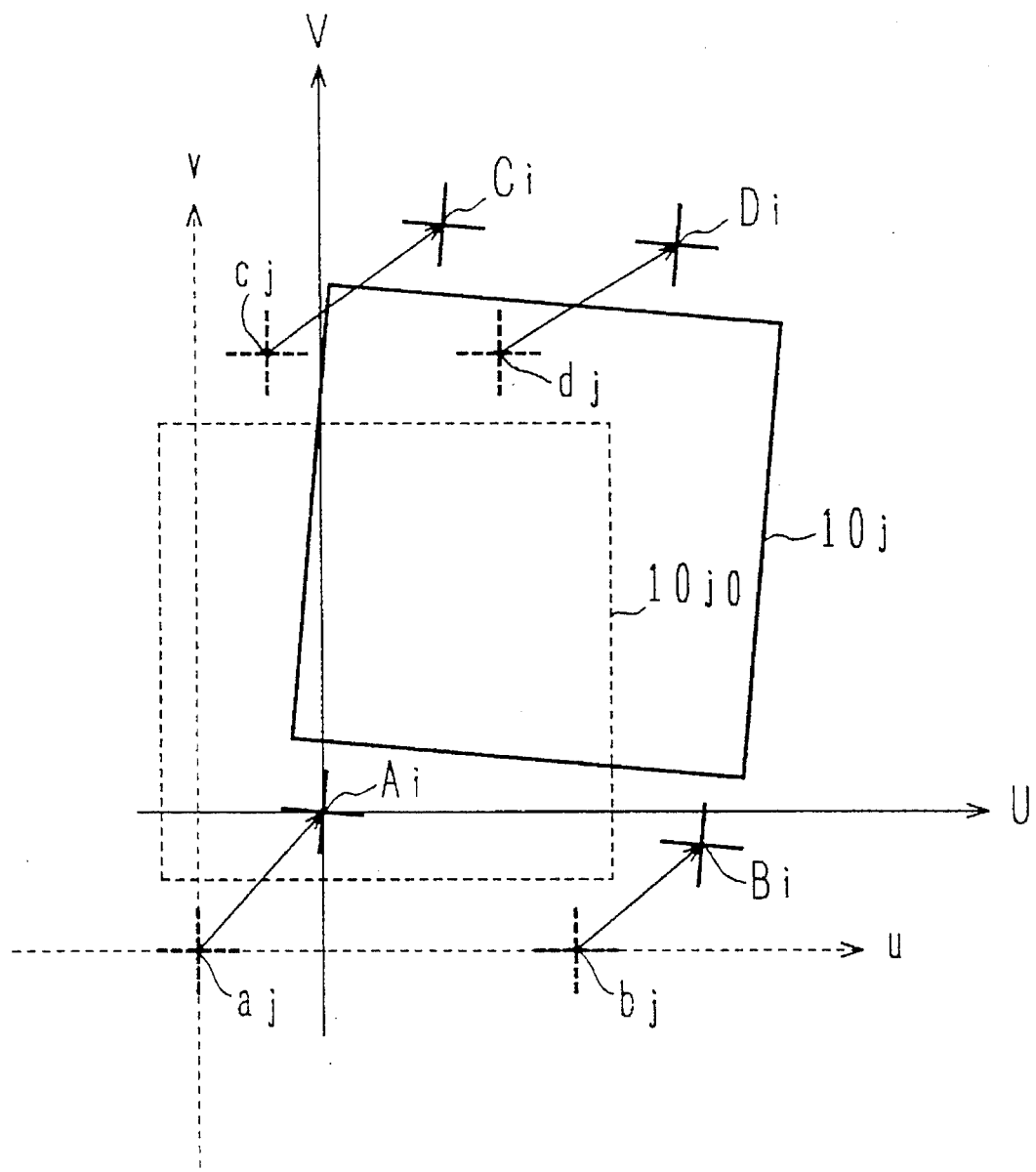
FIG. 58 illustrates the processing performed in step 73 in FIG. 56.

(73) Here, we assume that the aligning marks ai, bi, ci and di in design and the corresponding actual aligning marks Aj, Bj, Cj and Dj, have the relationship shown in FIG. 58. We shall contemplate the relative u-v rectangular coordinate system whose origin point is at the position of the aligning mark ai and the relative U-V rectangular coordinate system whose origin point is at the detected position of the aligning mark Aj. The u, v, U and V have the following relationships with the position coordinates (x, y) in design on the semiconductor wafer 10 and also with the actual position coordinates (X, Y) on the semiconductor wafer 10;

$$u=x-xai$$

$$v=y-yai$$

$$U=X-XAi$$

$$V=Y-YAi$$

Based upon the relationship between the position coordinates (xbi–xai, ybi–yai), (xci–xai, yci–yai) and (xdi–xai, ydi–yai) of the aligning marks bi, ci and di on the u-v rectangular coordinate system and the position coordinates (XBi–XAi, YBi–YAi), (XCi–XAi, YCi–YAi) and (XDi–XAi, YDi–YAi) of the aligning marks Aj, Bj Cj and Dj on the U-V rectangular coordinate system, the following second relational expressions (3) and (4) expressing the relationship between the position coordinates (u,v) within the chip area $10j0$ in design and the relative position coordinates (U, V) within the actual chip area $10j$ are determined with the method of least square, for instance.

$$U=g21u+r21v+h21uv \qquad (3)$$

$$V=g22u+r22v+h22uv \qquad (4)$$

Here, g21, r21, h21, g22, r22 and h22 are constants.

For each j, the constants g21(j), r21(j), h21(j), g22 (j), r22(j), and h22(j) are determined so that $$Ij=\{UAj-(g21uaj+r21vaj+h21uajvaj)\}^2+\{VAj-(g22uaj+r22vaj+h22uajvaj)\}^2+\{UBj-(g21ubj+r21vbj+h21ubjvbj)\}^2+\{VBj-(g22ubj+r22vbj+h22ubjvbj)\}^2+\{UCj-(g21ucj+r21vcj+h21ucjvcj)\}^2+\{VCj-(g22ucj+r22vcj+h22ucjvcj)\}^2+\{UDj-(g21udj+r21vdj+h21udjvdj)\}^2+\{VDj-(g22udj+r22vdj+h22udjvdj)\}^2$$

will be the minimum value.

(74) Based upon the second relational expressions (3) and (4) for each of the chip areas $10j$, j=1 to 5, generalized second relational expressions expressing the relationship between the actual position within a given chip area $10i$ (i=1 to n) on the semiconductor wafer 10 and the corresponding position in design are determined. In these expressions, the constants used in the second relational expressions above are substituted with x and y polynomials and these polynomials are expressed with the following equations (5) to (10).

$$g21=g210+g211x+g212y+g213xy \qquad (5)$$

$$r21=r210+r211x+r212y+r213xy \qquad (6)$$

$$h21=h210+h211x+h212y+h213xy \qquad (7)$$

$$g22=g220+g221x+g222y+g223xy \qquad (8)$$

$$r22=r220+r221x+r222y+r223xy \qquad (9)$$

$$h22=h220+h221x+h222y+h223xy \qquad (10)$$

Here, g210, g211, g212, g213, r210, r211, r212, r213, h210, h211, h212, h213, g220, g221, g222, g223, r220, r221, r222, r223, h220, h221, h222 and h223 are constants.

The constants used in these expressions may be determined using the method of least square, for instance. In short, the constants are determined so that I1+I2+I3 +I4+I5 will be the minimum value.

(75) Based upon the first relational expressions (1) and (2) and the generalized second relational expressions (3) and (4), the actual position coordinates (X, Y) relative to the position coordinates (x, y) in design within a given chip area 10$i$ are calculated in the following manner:

The position coordinates (x0, y0) of the aligning marks ai in design, and the relative position coordinates (u, v)=(x−x0, y−y0) in design within the chip area 10$i$ whose origin point is at the aligning mark ai are determined.

Then, x and y in the expressions (1) and (2) above are respectively substituted with x0 and y0 to determine the position X=X0 and Y=Y0 of the actual aligning mark Ai.

Next, x and y are used in substitution in the expressions (5) to (10) above to calculate the coefficients in the generalized second relational expressions and then u and v in the generalized second relational expressions are substituted with x−x0 and y−y0 respectively, to determine U=U0 and V=V0.

After that, X=X0+U0 and Y=Y0+V0 are determined as the actual position coordinates relative to the x and y in design.

(76) The positional deviation correction circuit 86 adds the correction quantity for a positional deviation (ΔX, ΔY)= (X−x, Y−y) to the other correction quantities and then distributes the entire sum of the correction quantities to the stage control circuit 51 and the deflection quantity correction circuit 87. With this, the positional deviation (ΔX, ΔY) is ultimately corrected using the movement quantity of the mobile stage 11 and the deflection quantities imparted by the sub deflector 30 and the main deflector 20 just as in the case of the other correction. The positioning error of the mobile stage 11 is fed back to the positional deviation correction circuit 86 via the stage control circuit 51 (which includes the position detector for the mobile stage 11) and then is added to the correction for the main deflector 20.

The processing described so far is performed for exposure onto each layer on the semiconductor wafer 10.

Since, in the seventeenth embodiment, the actual position within a given chip area 10$i$ relative to the position in design is calculated based upon the first relational expressions and the generalized second relational expressions, as explained above, layer alignment can be performed with a high degree of accuracy. In addition, when the number "n" of chip areas on the wafer 10 is 87, for instance, the aligning mark detection time amounts to only 420×6/50=50 seconds, while it takes 7 minutes in the prior art. Therefore, a great improvement in throughput of electron beam exposure can be achieved.

A number of variations of the seventeenth embodiment are possible.

For instance, the positions of the aligning marks A1 to A5 as the first positions may be those for chip areas other than the chip areas 101 to 105 and the number of such aligning marks is not limited to 5.

In addition, the six constants used in the first relational expressions above may be determined without using the method of least square but by solving simultaneous equations based upon the detected positions of the three aligning marks AJ and the corresponding design positions. This point applies to the second relational expressions and the generalized second relational expressions explained above, as well.

Moreover, the polynomials used in those individual relational expressions above may have a greater number of terms to provide a higher degree of accuracy of approximation.

EIGHTEENTH EMBODIMENT

Figure 61:
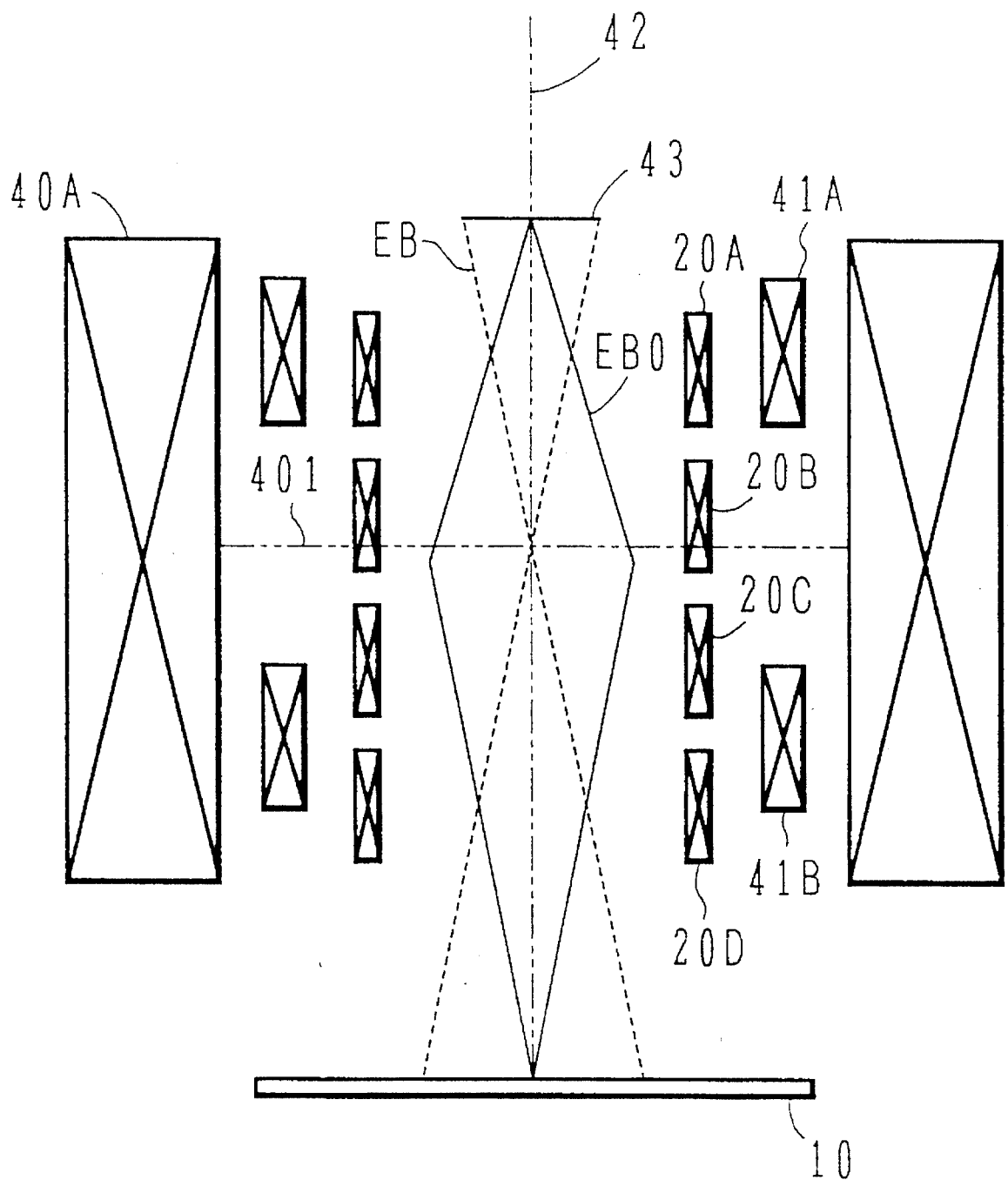
FIG. 61 is a schematic of the parts of the lower portion of the charged particle beam exposure system in the eighteenth embodiment according to the present invention.

FIG. 61 is a basic schematic diagram of the parts of the lower portion of the electron beam exposure system in the eighteenth embodiment.

Figure 11:
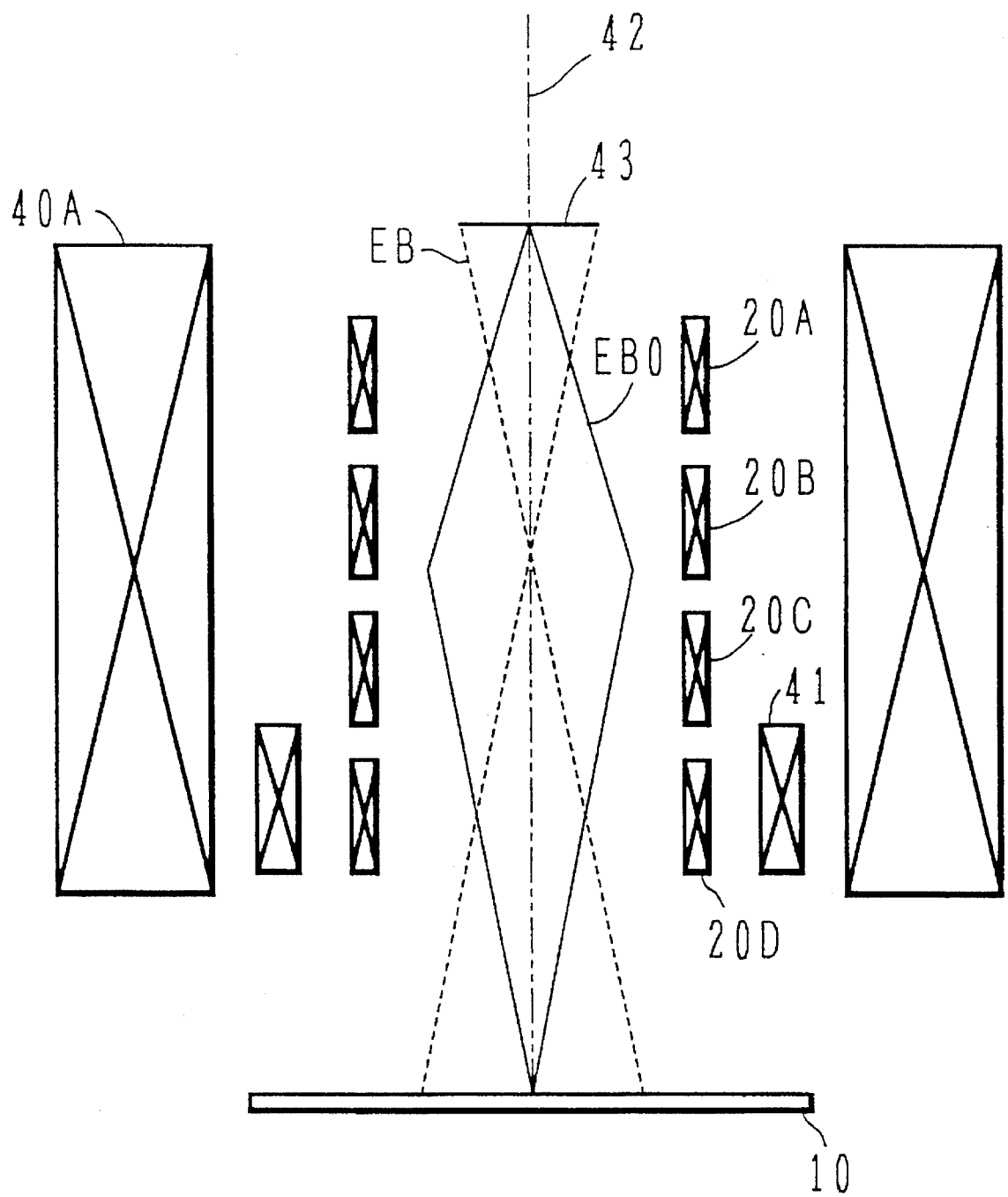
FIG. 11 is a schematic diagram of the parts of the lower portion or an electron beam exposure system in the prior art.

Instead of the one astigmatism correction coil shown in FIG. 11. this system is provided with two astigmatism correction coils 41A and 41B, separated from each other in the direction of the optical axis and vertically centered on the central plane of the lens 401 in the last stage electromagnetic lens 40A. All other aspects of this system are identical to those shown in FIG. 11.

Figure 62:
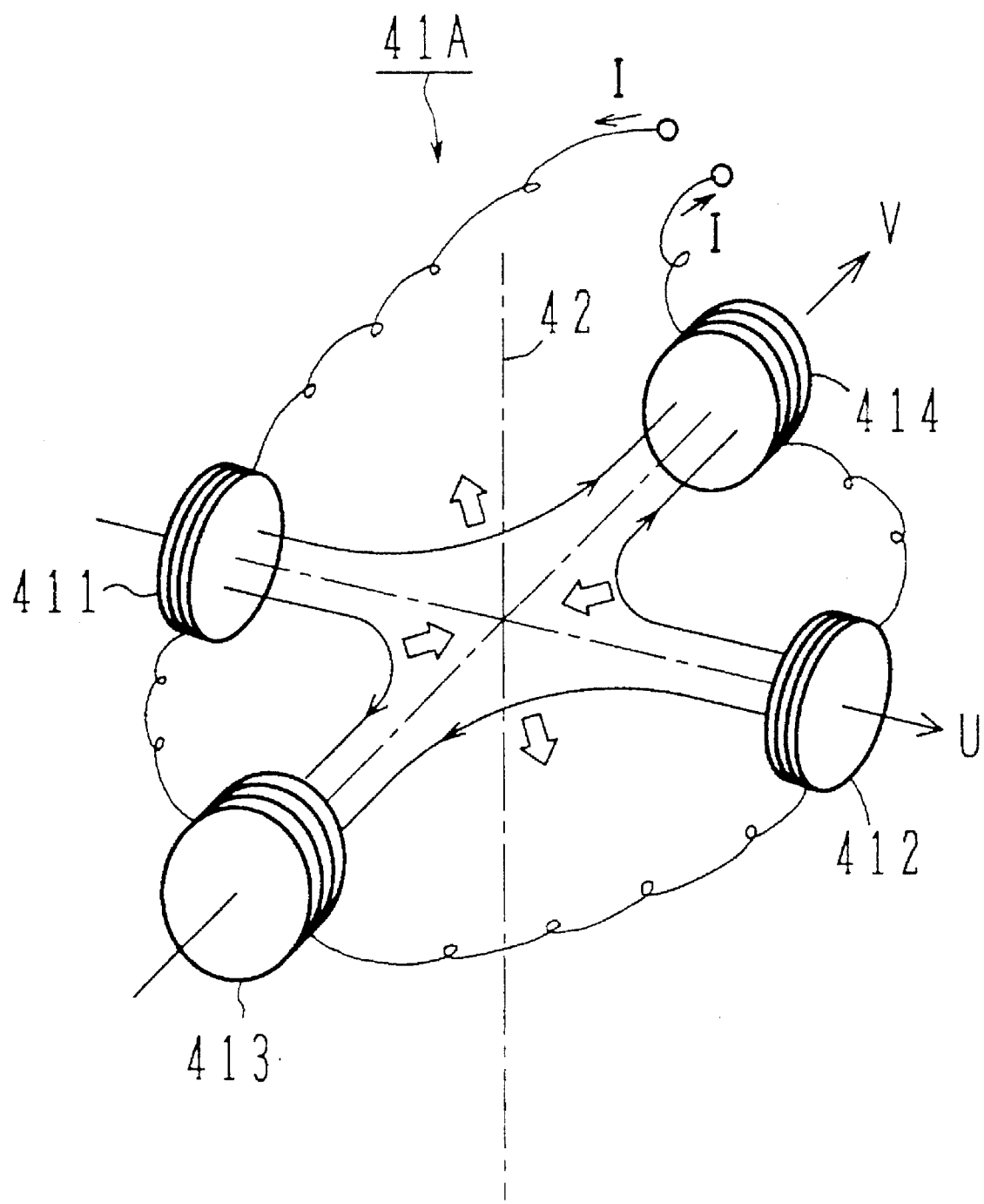
FIG. 62 is a perspective view of the set of the astigmatism correction coils shown in FIG. 61.

As shown in FIG. 62, the astigmatism correction coil 41A is provided with coils 411 and 412 which are positioned facing opposite each other in the direction of the U-axis and coils 413 and 414 which are positioned facing opposite each other in the direction of the V-axis, centered on the optical axis. These coils are connected in series. When an electric current I is supplied to these coils, the line of magnetic force becomes curved, as indicated with the small arrowed lines and the Lorentz's force, which acts on the electrons travelling downward, acts in the directions indicated with the big arrows within the U-V plane. The astigmatism correction coil 41A is provided with the first set of coils 411 to 414 described above, and a second set of coils (not shown) which are obtained by rotating the coils 411 to 414 by 45° within the U-V plane. An electric current is supplied to each set of coils independently. The U-axis and the V-axis run in a direction that is at a right angle to the optical axis 42, and it is not necessary to align them with the X axis and Y-axis of the main deflector. The astigmatism correction coil 41B is identical to 41A.

In order to meet the requirements for Koehler illumination, wherein the dosage of the electron beam EB is maximized on the wafer 10, it is necessary to align the cross-over point of the electron beam EB, indicated with the dotted line, to the lens central plane 401. Thus, the astigmatism correction coils 41A and 41B are positioned in such a manner that these requirements are met as closely as possible.

Figure 63:
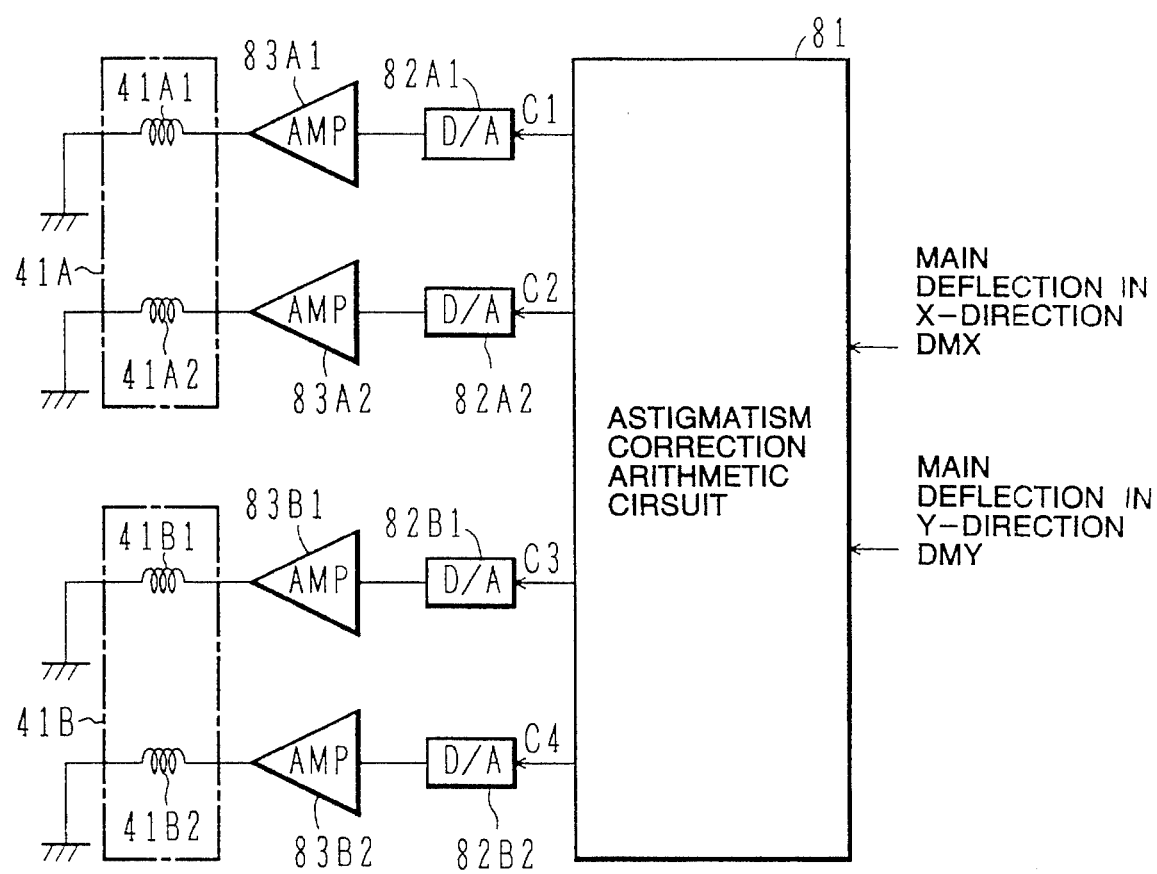
FIG. 63 is a block diagram showing the control circuit for the astigmatism correction coils shown in FIG. 61.

FIG. 63 shows the circuit for controlling the electric current to be supplied to the astigmatism correction coils 41A and 41B. As explained earlier, the astigmatism correction coil 41A has two sets of astigmatism correction coils 41A1 and 41A2 and the astigmatism correction coil 41B bas two sets of astigmatism correction coils 41B1 and 41B2.

The quantity of the astigmatism varies depending upon the position within the electromagnetic lens 40A, i.e., depending upon the quantity of deflection imparted by the deflectors. Since the quantity of deflection imparted by the sub deflector is smaller than that imparted by the main deflector and the deflection by the sub deflector is imparted rapidly, it is disregarded. The astigmatism correction quantity calculation circuit 81 performs interpolation calculation, which is to be explained later, for the main deflection quantity DMX in direction X and the main deflection quantity DMY in direction Y for the deflection of the electron beam EB imparted by the main deflector. Then it supplies the results, i.e., the correction quantities C1 to C4, to the D/A converters 82A1, 82A2, 82B1 and 82B2. Signals that are converted to analog at the D/A converters 82A1, 82A2, 82B1 and 82B2 are current amplified at the amplifying circuits 83A1, 83A2, 83B1 and 83B2 respectively and are then supplied to the astigmatism correction coils 41A1, 41A2, 41B1 and 41B2.

Now, the interpolation calculation mentioned above is explained.

Figure 64:
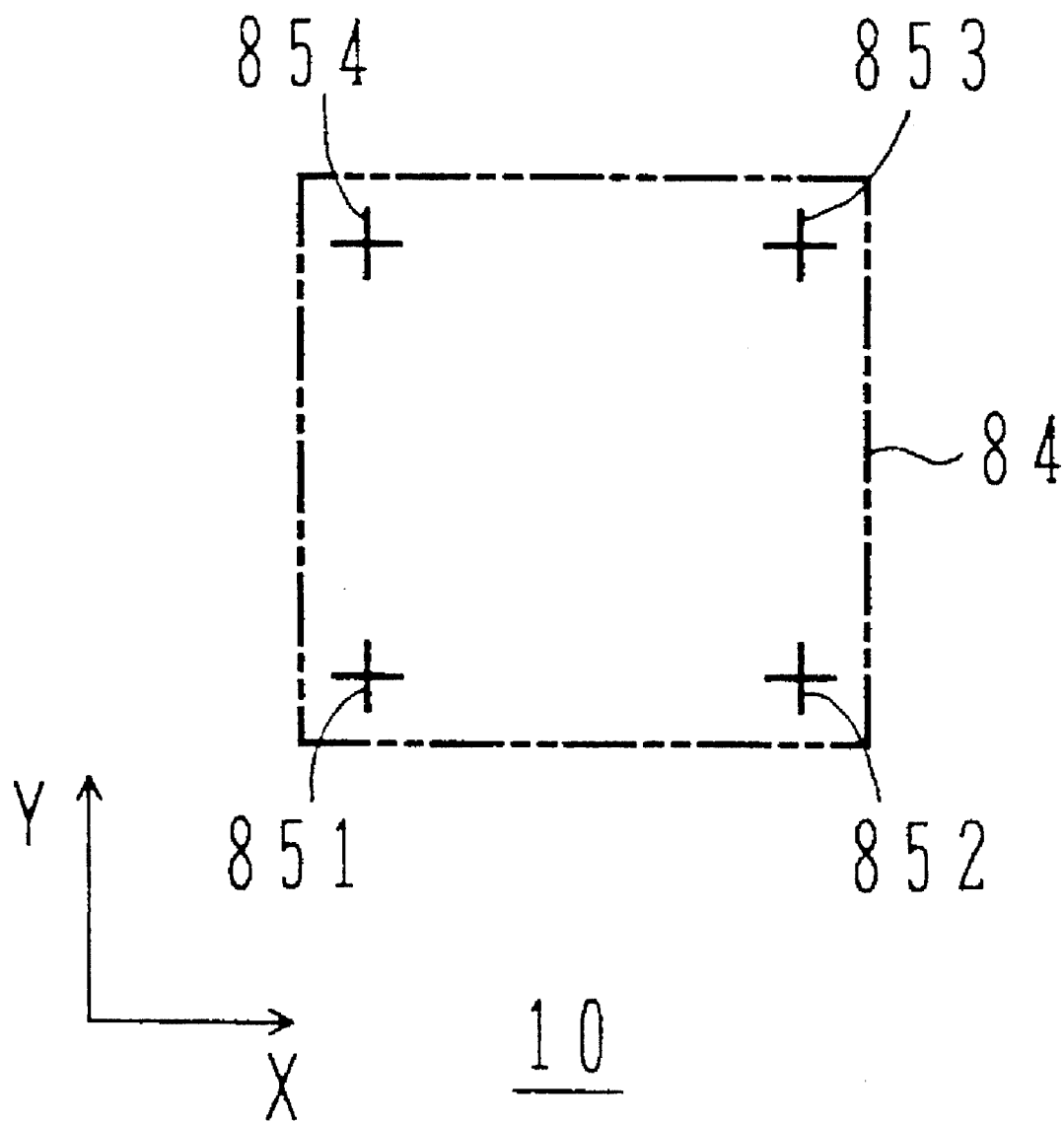
FIG. 64 shows the cross-shaped grooves formed at the four corners within the deflection area of the main deflector on the wafer.
Figure 65:
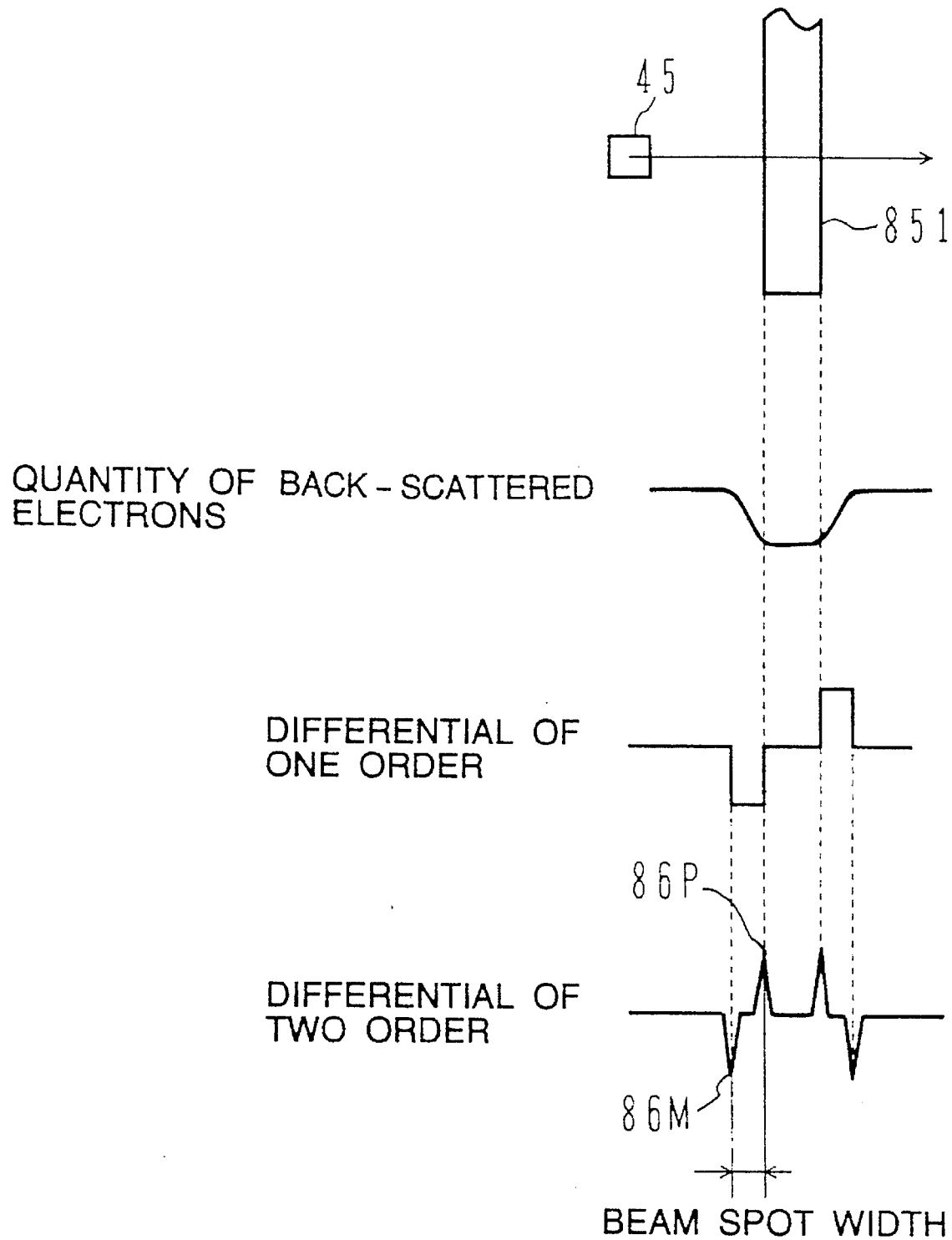
FIG. 65 shows the waveform of the quantity of backscattered electrons detected while scanning an electron beam across the cross-shaped grooves, and a waveform obtained with a differential of one order and another waveform obtained with a differential or two orders.

A wafer 10 in which cross-shaped groove marks 851 to 854 for electron beam detection are formed in the four corners of the deflection area 84, as shown in FIG. 64, is prepared. The electron beam is scanned in directions X and Y for the cross-shaped groove mark 851, as shown in FIG. 60, to detect back-scattered electrons and the waveform of the back-scattered electron quantity is obtained, as shown in FIG. 65. Then, the waveform after the first differentiation of that waveform and the waveform after the second differentiation are determined. The distance between the negative peak 86M of the second-order differential waveform and the positive peak 86P next to the negative peak is measured as the width of the electron beam spot in direction X at the position of the cross-shaped groove mark 851.

Figure 12A:
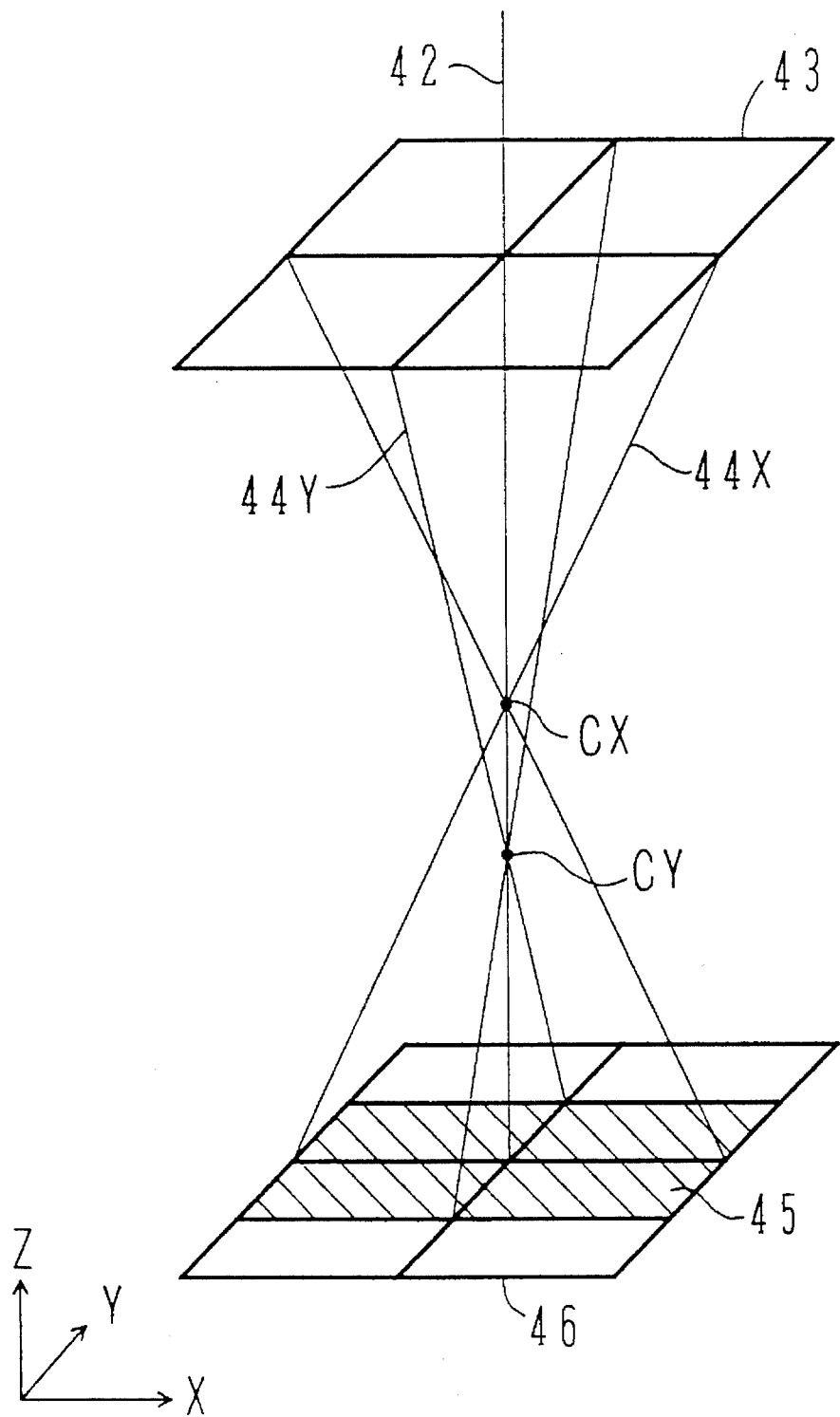
FIG. 12A is a schematic perspective view illustrating astigmatism of an electron beam.
Figure 12B:
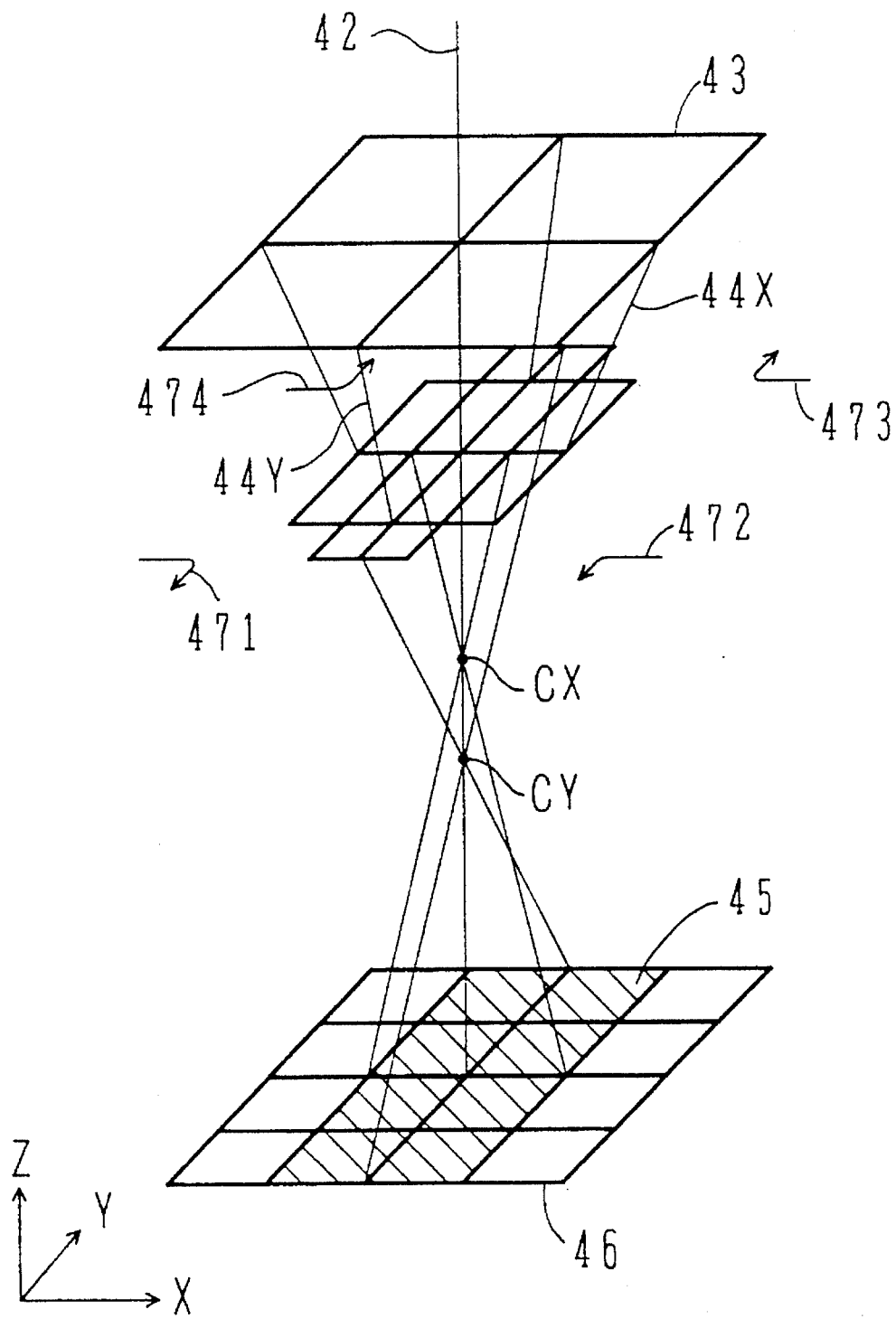
FIGS. 12B to 12F are schematic perspective view showing the astigmatism correction with the position of the astigmatism correction coil on the optical axis assigned PZ, the cross-over point of the electron beam on the X-Z cross section assigned CX and the cross-over point of the electron beam on the Y-Z cross section assigned COMPANY, when PZ is set at PZ>CX, PZ=CX, CY<PZ<PX, PZ=CY and PZ<CY respectively.
Figure 12C:
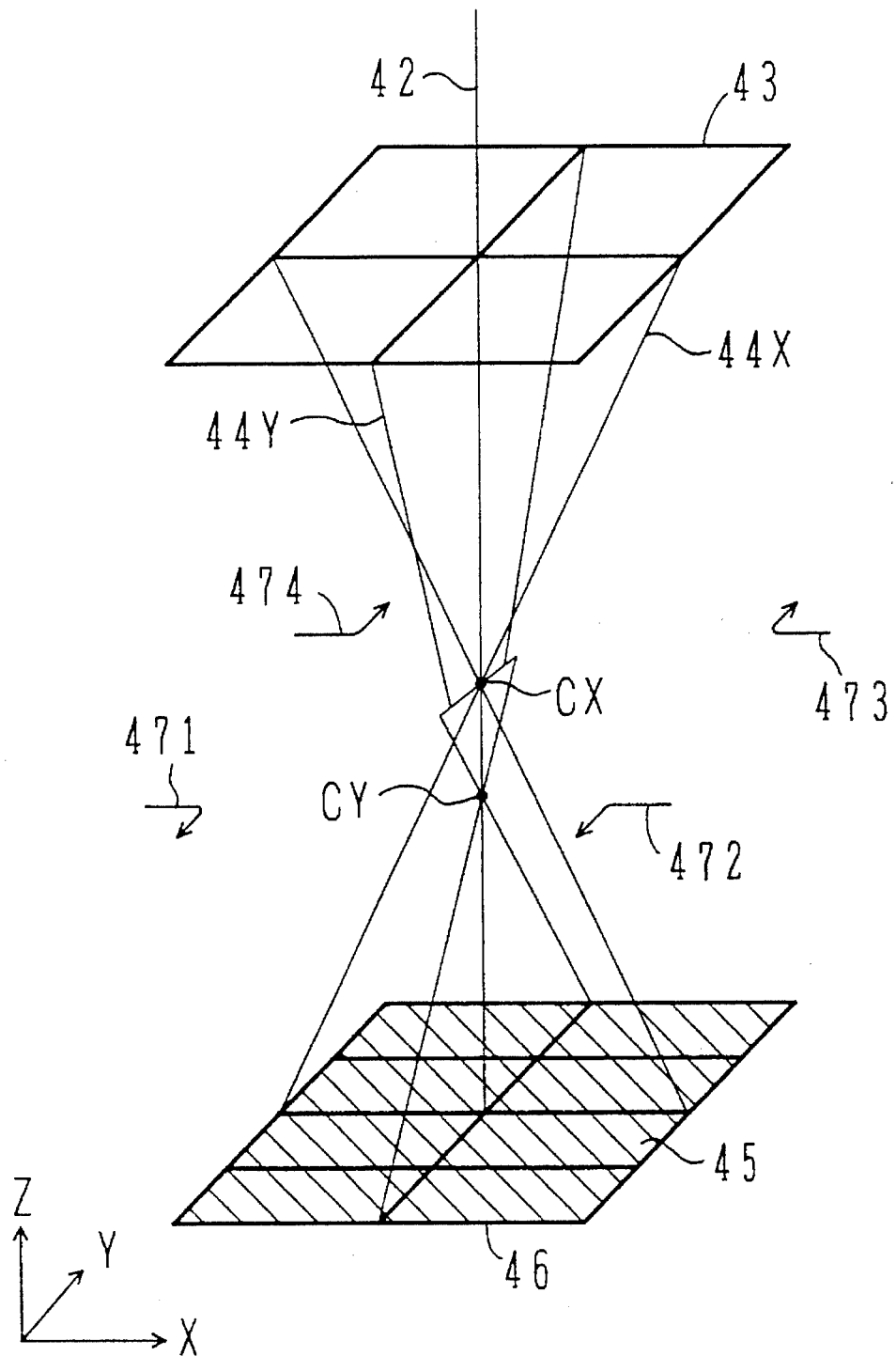
Figure 12D:
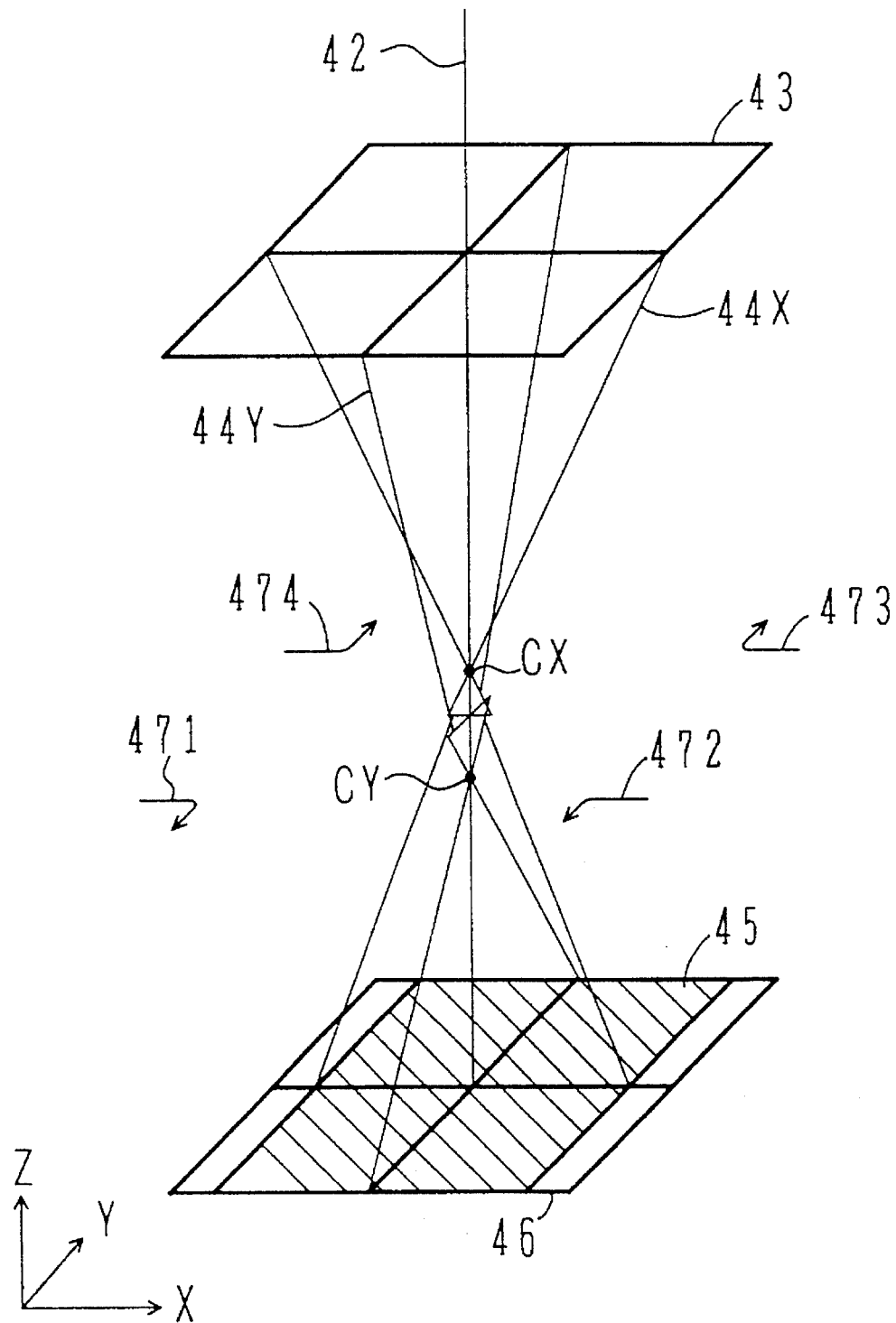
Figure 12E:
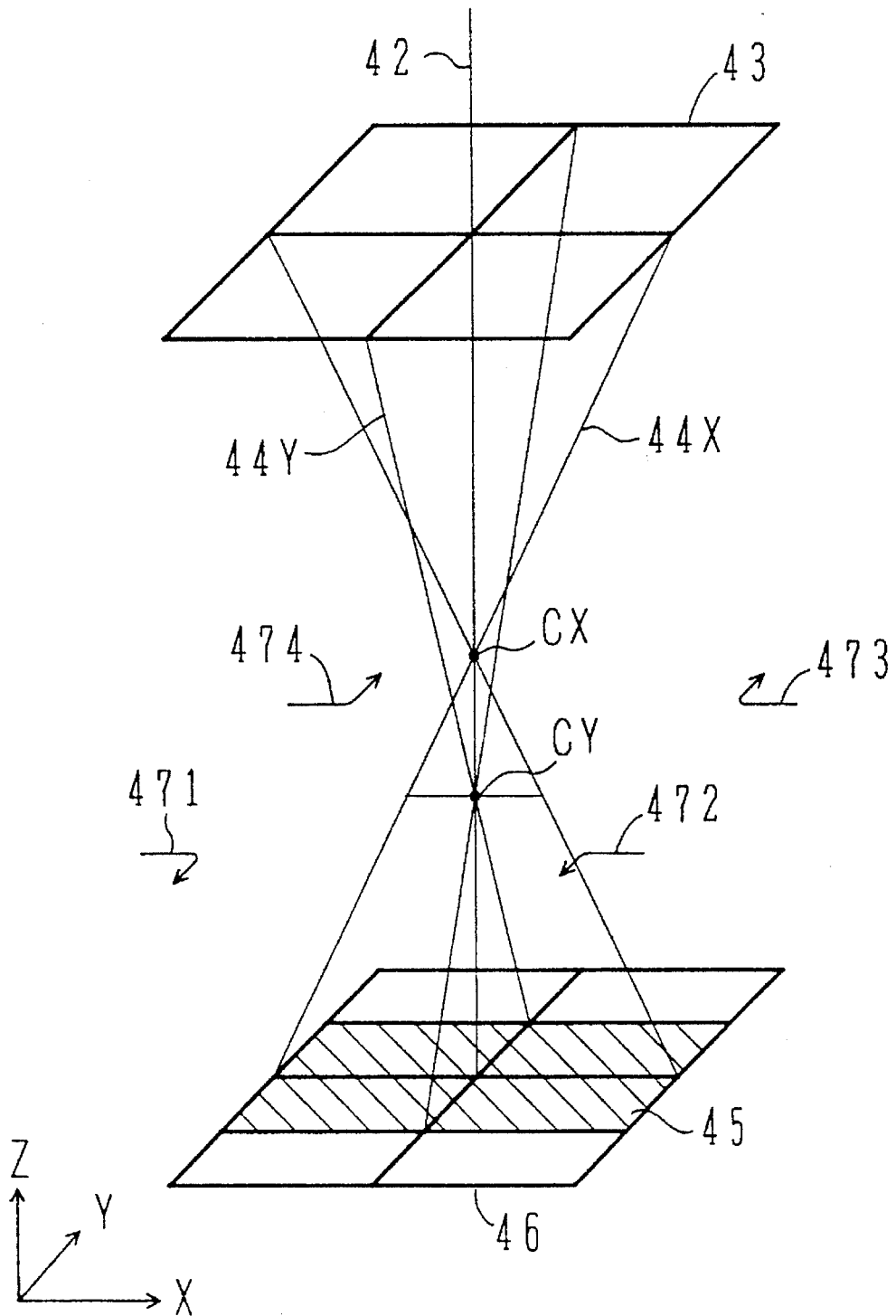
Figure 12F:
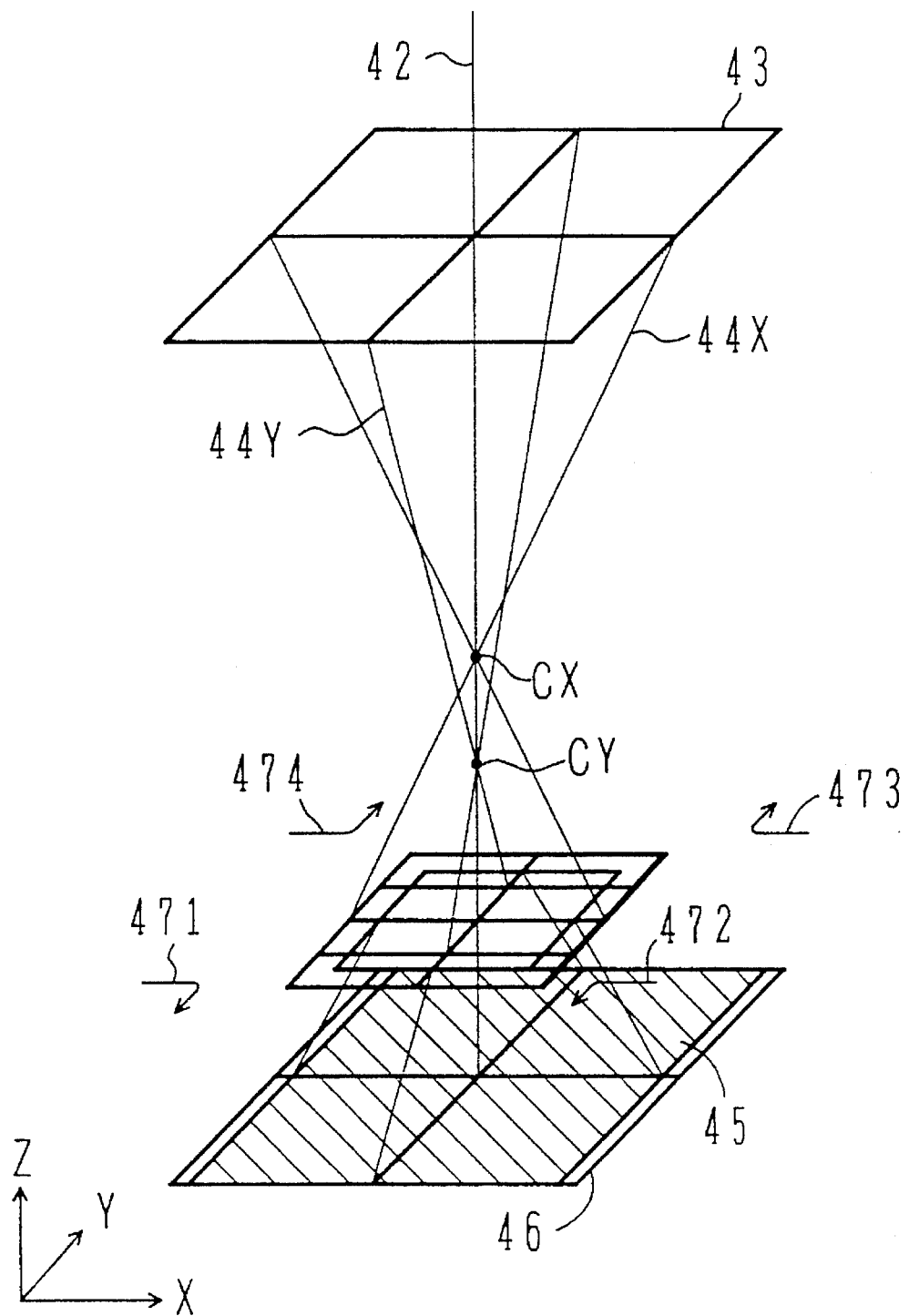
Figure 66:
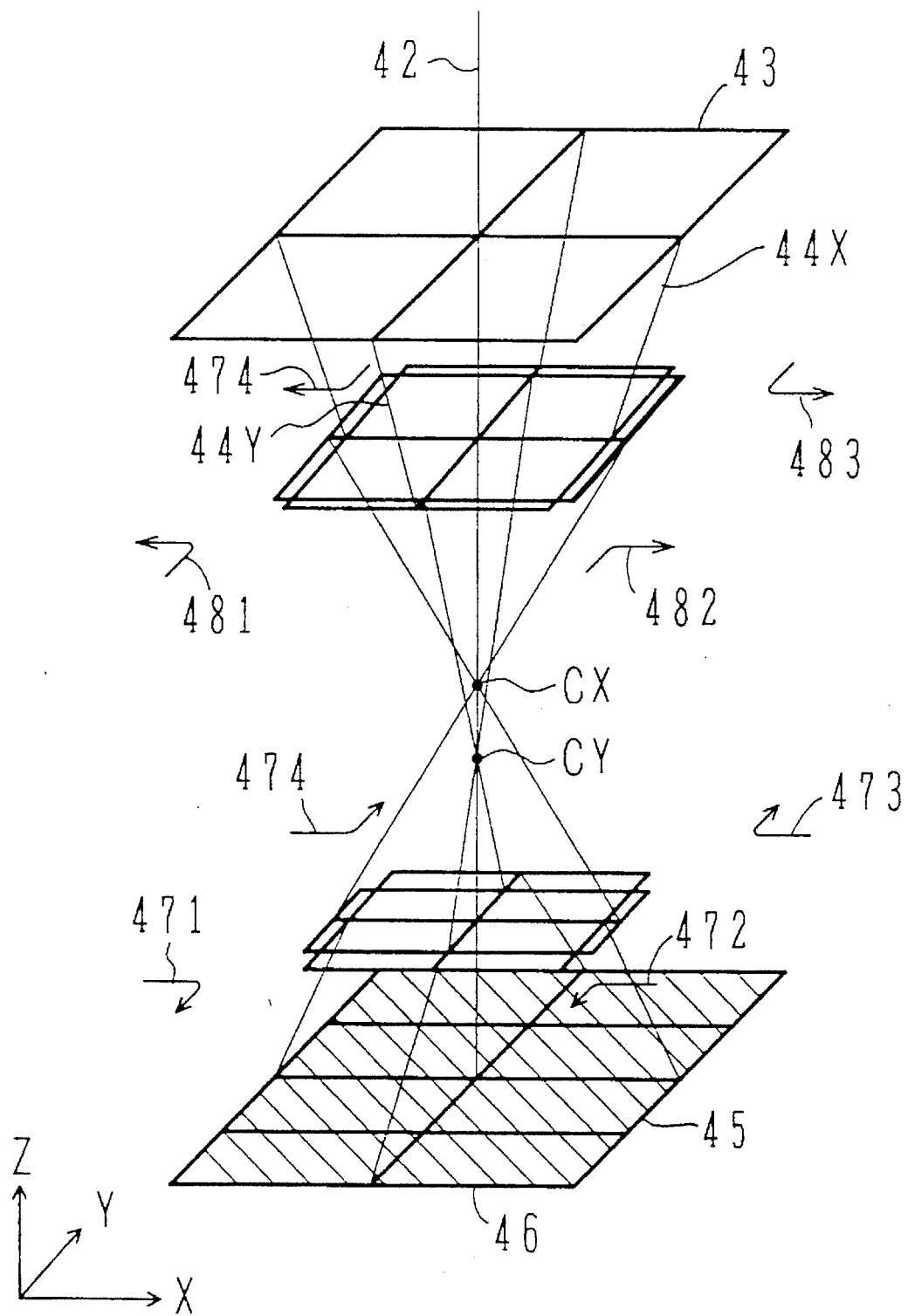
FIG. 66 is a schematic perspective view of the astigmatism correction performed in the sixteenth embodiment.

In the same manner, the width of the electron beam spot in directions X and Y at the cross-shaped groove marks 851 to 854 are measured. This measurement is performed an appropriate number of times with the correction quantities C1 to C4 changed to determine the correction quantities C1 to C4 with which the widths of the electron beam spot in directions X and Y at the cross-shaped groove marks 851 to 854 (individual main deflection quantities) become as close as possible to being the same. By using these correction quantities, the interpolation calculation formulae for the correction quantities (C1, C2, C3, C4) for a given main deflection quantity (DMX, DMY), i.e., a 4-line, 2-row matrix, is determined Thus, when there is an astigmatism in direction Y, as shown in FIG. 12A, for instance, this astigmatism is corrected as shown in FIG. 66, making more fine exposure patterns possible.

In the figures, reference numbers 481 to 484 and reference numbers 471 to 474 indicate the direction of the magnetic force applied to the electron beam in directions X and Y respectively, with the former, the X-direction force, being applied by the magnetic field of the astigmatism correction coil 41A and the latter, the Y-direction force, being applied by the astigmatism correction coil 41B. For the sake of simplicity, it is assumed that the cross section of the electron beam changes instantaneously under the influence of the astigmatism correction coils 41A and 41B positioned in direction Z and also that this cross section simply expands or contracts in directions X and Y.

In this example, an electric current is supplied to the astigmatism correction coil 41A so that the X-Z cross section 44X of the electron beam expands toward the outside and the Y-Z cross section 44Y of the electron beam contracts toward the inside, and an electric current is supplied to the astigmatism correction coil 41B so that the reverse of the above will occur, i.e., the X-Z cross section 44X of the electron beam contracts toward the inside, and the Y-Z cross section 44Y of the electron beam expands toward the outside.

It should be noted that the astigmatism correction coils may be positioned under or over the last stage electromagnetic lens.

Although the present invention has been described in its preferred embodiments, it is to be understood that the invention is not limited thereto and that various changes and modifications may be made without departing from the spirit and scope of the invention.

What is claimed is:

1. A method of charged particle beam exposure by deflecting a charged particle beam onto an object with a deflector to which an output end of an amplifying circuit connected, wherein an input of said amplifying circuit is changed in steps by, at least, a first value and a second value, said method comprising the steps of:

using said amplifying circuit which has response characteristics such that there is a damped oscillatory response in its output when said input step-changes by said first value;

connecting a variable impedance means capable of constituting a low-pass filter in a coupling circuit with said deflector between an output end of said amplifying circuit and said deflector; and switching an impedance value of said variable impedance means in such a manner that said coupling circuit constitutes said low-pass filter when the quantity of said step change is said first value and a high-frequency component is reduced more when said quantity of said step change is said first value than when said quantity of said step change is said second value.

2. A method of charged particle exposure according to claim 1 wherein said switching is determined by a signal value which contains information representing said quantity of said step change before said step change.

3. A method of charged particle exposure according to claim 2 wherein said signal value is a count value of a counter, further comprising the step of:

changing said input to said amplifying circuit in steps by said first value every time said count value changes by one and by said second value when said count value returns from the maximum absolute value to its initial value.

4. A method of charged particle exposure according to claim 1, wherein an input signal is supplied to said amplifying circuit, said input signal having an input signal value, and further comprising the step of:

storing said input signal value in storage means as a stored input signal value;

wherein said switching is performed based upon comparison of a present signal value of said input signal and said stored input signal value stored in said storage means.

5. A method of charged particle exposure according to claim 1 wherein said variable impedance means is a variable resistor.

6. A system for charged particle beam exposure, comprising a deflector for deflecting a charged particle beam onto an object; and an amplifying circuit, an input of which changes in steps, by quantities consisting of, at least, a first value and a second value, an output end of which is coupled with said deflector:

wherein said amplifying circuit has response characteristics such that there is a damped oscillatory response in said output when said input step-changes by said first value;

said system further comprising a variable impedance means, connected between an output end of said amplifying circuit and said deflector, capable of constituting a low-pass filter in a coupling circuit with said deflector; and a control circuit for controlling an impedance value of said variable impedance means in such a manner that said coupling circuit constitutes a low-pass filter when a quantity of said step change is said first value and that a high-frequency component is reduced more when said quantity of said step change is said first value than when said quantity of said step change is said second value.

7. A method of charged particle exposure for exposing an object with a charged particle beam by deflecting said charged particle beam with a main deflector and a sub deflector whose scanning area is narrower than that of said main deflector, in order to scan said charged particle beam onto said object, said method comprising the steps of:

supplying a drive signal to said main deflector or said sub deflector based upon an output of a D/A converter, and including a correction signal in said drive signal in order to cancel out an effect on said charged particle beam of a transient waveform included in said drive signal when said outputs of said D/A converters change.

8. A method of charged particle exposure according to claim 7 wherein said correction signal is determined based upon a change in an input to said D/A converter.

9. A method of charged particle exposure according to claim 8 wherein said correction signal is generated by sequentially reading out correction data stored in storage means.

10. A method of charged particle exposure according to claim 9 wherein said storage means is addressed with a count value of a counter into which an initial value corresponding to an input value of said D/A converter is loaded every time said input value changes and to which a clock is supplied to change said count value.

11. A method of charged particle exposure according to claim 9 wherein said charged particle beam is continuously deflected by said main deflector in one direction and when said charged particle beam is swung back in the opposite direction from said one direction, said correction signal is included in a drive signal supplied to either said main deflector or said sub deflector.

12. A method of charged particle exposure according to claim 11, further comprising the steps of:

mounting said object on a mobile stage;

moving said mobile stage continuously in a direction perpendicular to the direction of deflection imparted by said main deflector; and deflecting said charged particle beam by said sub deflector in conformance with the movement of said mobile stage for each scan performed by said main deflector.

13. A method of charged particle exposure according to claim 12 further comprising the steps of:

reading out a data in second storage means with supplying a count value of a second counter and supplying a clock to an clock input end of said second counter;

supplying said data to said D/A converter in order to convert to analog signal; and supplying said analog signal to said main deflector via a smoothing circuit and an amplifying circuit to make said drive signal;

whereby said drive signal is a sawtooth waveform a cycle of which being equal to a cycle of said count value and whereby a scanning speed of said main deflector is made variable by changing the frequency of said clock.

14. A method of charged particle exposure according to claim 13 wherein;

arranging a blanking aperture array at a position reached by said charged particle beam before it passes through said main deflector and said sub deflector, said blanking aperture array having a plurality of openings on a substrate in a lattice pattern and a pair of electrodes formed on the edge of each said opening on said substrate; and having said charged particle beam pass through said blanking aperture array to split into a multiple beam; and controlling a voltage between said pair of electrodes in order to perform exposure of a pattern on said object.

15. An system for charged particle exposure for exposing an object with a charged particle beam by deflecting said charged particle beam with a main deflector and with a sub deflector whose scanning area is narrower than that of said main deflector, in order to scan said charged particle beam onto said object, said system comprising:

a first D/A converter;

a first amplifying circuit connected between an output end of said first D/A converter and an input end of said main deflector;

a second amplifying circuit connected to an input end of said sub deflector; and a waveform correction circuit for including a correction signal in an output signal of said first amplifier or said second amplifier in order to cancel out an effect of a transient waveform included in the output of said first amplifying circuit on said charged particle beam when the input of said first D/A converter changes.

16. A system for charged particle exposure, comprising:

an analog waveform generating circuit, said waveform having step changes;

a smoothing circuit for interpolating approximately linearly between step-change points adjacent to each other against a time; and a deflector for deflecting a charged particle beam continuously based upon an output of said smoothing circuit.

17. A system for charged particle exposure according to claim 16 wherein said smoothing circuit is a low-pass filter.

18. A system for charged particle exposure according to claim 16 wherein said smoothing circuit includes:

a constant current source, whose current value varies according to a control signal, having a control input end supplied with said control signal corresponding to the inclination of line connecting between about said step change points;

a capacitor with one end connected to said constant current source, another end of said capacitor being made to have constant potential; and an output buffer circuit with an input end connected to said one end of said capacitor.

19. A system for charged particle exposure according to claim 18, further comprising:

a D/A converter for converting said digital value to an analog value is connected to a stage preceding said smoothing circuit;

wherein said smoothing circuit includes a diode bridge circuit, in which anodes of a first diode and a second diode are connected to each other, cathodes of a third diode and a fourth diode are connected to each other, a cathode of said first diode is connected to an anode of said third diode and a cathode of said second diode is connected to an anode of said fourth diode, said cathode of said first diode is connected to an output end of said D/A converter; and wherein said constant current source includes a first constant current source with a current output end connected to said anode of said first diode, and a second constant current source with a current input end connected to said cathode of said third diode.

20. A system for charged particle exposure according to claim 18 wherein said smoothing circuit further includes:

a first switching means connected between said current output end of said first constant current source and said anode of said first diode; and a second switching means connected between said cathode of said third diode and said current input end of said second constant current source.

21. A system for charged particle exposure according to claim 20 wherein said smoothing circuit further includes;
a third switching means, connected to said current output end of said first constant current source, for turning ON/OFF the electric current output from said first constant current source, and
a fourth switching means, connected to said current input end of said second constant current source, for turning ON/OFF the electric current input to said first constant current source.

22. A system for charged particle exposure according to claim 21 wherein said third switching means and said fourth switching means are connected in series.

23. A system for charged particle exposure according to claim 21 wherein:
said first switching means and said fourth switching means are connected in series, and said second switching means and said third switching means are connected in series in said smoothing circuit;
a cathode of a fifth diode is connected to said anode of said first diode and anode and cathode of a sixth diode are connected to said cathode of said third diode and said anode of said fifth diode respectively in said diode bridge circuit; and
said output buffer circuit is a operational amplifying circuit in which one of a pair of inputs is connected to said one end of said capacitor and said cathode of said second diode and the other of said pair of inputs is connected to said cathode of said sixth diode and an output end of said operational amplifying circuit.

24. A system for charged particle beam exposure wherein a D/A converter output waveform changing in steps is supplied through a smoothing circuit to a deflector for deflecting a charged particle beam, wherein said smoothing circuit includes:
an output buffer circuit an input end of which is an input end of said smoothing circuit;
a resistor with one end connected to said input end of said output buffer circuit;
a capacitor with one end connected to another end of said resistor and with the potential at said other end being maintained constant; and
a low-pass filter connected to an output end of said output buffer circuit.

25. A system for charged particle exposure according to claim 24 wherein a value of said resistor or a capacitance of said capacitor can be switched with a control signal.

26. A system for charged particle exposure according to claim 19 wherein a sample hold circuit for sampling said analog values is connected between said D/A converter and said smoothing circuit.

27. A system for charged particle exposure according to claim 19, wherein said smoothing circuit is a first smoothing circuit, and further comprising a second smoothing circuit is connected between said D/A converter and a first smoothing circuit, and in which a signal supplied to the control input ends of said first constant current source and said second constant current source is maintained constant.

28. A system for charged particle exposure according to claim 19, further comprising:
a mobile stage for mounting an object to be exposed; and
a position detector for detecting a position of said mobile stage;
wherein a quantity of change in said digital value is equal to a quantity of change in a detected position of said mobile stage.

29. A system for charged particle exposure according to claim 28, further comprising:
a main deflector for deflecting said charged particle beam;
a sub deflector for deflecting said charged particle beam; and
control means for causing said main deflector to scan said charged particle beam in a first direction cyclically, for moving said mobile stage continuously in a second direction perpendicular to said first direction and for causing said charged particle beam to be deflected in said first direction following the movement of said mobile stage with said sub deflector in order to perform exposure on said object along said first direction.

30. A method of charged particle beam exposure using a system for charged particle beam exposure according to claim 18, comprising the steps of:
determining a inclination between step-change points adjacent to each other against a time; and
determining a value of said control signal to be supplied to said control input end of said constant current source in order to perform linear interpolation between said two points with a line of said inclination.

31. A method of charged particle beam exposure using a system for charged particle beam exposure according to claim 26, comprising the steps of:
setting said sample hold circuit in a hold state at least while a time elapses after an output of said D/A converter starts to change in steps;
determining an inclination between corresponding step-change points that are adjacent to each other in an output waveform of said sample hold circuit; and
determining a value of said control signal to be supplied to said control input end of said constant current source based on said inclination in order to perform linear interpolation between said two step-change points adjacent to each other with a line of said inclination.

32. A method of charged particle beam exposure using a system for charged particle beam exposure according to claim 27, comprising the steps of:
setting in an OFF state between input and output of said first smoothing circuit by controlling said switching means of said first smoothing circuit at least while a time elapses after an output or said D/A converter starts to change in steps; and
determining an inclination between corresponding step-change points that are adjacent to each other in an output waveform of said first smoothing circuit; and
determining a value of said control signal to be supplied to said control input end of said second smoothing circuit based on said inclination in order to perform linear interpolation between corresponding step-change points that are adjacent to each other in an output waveform of said second smoothing circuit.

33. A method of charged particle beam exposure using a system for charged particle beam exposure according to claim 27, comprising the steps of:
setting in an OFF state between input and output of said first smoothing circuit by controlling said switching means of said first smoothing circuit at least while a time elapses after an output of said D/A converter starts to change in steps;
setting in an OFF state between input and output of said second smoothing circuit by controlling said switching means of said second smoothing circuit only while a time elapses after an output of said D/A converter starts to change in steps;

determining an inclination between corresponding step-change points that are adjacent to each other in an output waveform of said first smoothing circuit; and determining a value of said control signal to be supplied to said control input end of said second smoothing circuit based on said inclination in order to perform linear interpolation between corresponding step-change points that are adjacent to each other in an output waveform of said second smoothing circuit.

34. A method of charged particle exposure system according to claim 30, comprising the steps of:

mounting an object to be exposed on a mobile stage;

detecting a position of said mobile stage by a position detector;

deflecting a charged particle beam in a first direction by a main deflector to scan said charged particle beam in a first direction cyclically;

moving said mobile stage continuously in a second direction perpendicular to said first direction; and deflecting said charged particle beam in said first direction by said sub deflector in order to follow the movement of said mobile stage and to perform exposure on said object along said first direction:

wherein said inclination between said two points is approximately equal to a rate at which the detected position of said mobile stage changes.

* * * * *